(12) United States Patent
Nishida et al.

(10) Patent No.: US 7,692,720 B2
(45) Date of Patent: *Apr. 6, 2010

(54) SOLID-STATE IMAGING DEVICE AND METHOD FOR MANUFACTURING THE SAME

(75) Inventors: Kazuhiro Nishida, Kanagawa (JP); Hiroshi Maeda, Kanagawa (JP); Yoshihisa Negishi, Kanagawa (JP); Shunichi Hosaka, Kanagawa (JP); Masatoshi Yasumatsu, Miyagi (JP); Eiji Watanabe, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 881 days.

This patent is subject to a terminal disclaimer.

(21) Appl. No.: 10/902,885

(22) Filed: Aug. 2, 2004

(65) Prior Publication Data

US 2005/0062871 A1    Mar. 24, 2005

(30) Foreign Application Priority Data

Aug. 1, 2003    (JP)    .......................... P. 2003-285132

(51) Int. Cl.
*H04N 5/225*    (2006.01)
*H01L 21/00*    (2006.01)
(52) U.S. Cl. .......................... 348/374; 257/434; 438/33
(58) Field of Classification Search ................. 348/374; 250/200; 257/414, 432, 433, 434; 438/6, 438/7, 33, 34, 35, 42
See application file for complete search history.

(56) References Cited

U.S. PATENT DOCUMENTS

| 4,999,484 | A | * | 3/1991 | Kaneko | ..................... | 250/208.1 |
| 5,344,890 | A | * | 9/1994 | Miyazono et al. | ........ | 525/326.5 |
| 5,942,793 | A | * | 8/1999 | Senoo et al. | ................. | 257/650 |
| 5,949,655 | A | * | 9/1999 | Glenn | .......................... | 361/783 |
| 6,287,745 | B1 | * | 9/2001 | Yamamura et al. | .......... | 430/269 |
| 6,635,941 | B2 | * | 10/2003 | Suda | .......................... | 257/431 |
| 6,849,916 | B1 | * | 2/2005 | Glenn et al. | ................. | 257/434 |
| 6,977,187 | B2 | * | 12/2005 | Farrell et al. | ................. | 438/106 |

(Continued)

FOREIGN PATENT DOCUMENTS

EP    1 041 628 A2    10/2000

(Continued)

OTHER PUBLICATIONS

Korean Office Action dated Mar. 27, 2006.

(Continued)

*Primary Examiner*—Sinh Tran
*Assistant Examiner*—Albert H Cutler
(74) *Attorney, Agent, or Firm*—Sughrue Mion, PLLC

(57) ABSTRACT

A solid-state imaging device, comprises: a semiconductor substrate having a first surface; a solid-state imaging element in the first surface of the semiconductor substrate, the solid-state imaging element comprising a light-receiving region; a light-transmission member having a second surface and a third surface, the second surface being opposite to the third surface, wherein the light-transmission member and the first surface of the semiconductor substrate define a gap between the second surface of the light-transmission member and an outer surface of the light-receiving region; and an external connection terminal connected to the solid-state imaging element, wherein a distance between the outer surface of the light-receiving region and the third surface of the light-transmission member is 0.5 mm or more.

10 Claims, 40 Drawing Sheets

U.S. PATENT DOCUMENTS

| | | | |
|---|---|---|---|
| 2002/0000560 A1* | 1/2002 | Ishii et al. | 257/81 |
| 2002/0113296 A1* | 8/2002 | Cho et al. | 257/659 |
| 2004/0077121 A1* | 4/2004 | Maeda et al. | 438/75 |
| 2004/0124486 A1* | 7/2004 | Yamamoto | 257/433 |
| 2005/0260797 A1* | 11/2005 | Farrell et al. | 438/113 |

FOREIGN PATENT DOCUMENTS

| | | | |
|---|---|---|---|
| EP | 1 376 705 A2 | 6/2003 |
| EP | 1 387 397 A2 | 7/2003 |
| JP | 7-202152 A | 8/1995 |
| JP | 8-116042 A | 5/1996 |
| JP | 2001-351997 A | 12/2001 |
| JP | 2002-43451 A | 2/2002 |
| JP | 2002-329851 A | 11/2002 |
| JP | 2003-179172 A | 6/2003 |
| JP | 2003-197656 A | 7/2003 |

OTHER PUBLICATIONS

European Search Report dated Jun. 12, 2006.
Japanese Office Action dated Jul. 16, 2008.

* cited by examiner

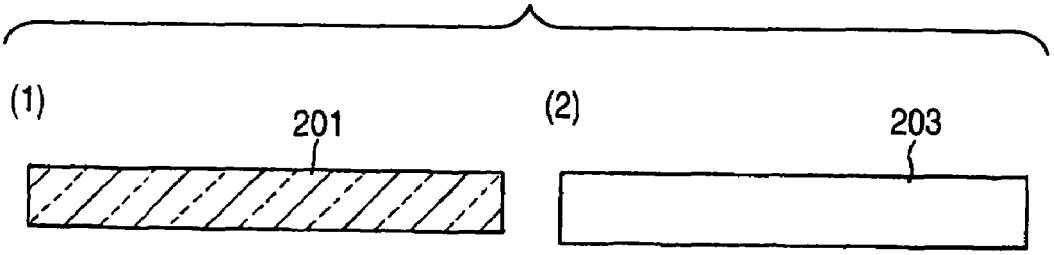
FIG. 38A
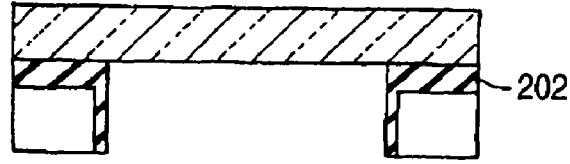
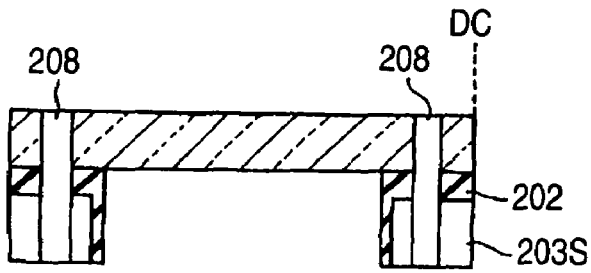

SOLID-STATE IMAGING DEVICE AND METHOD FOR MANUFACTURING THE SAME

BACKGROUND OF THE INVENTION

1. Field of the Invention

The present invention relates to a solid-state imaging device and to a method for manufacturing the solid-state imaging device, and more particularly, to a solid-state imaging device of chip-sized packed (CSP) having a microlens integrated on a chip.

2. Description of the Related Art

Demand for a more compact solid-state imaging element including a CCD (Charge-Coupled Device) is growing, for reasons of a necessity for application of the solid-state imaging element to portable cellular phones and digital cameras.

A solid-state imaging device, in which microlenses are provided in respective light-receiving regions of a semiconductor chip, has been proposed as one type of solid-state imaging element. Among solid-state imaging devices, a solid-state imaging device has been proposed, wherein the solid-state imaging device is packaged integrally such that an airtight sealing section is formed between each of the light-receiving regions and the corresponding microlens, thereby making an attempt to miniaturize the solid-state imaging device (JP-A-7-202152).

Such a configuration enables a reduction in footprint and bonding of optical components, such as a filter, a lens, and a prism, on the surface of an airtight sealing section. As a result, an attempt can be made to reduce a packaging size without involvement of a reduction in the light-gathering power of the microlens.

SUMMARY OF THE INVENTION

However, at the time of mounting of such a solid-state imaging device, the solid-state imaging device is mounted on a support substrate, and an attempt must be made to establish electrical connections by means of a method, such as bonding, to enable extraction of signals to the outside, and seal the solid-state imaging device. As mentioned above, this involves a large number of man-hours, which raises a problem of mounting requiring consumption of much time.

To this end, the present inventors have proposed a method comprising the steps of: forming a plurality of solid-state imaging elements on the surface of a semiconductor substrate; cementing a light-transmission member on the surface of the semiconductor substrate such that gaps are formed so as to oppose respective light-receiving regions of the solid-state imaging element; forming external connection terminals in correspondence with the solid-state imaging elements; and separating bonded elements formed on the external connection terminals, for each solid-stating imaging element.

As a result, there is formed a compact solid-state imaging element, wherein a light-transmission member is caused to adhere such that gaps are formed so as to oppose the light-receiving region of the solid-state imaging element.

However, in relation to such a solid-stating imaging element, as miniaturization proceeds, a problem of image noise attributable to dust adhering to the surface of the light-transmission member becomes more serious.

Even during the process of assembling a solid-state imaging element, dust is likely to adhere to the element. Moreover, flaws in the surface of a light-receiving region of the light-transmission member or extraneous matters often cause deteriorate of picture quality.

The present invention has been conceived in light of the circumstances and aims at providing a highly reliable solid-state imaging device which has high picture quality and reduces image noise attributable to extraneous matters or flaws in the surface of a light-transmission member (i.e., an external surface) or in the surface of a light-receiving region.

The present invention also aims at readily providing a highly reliable solid-state imaging device.

Accordingly, the present invention provides a solid-state imaging device, a semiconductor substrate having a first surface; a solid-state imaging element in the first surface of the semiconductor substrate, the solid-state imaging element comprising a light-receiving region; a light-transmission member having a second surface and a third surface, the second surface being opposite to the third surface, wherein the light-transmission member and the first surface of the semiconductor substrate define a gap between the second surface of the light-transmission member and an outer surface of the light-receiving region (that is, the light-transmission member and the first surface of the semiconductor substrate are spaced apart so as to define a gap between the second surface of the light-transmission member and an outer surface of the light-receiving region); and an external connection terminal connected to the solid-state imaging element, wherein a distance between the outer surface of the light-receiving region and the third surface of the light-transmission member is 0.5 mm or more.

By means of this configuration, even when an imperfection, such as a piece of debris measuring 20 μm or thereabouts, is present in the surface of the light-transmission member, the density of a shadow projected on the solid-state imaging element can be reduced to such an extent that no adverse effect is particularly exerted on the imaging characteristic.

The present invention is directed to the solid-state imaging device, wherein the distance between the outer surface of the light-receiving region and the third surface of the light-transmission member does not exceed 1.5 mm.

By means of this configuration, even when a piece of debris which is too small to be visually observed is present, a chance of occurrence of image noise can be prevented. Further, in consideration of a problem related to the size of the device and strength of the device, the distance preferably does not exceed 1.5 mm. By means of setting the distance from the light-receiving surface to the surface of the light-transmission member to 1.5 mm or less, solid-state imaging elements can be mounted without involvement of deterioration of productivity of the dicing process even when the elements are mounted on a wafer scale.

The present invention is directed toward the solid-state imaging device, further comprising a spacer between the second surface of the light-transmission member and the first surface of the semiconductor substrate so that the distance between the outer surface of the light-receiving region and the third surface of the light-transmission member is set to be a predetermined value.

By means of this configuration, highly accurate position can be performed readily by means of interposing the spacers between the solid-state imaging element substrate and the light-transmission member.

The present invention is directed toward the solid-state imaging device, wherein a distance between the outer surface of the light-receiving region and the second surface of the light-transmission member is 0.08 mm or more.

By means of this configuration, adhesive extraneous matters measuring 5 μm or thereabouts are formed during the etching process for forming spacers. Even in such a case, occurrence of image noise can be prevented by means of setting the distance from the light-receiving region to the surface of the light-receiving region of the light-transmission member to 0.08 mm or more.

Moreover, the flaws in the surface of the light-receiving region of the light-transmission member and the air bubbles which arise when the spacers are caused to adhere can be suppressed to a size of about 5 μm. Hence, occurrence of image noise can be prevented, by means of setting the distance from the light-receiving region to the surface of the light-receiving region of the light-transmission member to 0.08 mm or more.

Since the height (thickness) of the spacer is made sufficiently large, an attempt can be made to reduce image noise. Therefore, a highly reliable solid-state imaging element can be provided without involvement of a cost hike. Therefore, occurrence of image noise can be prevented by means of removing adhesive extraneous matters, which arise during manufacturing operation, with a simple method without use of an advanced technique. In order to prevent an increase in the size of the solid-state imaging device, a distance between the surface of the light-receiving region and the surface of the light-transmission member is desirably set to 0.12 mm or less, from the viewpoint of structure of the device.

The present invention is directed toward the solid-state imaging device, wherein the spacer comprises silicon.

By means of this configuration, the spacer is analogous to the solid-state imaging element in terms of a thermal expansion coefficient and is superior in workability. Silicon can be processed into a highly accurate geometry by means of etching. In contrast, if resin is used for the spacer member, difficulty will be encountered in achieving a sufficient thickness. When an attempt is made to use metal, an excessive difference in thermal expansion coefficient exists between the spacer member and the light-transmission member or the solid-state imaging element substrate, which is responsible for deterioration of reliability. For these reasons, when metal is used for the spacers, a stress-relieving layer must be interposed between the spacer member and the light-transmission member or the solid-state imaging element substrate. In contrast, when silicon is used, the silicon is closer to the solid-state imaging element in terms of a thermal expansion coefficient, and silicon is more reliable. If a 42 alloy or covar is used as the spacer, a decrease will arise in the number of elements to be fabricated in a single wafer, but there is yielded an advantage of the ability to process the geometry of the spacer through wet etching.

The present invention is directed toward the solid-state imaging device, wherein the spacer is connected to at least one of the first surface of the semiconductor substrate and the second surface of the light-transmission member via a room temperature-curing type adhesive.

The present invention is directed toward the solid-state imaging device, wherein the spacer is connected to at least one of the first surface of the semiconductor substrate and the second surface of the light-transmission member via a photo-curing type adhesive.

When, for instance, a light-transmission member is made of a material which differs from silicon to be used for forming the solid-state imaging element substrate in terms of thermal expansion coefficient, such as low α-ray glass, warpage arises in the wafer during a heating process required to bond the wafer. Thermal stress is exerted on the solid-state imaging element, and hence a drop arises in reliability or a failure to fix the wafer during subsequent processes is likely to arise. However, the solid-state imaging elements can be manufactured without undergoing a high-temperature process through use of a room temperature-curing type adhesive or a photo-curing type adhesive, thereby diminishing occurrence of warpage.

The present invention is directed toward the solid-state imaging device, wherein the width of the spacer is 100 to 500 μm.

By means of this configuration, a superior sealing characteristic is achieved, and there can be formed small solid-state imaging devices with superior layout (i.e., the number of elements to be fabricated in a single wafer). If the width of the spacer is smaller than 100 μm, sealing may become insufficient or a strength failure may arise. Further, if the width of the spacer exceeds 500 μm, the number of elements to be fabricated in a single wafer is reduced, which in turn raises a problem of a failure to miniaturize the solid-state imaging devices.

The present invention also provides a method for manufacturing a solid-state imaging device, comprising the steps of: forming a plurality of solid-state imaging elements in a first surface of a semiconductor substrate, each of the solid-state imaging elements comprising a light-receiving region; connecting a light-transmission member having a second surface and a third surface, the second surface being opposite to the third surface, to the first surface of the semiconductor substrate so as to define a gap between the second surface of the light-transmission member and an outer surface of the light-receiving region, to form an integrated member (a connected member); forming external connection terminals corresponding to the solid-state imaging elements (i.e., forming a plurality of external connection terminals, each of the external connection terminals connecting to each of the solid-state imaging elements), to form an integrated member with the external connection terminals; and separating the integrated member with the external connection terminals for each of the solid-state imaging elements, wherein the gap is adjusted so that a distance between the outer surface of the light-receiving region and the third surface of the light-transmission member is 0.5 to 1.5 mm.

By means of this configuration, positioning is performed on the wafer scale such that the distance from the light-receiving region to the surface of the light-transmission member becomes 0.5 to 1.5 mm or thereabouts. Solid-state imaging elements are integrated by means of undergoing collective mounting, and the wafer is separated on a per-solid-state-imaging-element basis. Hence, a solid-state imaging device which is easy to manufacture, lessens image noise, and has high reliability can be formed.

The present invention is directed toward the method for manufacturing a solid-state imaging device, wherein, in the connecting step, the light-transmission member is connected to the first surface of the semiconductor substrate via a spacer so that a distance between the outer surface of the light-receiving region and the second surface of the light-transmission member is 0.08 mm or more.

By means of this configuration, even when an imperfection is present in the surface of the light-transmission member, the density of a shadow projected on the solid-state imaging element can be reduced to such an extent that no adverse effect is particularly exerted on the imaging characteristic.

More preferably, in the step of connecting the light-transmission member, the light-transmission substrate having indentation sections corresponding to the region where the solid-state imaging elements are formed is prepared, and the light-transmission substrate is connected to the surface of the semiconductor substrate.

By means of this configuration, the indentation sections can be formed such that gaps are readily provided so as to oppose the respective light-receiving regions, by means of forming the indentation sections in the light-transmission substrate. Hence, the number of components is small, and manufacturing operation is easy.

Desirably, a process for forming protruding sections (spacers) by means of selectively removing the surface of the semiconductor substrate so as to enclose the light-receiving regions is provided before the connecting process, and gaps are formed between the light-receiving region and the light-transmission member by means of the protruding sections.

By means of this configuration, a highly reliable solid-state imaging device can be readily provided with high reliability by means of mounting elements between the respective pairs of protruding sections previously formed on the surface of the semiconductor substrate.

The connecting step is characterized in that a gap is defined between the semiconductor substrate and the light-transmission member by way of the spacers disposed around the light-receiving region.

The present invention is directed toward the method for manufacturing a solid-state imaging device, wherein the connecting step is performed at a temperature which does not exceeds 80° C.

The present invention is directed toward the method for manufacturing a solid-state imaging device, wherein the connecting step is a step using a room temperature-curing type adhesive.

The method of the present invention is directed toward the method for manufacturing a solid-state imaging device, wherein the connecting step is a step using a photo-curing type adhesive.

By means of such a configuration, the chance of occurrence of warpage in members after bonding can be reduced even when the members differ from each other in terms of a thermal expansion coefficient.

Desirably, the connecting step is characterized by using a room temperature-curing type adhesive.

By means of this configuration, connecting can be effected without increasing a connecting temperature, thereby preventing occurrence of warpage.

The connecting step is characterized by using a photo-curing type adhesive.

This configuration also enables connecting without increasing a connecting temperature, thereby preventing occurrence of warpage.

Further, as a result of an adhesive of semi-curing type being used as an adhesive, positioning becomes easy, and more highly accurate position becomes possible.

Desirably, the method includes a process for sealing the neighborhood of a junction between the light-transmission member and the surface of the semiconductor substrate with resin such that the external connection section is exposed.

By means of this configuration, intrusion of moisture is suppressed, and a highly reliable solid-state imaging element can be formed.

Processing pertaining to the resin-sealing process is performed at a temperature which does not exceed 80° C.

By means of this configuration, connecting can be performed without increasing the connecting temperature, thereby reducing occurrence of warpage.

BRIEF DESCRIPTION OF THE DRAWINGS

FIGS. 38A to 38E are views showing processes for manufacturing a solid-state imaging device according to a thirty-first embodiment of the present invention;

DETAILED DESCRIPTION OF THE INVENTION

Embodiments of the present invention will be described hereinbelow by reference to the drawings.

First Embodiment

Figure 1A:
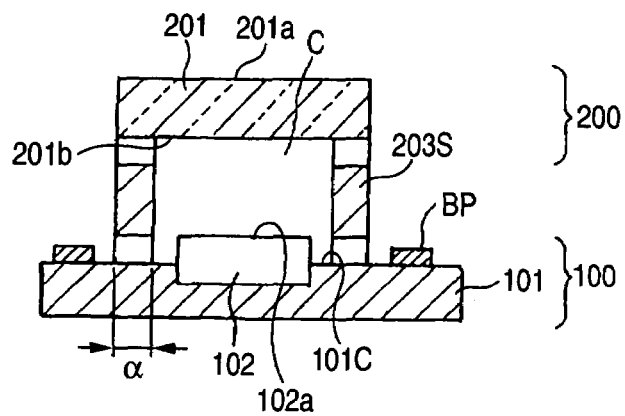
FIG. 1A is a cross-sectional profile of a solid-state imaging device fabricated according to a method of a first embodiment of the present invention.
Figure 1B:
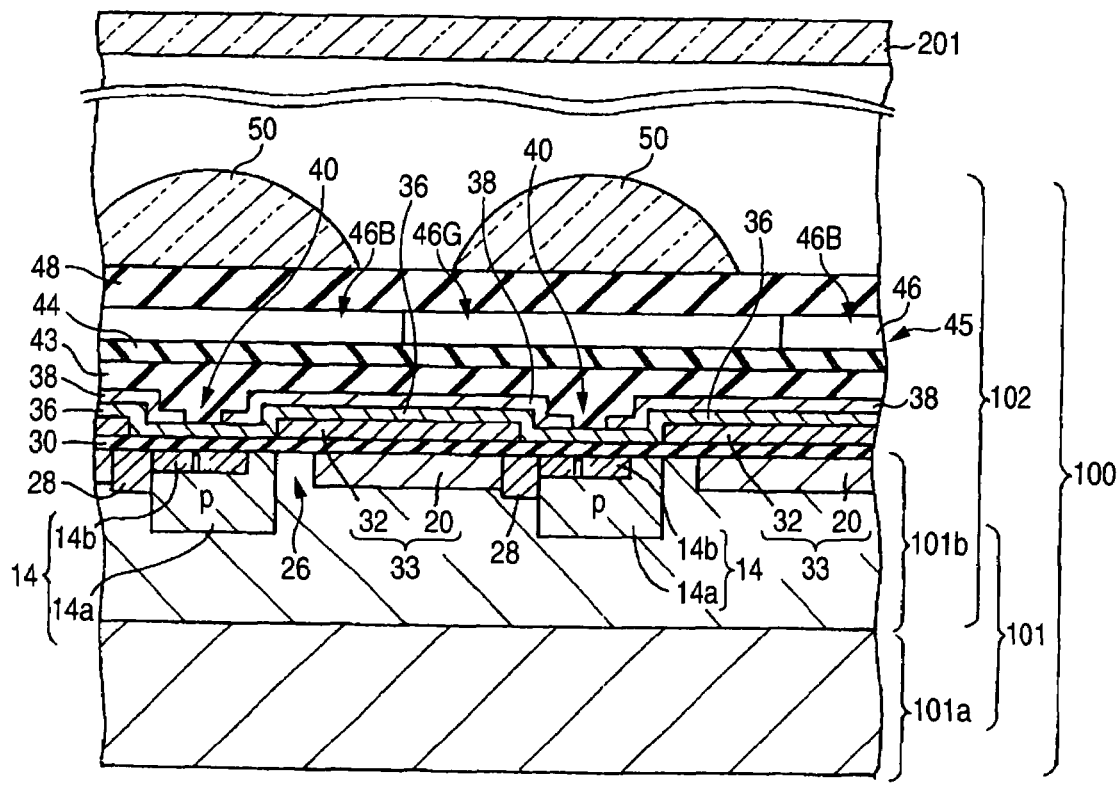
FIG. 1B is an enlarged cross-sectional profile of the principal features of the solid-state imaging device.

FIG. 1A is a cross-sectional view of a solid-state imaging device, and FIG. 1B is an enlarged cross-sectional view of the principal section of the solid-state imaging device. As shown in FIGS. 1A and 1B, sealing cover glass 200 made from low-a-ray glass (CG-1, registered trademark) is formed on the surface of a solid-state imaging element substrate 100 byway of a spacer 203S such that a gap C corresponding to a light-receiving region is created. Glass used as the sealing cover glass has a thickness of 0.5 mm and a refractive index of 1.5. Specifically, a glass substrate 201 serving as a light-transmission member which constitutes the sealing cover glass 200 is cemented to the surface of the solid-state imaging element substrate 100 formed from a silicon substrate 101, the silicon substrate acting as a semiconductor substrate having a solid-state imaging element 102 formed thereon, by way of the spacer 203S such that the gap C is created so as to correspond to the light-receiving region of the silicon substrate 101. The height of the gap C—that is, a distance from a outer surface 102a of the light-receiving region to a lower surface of the sealing cover glass; i.e., a surface 201b (a second surface) of the sealing cover glass facing the light-receiving region—is set to 0.1 mm or thereabouts. A distance from the outer surface 102a of the light-receiving region to an upper surface of the sealing glass cover; i.e., an outer surface 201a (a third surface) of the sealing cover glass, is set to 0.6 mm or thereabouts. The solid-state imaging device is constituted as follows: Namely, the glass substrate is bonded (connected) to a wafer so as to mount a plurality of elements in a collective manner. Subsequently, the outer edge of the silicon substrate 101 is separated in a piecemeal fashion by means of dicing. Electrical connection with an external circuit (not shown) is achieved by way of bonding pads BP formed on the surface of an outer edge of the silicon substrate 101 exposed from the glass substrate 201. Here, the spacer S203S is set to a height of 10 to 500 μm, preferably 80 to 120 μm. The width a of the spacer is set to 100 to 150 μm or thereabouts.

As can be seen from the enlarged cross-sectional view of the principal section shown in FIG. 1B, solid-state imaging elements are arranged on the surface of the solid-state imaging element substrate, and the solid-state imaging element substrate is constituted of the silicon substrate 101 having an RGB color filter (filter layer) 46 and microlenses 50 formed thereon.

The solid-state imaging element is formed such that channel stoppers 28 are formed in a p-well 101b formed on the surface of an n-type silicon substrate 101a and such that a photodiode 14 and a charge transfer element (a vertical charge transfer device (VCCD)) 33 are formed with the respective channel stoppers being sandwiched therebetween. Here, an n-type impurity region 14b is formed within the p-well 101b, to thus form the photodiode 14. Further, a vertical charge transfer channel 20 made from an n-type impurity region having a depth of about 0.3 μm is formed within the p+ channel region 14a. A vertical charge transfer electrode 32 is formed from a polycrystalline silicon layer on the vertical charge transfer channel 20 by way of a gate insulation film 30 made from a silicon oxide film, thereby constituting a charge transfer element 33. A read gate channel 26 is formed from a p-type impurity region between the charge transfer element 33 and the photodiode 14 which reads a signal charge to the vertical charge transfer channel 20.

The n-type impurity regions 14b remain exposed on the surface 101C (a first surface) of the silicon substrate 101 along the read gate channel 26. After having been temporarily stored in the n-type impurity region 14b, the signal charge developing in the photodiode 14 is read by way of the read gate channel 26.

The channel stopper 28, which is made from a p+-type impurity region, is present between the vertical charge transfer electrode 32 and the photodiode 14. By means of this channel stopper, the photodiode 14 is electrically isolated from the vertical charge transfer channel 20, as well as from the remaining vertical charge transfer channels 20, so that the vertical charge transfer channels 20 do not come into contact with each other.

Further, the vertical charge transfer electrode 32 is formed so as to cover the read gate channel 26 and such that the n-type impurity regions 14b become exposed and such that portions of the channel stoppers 28 become exposed. A signal charge is transferred to the vertical charge transfer electrode 32 from the read gate channel 26, to which a read signal is applied and which is located below the vertical charge transfer electrode 32.

The vertical charge transfer electrode 32 constitutes, along with the vertical charge transfer channel 20, the vertical charge transfer device (VCCD) 33 for vertically transferring a signal charge developing in a p-n junction of the photodiode 14. The surface of the substrate having the vertical charge transfer electrode 32 formed therein is coated with a surface protective film 36, and a light-shielding film 38 made from tungsten is formed on the surface protective film 36. Only a light-receiving region 40 of the photodiode is opened, and the other region is shielded from light.

The layers provided on the vertical charge transfer electrodes 32 are covered with a planarized insulation film 43 for planarizing a surface and a light-transmission resin film 44 to be formed thereon. The filter layer 46 is formed on the light-transmission resin film 44. In the filter layer 46, a red filter layer 46R, a green filter layer 46G, and a blue filter layer 46B are sequentially arranged in correspondence with the respective photodiodes 14 so as to constitute a predetermined pattern.

This filter layer 46 is further covered with a microlens array by way of a planarized insulation film 48. This microlens array is constituted of the microlenses 50 which are formed by means of: patterning light-transmission resin including photosensitive resin having a refractive index of 1.3 to 2.0, by means of an etching method using the photolithography; fusing the thus-patterned light-transmission resin and rendering the resin round by means of surface tension; and cooling the thus-rounded resin.

Processes for manufacturing this solid-state imaging device will now be described. FIGS. 2A to 2D and FIGS. 3A to 3C are manufacturing process drawings of the processes. As can be seen from the drawings, the processes are based on a so-called wafer-scale CSP method, wherein positioning is performed on a wafer scale; elements are packaged in a collective manner, thereby integrating the elements; and the wafer is separated into solid-state imaging elements. This method is characterized by use of a sealing glass cover 200 with a spacer, for which a spacer 203 has been formed in advance. Here, the drawings show a single unit, but in reality a plurality of solid-state imaging elements are formed.

Formation of the glass substrate with a spacer will first be described.

Figure 2A:
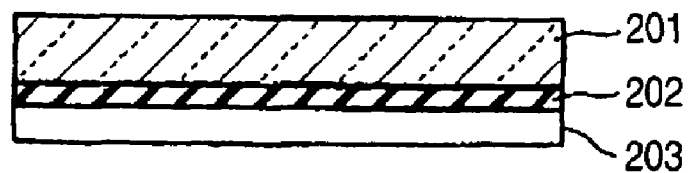
FIGS. 2A to 2D are views showing processes for manufacturing the solid-state imaging device according to the first embodiment of the present invention.

As shown in FIG. 2A, a silicon substrate 203, which is to become a spacer, is caused to adhere to the surface of the glass substrate 201 by way of an adhesive layer 202 formed from an UV-radiation curing adhesive (a cationic polymerizing energy curing adhesive). Here, the glass substrate 201 is made of so-called α-ray glass (CG1: registered trademark), which blocks to a small level an α-ray, which is responsible for image noise. A material containing a small amount of substances which will become α-ray radiation nuclei is desirably used for the glass substrate 201. Moreover, an α-ray limit value is preferably set to 0.002 (DPH/cm$^2$). If air bubbles are mixed into the adhesive layer 202, the air bubbles may sometimes cause image noise. Here, the adhesive layer 202 desirably has a thickness of 5 μm or less. When the thickness is 5 μm or less, air bubbles having a thickness of 5 μm or more cannot be present. For this reason, if the distance from the light-receiving surface to a lower surface of the glass substrate is set to 0.08 mm or more, as mentioned previously, occurrence of image noise can be prevented.

Figure 2B:
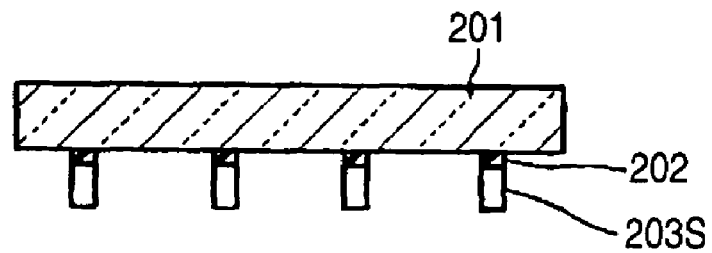

As shown in FIG. 2B, the silicon substrate 203 is etched by means of the etching technique using photolithography while a resist pattern is left in areas which are to become spacers, to thus form the spacers 203S.

Figure 2C:
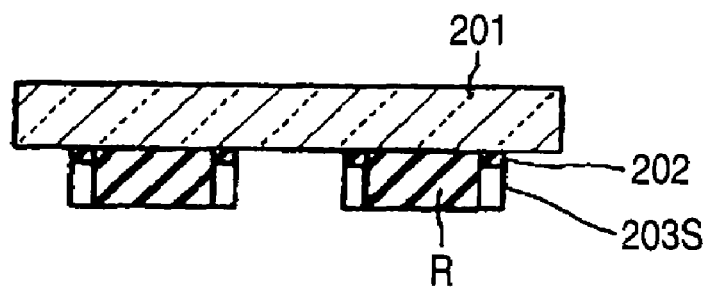
Figure 2D:
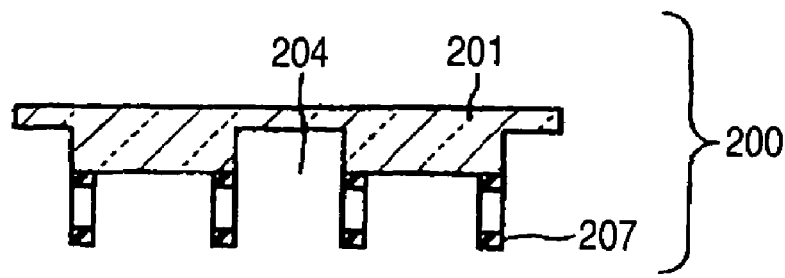

Subsequently, as shown in FIG. 2C, resist is charged into an area between the spacers 203S with exclusion of areas defined between elements while the resist patterns to be used for the spacers 203S remain left, and the glass substrate is etched to a predetermined depth. As a result, as shown in FIG. 2D, an inter-element trench section 204 is formed.

Here, the width of the spacer is preferably set to 100 to 500 μm or thereabouts. If the width is smaller than 100 μm, sealing may become insufficient, or the spacer may become prone to strength failure. Moreover, if the width exceeds 500 μm or more, the number of elements to be fabricated in a single wafer will be reduced, and there will arise a problem of a failure to miniaturize the solid-state imaging element. Moreover, the distance between the light-receiving surface and the spacer is preferably set to 50 μm or more, in consideration of seepage of the adhesive.

Here, the spacer is formed from a silicon substrate. Hence, if etching is effected under conditions that an etch rate of silicon oxide, which is a principal ingredient of the glass substrate, becomes sufficiently faster than the etch rate of silicon, etching can be performed while side walls of the spacer become exposed in the area between the elements. At the time of formation of the inter-element trench section 204, a dicing blade (grindstone) may be employed.

The only requirement at the time of etching of the spacer is to select etching conditions such that the size of adhering extraneous matters becomes 5 μm or less. If the adhering extraneous matters measure 5 μm or less, occurrence of image noise can be prevented, so long as the distance from the light-receiving surface to the lower surface of the glass substrate is set to 0.08 mm or more.

An adhesive layer 207 of room-temperature curing type is formed on the surfaces of the spacers.

Photolithography may be performed again, to thus form a resist pattern which covers the entire sidewalls of the spacers. The substrate may be subjected to etching by way of the resist pattern, to thus form the trench sections 204. There is obtained the sealing cover glass 200, in which the trench sections 204 and the spacers 203S are formed in the manner mentioned previously.

In order to prevent occurrence of the image noise, the height of the spacer is desirably set to 0.08 mm or more. Moreover, in order to enhance the productivity of the spacer, the height is desirably set to 0.12 mm or less. When the spacers 203S are formed by means of etching, etching may be performed through use of $C_4F_8$ plasma while the side walls of the spacers are protected. Furthermore, a bottom surface may be etched by means of anisotropic etching using $SF_6+O_2$ plasma.

Figure 3A:
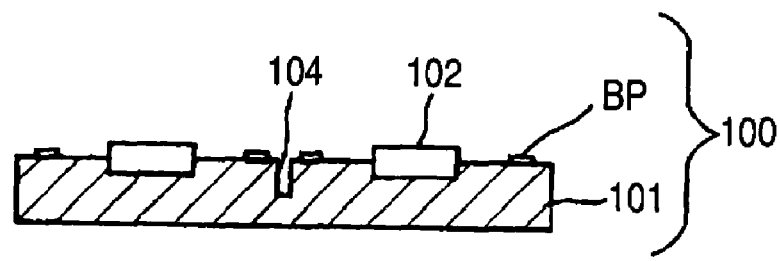
FIGS. 3A to 3C are views showing processes for manufacturing the solid-state imaging device according to the first embodiment of the present invention.

Next, the solid-state imaging element substrate is formed. As shown in FIG. 3A, at the time of formation of the element substrate, the silicon substrate 101 (a 6-inch wafer is employed herein) is prepared beforehand, and slice grooves 104 are formed in areas corresponding to separation lines, which are to be used for separating solid-state imaging elements, on the surface of the silicon substrate 101, by means of a method such as etching. Formation of a channel stopper layer, formation of channel regions, and formation of element regions, such as charge transfer electrodes, are performed through use of ordinary silicon processes. A wiring layer is also formed in the surface, and bonding pads BP to be used for establishing an external connection are formed from a gold layer.

Figure 3B:
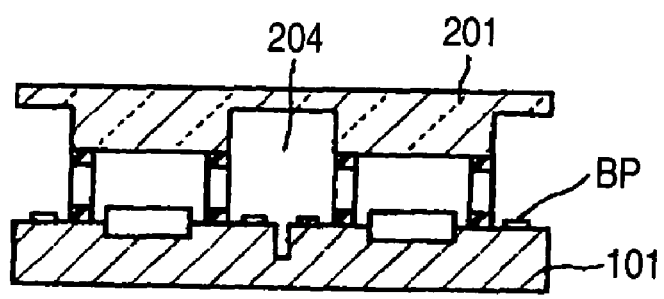

Subsequently, as shown in FIG. 3B, positioning is performed by means of alignment marks formed in the outer edge of each substrate, and the sealing cover glass 200 is placed on the solid-state imaging element substrate 100 having the element regions formed therein, in the manner mentioned previously. The solid-state imaging element substrate 100 and the sealing cover glass 200 are integrated together through pressurization by means of the adhesive layer 207 of room temperature curing type. Processing pertaining to this process is desirably carried out within a vacuum or an inactive gas atmosphere such as a nitrogen gas. At the time of integration there may be used, a thermosetting adhesive having a thermosetting temperature of 80° C. or less, a photo-curing adhesive, which will be described later, or a room-temperature curing adhesive. When the surface of the solid-state imaging element is Si or metal, bonding (connecting) may be achieved by means of surface activation room temperature bonding without use of an adhesive.

Subsequently, the back of the glass substrate is subjected to CMP (chemical-mechanical polishing), thereby removing the back of the glass substrate 201 to the trench section 204.

Figure 3C:
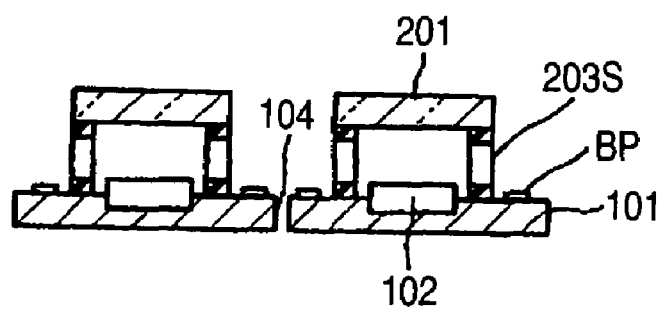

As shown in FIG. 3C, the back of the silicon substrate 101 is subjected to CMP in the same manner, whereby the back of the substrate is polished to the slice grooves 104. Thereby, the substrate is separated into individual solid-state imaging devices.

As mentioned above, the elements are mounted in a collective manner, and the elements are then separated from each other without involvement of positioning of individual elements and electrical connection, such as wire bonding. Therefore, manufacture of the elements is easy, and the elements are easy to handle.

The trench sections 204 are formed in advance in the glass substrate 201. After mounting of the elements, the substrate is removed from the surface to the depth arriving at the trench sections 204 by means of a method, such as CMP. Hence, separation of the elements can be performed very easily.

The edge of the glass substrate 201 is placed inside with reference to the edge of the silicon substrate 101 having the solid-state imaging elements formed therein, and the surface of the silicon substrate 101 becomes exposed. Such a structure can be formed with high accuracy through very simple processes; that is, a process of forming indentations in the glass substrate beforehand and a process of removing the substrate to this depth by means of a method, such as etch back or CMP after bonding operation. Further, the structure can be formed readily with superior operability. Individual solid-state imaging elements can be formed by means of performing only separating or abrading operation while an element-formed surface is sealed within the clearance C by means of bonding. Hence, highly-reliable solid-state imaging elements can be provided without inflicting much damage to the elements and without a chance of mixing of dust.

The silicon substrate is reduced in thickness to a depth about half the depth of the silicon substrate by means of CMP, and hence an attempt can be made to make the solid-state imaging element compact and thin. Moreover, after having been bonded to the glass substrate, the silicon substrate is made thin, and hence a drop in mechanical strength of the substrate can be prevented.

Connection with the outside can be readily effected, because the bonding pads BP provided on the silicon substrate constituting the solid-state imaging element substrate 100 are exposed by way of the sealed section formed by the spacer 203S and the glass substrate 201.

As mentioned above, according to the configuration of the present invention, positioning is performed on the wafer scale, and elements are mounted in a collective manner, whereby the substrate and the cover glass are integrated together. Then, the substrate is separated on a per-solid-state-imaging-element basis. Hence, a highly-reliable solid-state imaging device which is easy to manufacture can be formed.

In the first embodiment, a wiring layer including a bonding pad is formed from a gold layer. However, the material of the wiring layer is not limited to gold. Needless to say, another metal such as aluminum or another conductor layer such as silicide may be used.

The microlens array can also be formed by means of forming a transparent resin film on the surface of a substrate and forming a lens layer having a gradient of refractive index at a predetermined depth, caused by migration of ions from the surface of the resin film.

The material for the spacer can be selected from any of a 42 alloy, metal, glass, photosensitive polyimide, and polycarbonate resin, as well as a silicon substrate, as required. When resin is employed, a device is required to ensure a sufficient thickness.

When the solid-state imaging element substrate, the spacers, and the glass substrate differ from each other in terms of coefficient of linear expansion, warpage may arise in the substrate after adhesion. In order to prevent occurrence of a warpage and bring a warpage into an allowable range even when the warpage has arisen, a bonding (connecting) temperature employed for bonding is set to room temperature or so; specifically, within a range of 20° C. to 80° C. The adhesive employed in the present embodiment includes epoxy-based adhesives, oxetane-based adhesives, silicon-based adhesives, and acrylic adhesives; adhesives of UV curing type; and adhesives of visible ray curing type. An adhesive-which can be used in the form of a thin adhesive layer—is desirable so that achievement of desired bonding strength, prevention of intrusion of moisture, and attainment of high reliability can be implemented.

In the first embodiment, the manner in which warpage arises as a result of a bonding temperature having been changed is determined. Tests were carried out by means of observing how warpage arises when bonding is performed through use of the room temperature-curing type adhesive and the thermosetting type adhesive with respect to respective cases where the bonding temperature was varied among 20° C., 25° C., 50° C., 80° C., and 100° C. The tests were carried out in connection with bonding between the glass substrate and the spacers and with bonding between the spacers and the solid-state imaging element substrate.

The test results show that the manner of occurrence of warpage when bonding is performed through use of the room temperature-curing type adhesive is analogous to that when bonding is performed through use of the adhesive of thermosetting type. Warpage hardly occurred when the bonding temperature was 20° C. and 25° C. When the bonding temperature was 50° C., warpage sometimes occurred, but the warpage fell within the allowable range. When the bonding temperature exceeded 80° C., warpage falling within the allowable range often occurred. When the bonding temperature was 100° C., the warpage became large and sometimes exceeded the allowable range.

The test results indicate that the bonding temperature preferably should not exceed 80° C.

When the photo-curing type adhesive is used, the bonding temperature does not exceed 50° C. Hence, a superior bonding state can be attained without occurrence of warpage.

Moreover, simulation was conducted with a view toward determining optimum distance between the sensor and the glass. Conditions for simulation include an exit pupil of 3.5 mm, an F value of 3.5, and a glass refractive index of 1.5.

When an imperfection measuring 5 μm existed in the lower surface of the glass substrate, a distance between the light-receiving surface of the photodiode section of the solid-state imaging element and the lower surface of the substrate was changed, whereby a relationship between the distance and the density of a shadow of the imperfection projected on the solid-state imaging element was measured. Simulation results are provided in Table 1.

As is evident from Table 1, when the distance between the light-receiving surface and the glass substrate is 0.07 mm, the density of the shadow becomes 4.7%, which is in excess of 4%. Accordingly, the distance between the light-receiving surface and the glass substrate is desirably set to 0.08 mm or more.

TABLE 1

| DISTANCE BETWEEN LOWER SURFACE OF GLASS SUBSTRATE AND LIGHT-RECEIVING SURFACE (mm) | DENSITY OF SHADOW OF IMPERFECTION IN LOWER SURFACE PROJECTED ON CCD (%) |
| --- | --- |
| 0.01 | |
| 0.02 | |
| 0.03 | |
| 0.04 | |
| 0.05 | 8.3 |
| 0.06 | 6.1 |

TABLE 1-continued

| DISTANCE BETWEEN LOWER SURFACE OF GLASS SUBSTRATE AND LIGHT-RECEIVING SURFACE (mm) | DENSITY OF SHADOW OF IMPERFECTION IN LOWER SURFACE PROJECTED ON CCD (%) |
| --- | --- |
| 0.07 | 4.7 |
| 0.08 | 3.7 |
| 0.09 | 3.0 |
| 0.1 | 2.5 |

Table 2 shows results of measurement of a relationship between the distance and the density of a shadow projected on the solid-state imaging element for the case where the distance between the light-receiving surface and an upper surface of the glass substrate was changed and an imperfection measuring 20 μm existed in the upper surface of the glass substrate.

TABLE 2

| DISTANCE BETWEEN LIGHT-RECEIVING SURFACE AND UPPER SURFACE OF GLASS SUBSTRATE (mm) | DENSITY OF SHADOW OF IMPERFECTION IN UPPER SURFACE PROJECTED ON CCD (%) |
| --- | --- |
| 0.3 | 8.3 |
| 0.4 | 5.1 |
| 0.5 | 3.5 |
| 0.6 | 2.5 |
| 0.7 | 1.9 |
| 0.8 | 1.5 |
| 0.9 | 1.2 |
| 1.0 | 1.0 |
| 1.1 | 0.8 |

As is evident from the table, the density of the shadow becomes 4% or more when the distance between the light-receiving surface and the upper surface of the glass substrate is 0.4 mm or less.

When the background is uniform, such as when the sky serves as the background, the density of the shadow projected on the light-receiving surface of the solid-state imaging element is 4%. The background becomes visible in a printed image. Therefore, when the density of the shadow is set to a value of 4% or less, the printed image is not affected by the influence of such an imperfection.

The test results show that the interval between the surface of the glass substrate and the CCD must be 0.08 mm or more. Preferably, the glass substrate and the CCD are separated from each other by 0.12 mm or thereabouts.

Even when a piece of debris measuring 20 μm is on the surface of the glass substrate, the required distance from the light-receiving surface to the upper surface of the glass substrate is only 0.5 mm or more.

Moreover, similar simulation yields the result that the required distance from the light-receiving surface to the upper surface of the glass substrate should be only 1.5 mm or more at an F value of 11. From the above-described results, if the distance from the light-receiving surface to the upper surface of the glass substrate is set to 0.5 mm to 1.5 mm, occurrence of image noise can be prevented even when there are pieces of debris which are too small to be visually perceived. Further, the distance from the light-receiving surface to the surface of the glass substrate is desirably 1.5 mm or less, in consideration of a problem related to the size of the device and deterioration of dicing productivity due to a large thickness of glass.

Second Embodiment

A second embodiment of the present invention will now be described.

In the first embodiment, the slice grooves 104 have been formed, in advance, in the silicon substrate 101 constituting the solid-state imaging element substrate 100. Through use of a spacer which is formed from the same silicon as that of the solid-state imaging element substrate and has a thickness of 0.1 mm, the solid-state imaging element substrate is bonded to the sealing cover glass made of low α-ray glass. The back of the silicon substrate 101 is subjected to CMP until the slice grooves 104 are reached, thereby separating the silicon substrate 101 while rendering the same thin. The present embodiment is characterized in that the silicon substrate 101 is separated without formation of slice grooves. In other respects, the second embodiment is formed in the same manner as in the first embodiment.

Figure 4A:
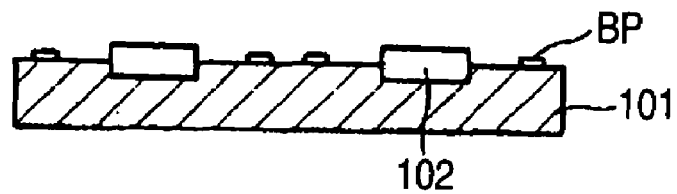
FIGS. 4A to 4D are views showing processes for manufacturing a solid-state imaging device according to a second embodiment of the present invention.

FIGS. 4A to 4D show bonding and separation processes of the second embodiment. As shown in FIG. 4A, the silicon substrate 101 is taken as a starting material. A channel stopper, a channel region, and the element region 102, such as a charge transfer electrode, are formed through use of ordinary silicon processes. Further, a wiring layer is also formed in the surface, and bonding pads BP to be used for establishing an external connection are formed from a gold layer.

Figure 4B:
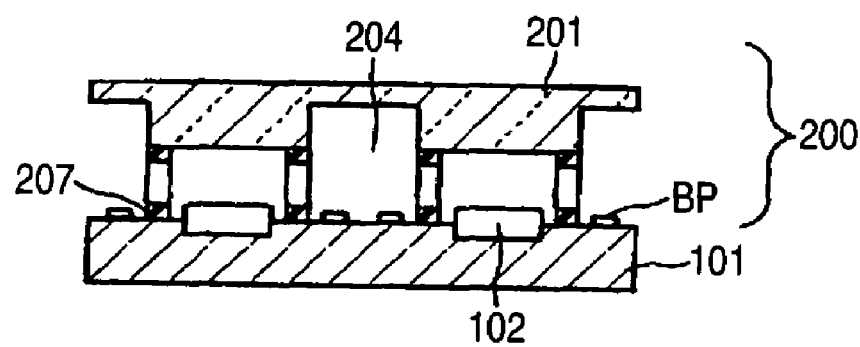

Subsequently, as shown in FIG. 4B, positioning is performed by means of alignment marks formed in the outer edge of each substrate, and the sealing cover glass 200 is placed on the solid-state imaging element substrate 100 having the element regions formed therein, in the manner mentioned previously. The solid-state imaging element substrate 100 and the sealing cover glass 200 are integrated together through pressurization by means of the adhesive layer 207 of room temperature curing type. At this time, no slice grooves are formed in the silicon substrate 101, and hence high mechanical strength is achieved.

Figure 4C:
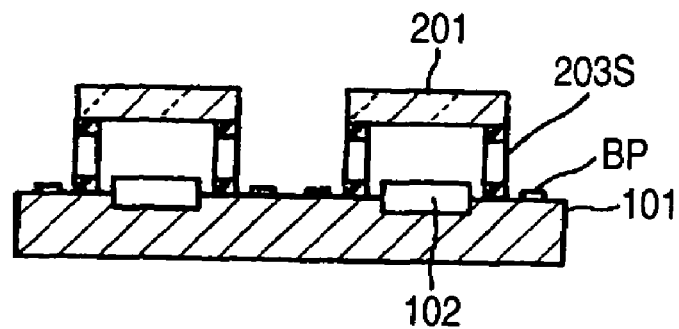

As shown in FIG. 4C, the back of the glass substrate 201 is subjected to CMP (chemical mechanical polishing) in the same manner as in the case of the first embodiment, whereby the back of the glass substrate 201 is removed to the trench section 204. Thereby, the substrate is separated into individual solid-state imaging devices.

Through these processes, a reduction in the thickness of the glass substrate 301 and separation of the glass substrate into pieces can be achieved simultaneously.

Figure 4D:
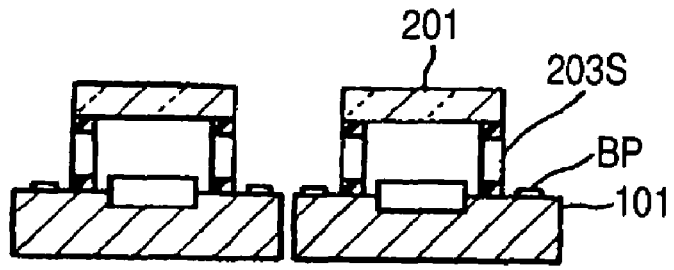

As shown in FIG. 4D, the silicon substrate 101 and the glass substrate 201 are sliced from the part of the glass substrate 201 by means of a diamond blade (grindstone), whereby solid-state imaging devices are separated from each other.

According to this method, the solid-state imaging device produced in the present embodiment is larger in thickness than the solid-state imaging device produced in the first embodiment. However, highly reliable solid-state imaging devices can be formed.

Third Embodiment

A third embodiment of the present invention will now be described.

In the first embodiment, the slice grooves 104 have been formed, in advance, in the silicon substrate 101 constituting the solid-state imaging element substrate 100. After bonding operation, the back of the silicon substrate 101 is subjected to CMP until the slice grooves 104 are reached, thereby separating the silicon substrate 101 while rendering the same thin. However, in the present embodiment, a dummy plate 301 made of a silicon substrate having a thickness of 50 to 700 μm is caused to adhere to the back of the silicon substrate 101 by way of an adhesive layer 302. After adhesion of the dummy plate, slice grooves 304 are formed in the dummy plate 301 to a depth reaching the dummy plate 301.

Accordingly, the adhesive layer 302 may be softened in the separation process to deprive the adhesive layer of tackiness, thereby removing the dummy plate 301.

In other respects, the third embodiment is formed in the same manner as in the first embodiment.

Figure 5A:
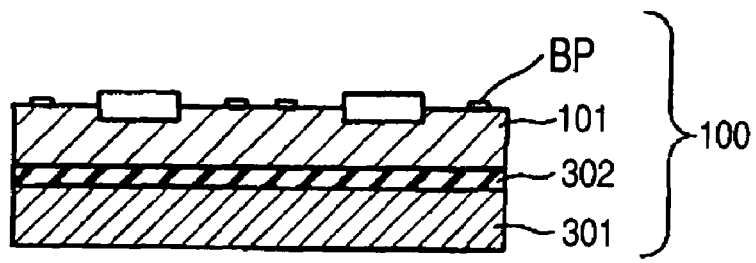
FIGS. 5A to 5E are views showing processes for manufacturing a solid-state imaging device according to a third embodiment of the present invention.

FIGS. 5A to 5E show bonding and separation processes of the third embodiment. The silicon substrate 101 is taken as a starting material. A channel stopper, a channel region, and the element region, such as a charge transfer electrode, are formed through use of ordinary silicon processes. Further, a wiring layer is also formed in the surface, and bonding pads BP to be used for establishing an external connection are formed from a gold layer. Subsequently, as shown in FIG. 5A, the dummy plate 301 made of a silicon substrate is caused to adhere to the back of the silicon substrate 101 by way of the adhesive layer 302.

Figure 5B:
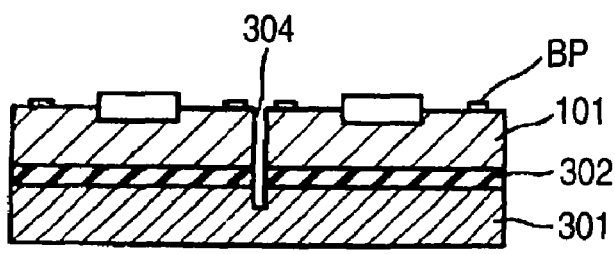

As shown in FIG. 5B, the slice grooves 304 are formed from the element-formed surface side of the silicon substrate 101 through use of a diamond blade (grindstone).

Figure 5C:
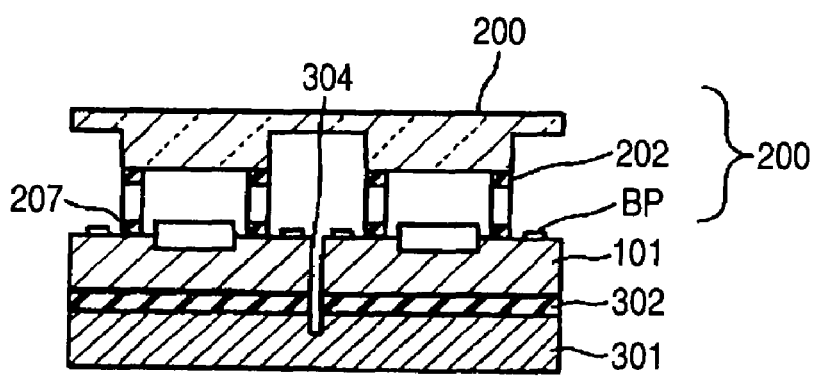

Subsequently, as shown in FIG. 5C, positioning is performed by means of alignment marks (not shown) formed in the outer edge of the solid-state imaging element substrate 100 and that of the sealing cover glass 200, and the sealing cover glass 200 made of low α-ray glass is placed on the solid-state imaging element substrate 100 that has been formed in the manner as mentioned previously. The solid-state imaging element substrate 100 and the sealing cover glass 200 are integrated together through pressurization by means of the adhesive layer 207 of room temperature curing type. Here, a glass substrate having the spacer 203S, which has been formed through the processes shown in FIGS. 2A to 2C and has a thickness of 0.1 mm, and the adhesive layer 207 of room temperature curing type is used as the glass substrate. Although the slice grooves 304 are formed so as to penetrate through the silicon substrate 101 at this time, the silicon substrate is fixed by the dummy plate 301, and hence high mechanical strength is achieved.

Figure 5D:
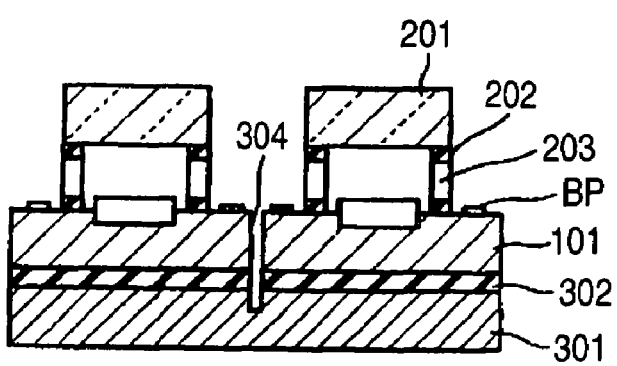

As shown in FIG. 5D, the back of the glass substrate is subjected to CMP (chemical mechanical polishing) in the same manner as in the case of the first embodiment, whereby the back of the glass substrate 201 is removed to the trench section 204.

Through these processes, a reduction in the thickness of the glass substrate and separation of the glass substrate into pieces can be achieved simultaneously.

Figure 5E:
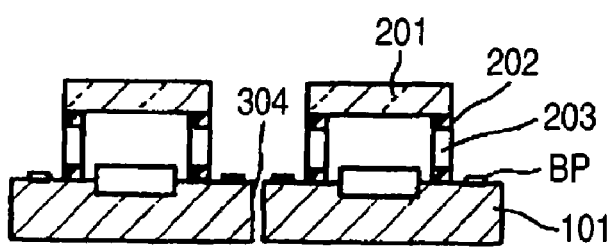

As shown in FIG. 5E, the adhesive layer 302 provided on the back of the silicon substrate 101 is softened to remove the dummy plate 301, whereby the solid-state imaging devices are separated from each other. Here, a material whose softening point is lower than that of the adhesive layer 202 to be used for bonding the spacer to the glass substrate 201 is preferably selected as the adhesive layer 302.

According to this method, the solid-state imaging element substrate 100 is subjected to dicing in advance on the dummy plate 301 before being bonded. Hence, the solid-state imaging device of the present embodiment undergoes less stress after bonding than does the solid-state imaging device obtained in the first embodiment, and hence a manufacturing yield is improved. Moreover, an attempt can be made to improve the reliability of the solid-state imaging element.

In the embodiment, the glass substrate and the spacer may be bonded together through use of the adhesive layer. However, the bonding can also be realized by means of anodic bonding or surface activation room temperature bonding. Anodic bonding enables easy achievement of sturdy bonding.

CMP has been used for reducing the thickness of the glass substrate in the first through third embodiments. However, a grinding method, a polishing method, and an etching method are also applicable.

Fourth Embodiment

A fourth embodiment of the present invention will now be described.

In the first embodiment, the trench sections 204 have been formed, in advance, in areas corresponding to inter-element regions of the glass substrate 201 constituting the sealing cover glass 200 made of low α-ray glass. After the solid-state imaging element substrate has been bonded to the glass substrate, the back of the glass substrate 201 is subjected to CMP, thereby separating the elements from each other. The present embodiment is characterized in that a glass substrate having no indentation sections formed therein is bonded to the solid-state imaging element substrate; and in that, at the time of separation of the elements, the neighborhood of the separation lines is evaporated by means of dicing or a laser, thereby adjusting the edges of the glass substrates 201 of the respective solid-state imaging elements so as to come to an inner position with reference to the edge of the silicon substrate 101 constituting the solid-state imaging element substrate 100. In other respects, the fourth embodiment is formed in the same manner as in the first embodiment.

According to this method, as shown in FIG. 2B, processing of the glass substrate is terminated at a point in time when the spacer having a thickness of 0.1 mm is formed. A glass substrate formed by bonding the spacer 203S to the flat glass substrate 201 is used as starting material.

Figure 6A:
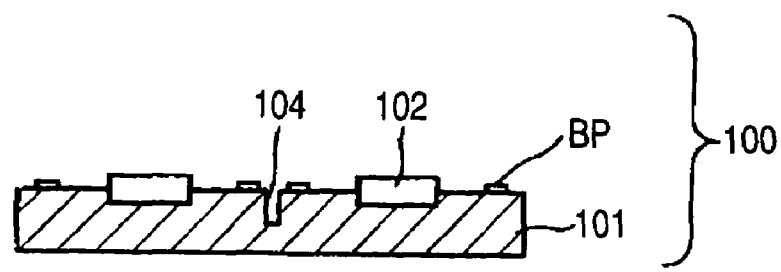
FIGS. 6A to 6D are views showing processes for manufacturing a solid-state imaging device according to a fourth embodiment of the present invention.

As shown in FIG. 6A, the silicon substrate 101 (a 6-inch wafer is employed herein) is prepared beforehand, and the slice grooves 104 are formed in areas corresponding to separation lines, which are to be used for separating solid-state imaging elements, on the surface of the silicon substrate 101, by means of a method such as etching. Formation of a channel stopper layer, formation of channel regions, and formation of element regions, such as charge transfer electrodes, are performed through use of ordinary silicon processes. A wiring layer is also formed in the surface, and the bonding pads BP to be used for establishing an external connection are formed from a gold layer.

Figure 6B:
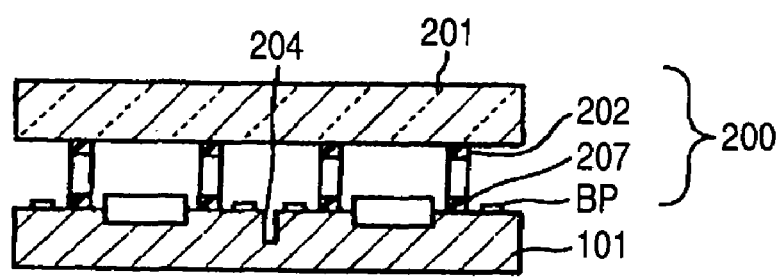

Subsequently, as shown in FIG. 6B, positioning is performed by means of alignment marks formed in the outer edge of each substrate, and the sealing cover glass 200 is placed on the solid-state imaging element substrate 100 formed in the manner mentioned previously. The solid-state imaging element substrate 100 and the sealing cover glass 200 are integrated together through pressurization by means of the adhesive layer 207 of room temperature curing type.

Figure 6C:
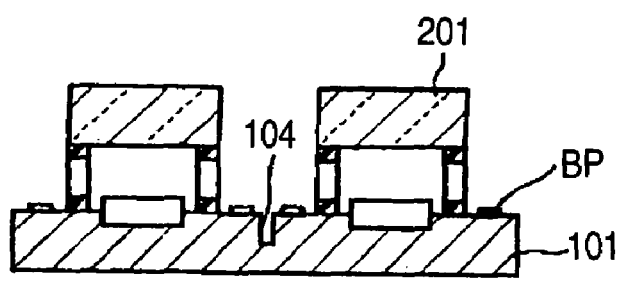

Subsequently, as shown in FIG. 6C, the neighborhood of the separation lines is evaporated from the back of the glass substrate by means of dicing or laser, and separation is performed by means of adjusting the edges of the glass substrates 201 of the respective solid-state imaging elements so as to come to an inner position with reference to the edge of the silicon substrate 101 constituting the solid-state imaging element substrate 100.

Figure 6D:
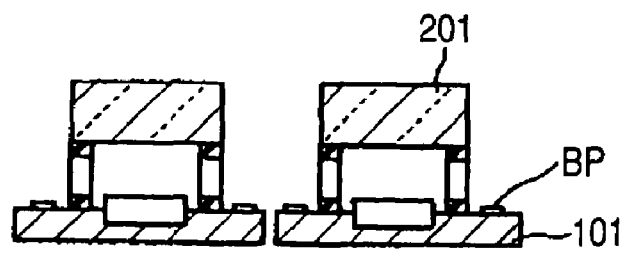

As shown in FIG. 6D, the back of the silicon substrate 101 is subjected to CMP in the same manner, and the back of the silicon substrate is polished to the slice grooves 104, thereby separating the solid-state imaging devices from each other. This process is not limited to CMP, but grinding polishing, or etching may also be employed.

As mentioned above, the solid-state imaging devices are separated from each other after having been mounted in a collective manner. Hence, the solid-state imaging devices are easy to manufacture and handle.

The trench sections 204 are not formed beforehand in the glass substrate 201, and the edges of the glass substrate 201 are removed by means of evaporation through use of dicing or a laser. Hence, separation can be realized very easily.

As mentioned above, a structure, wherein the edge of the glass substrate 201 is placed inside with reference to the edge of the silicon substrate 101 having the CCDs mounted thereon, to thus expose the surface of the silicon substrate 101, can be formed with high accuracy through a simple process, such as evaporation due to dicing or a laser.

Since the glass substrate maintains the same thickness until a separation process, warpage or distortion can be reduced.

Fifth Embodiment

A fifth embodiment of the present invention will now be described.

In the fourth embodiment, the slice grooves 104 have been formed, in advance, in the silicon substrate 101 constituting the solid-state imaging element substrate 100. After bonding operation, the back of the silicon substrate 101 is subjected to CMP until the slice grooves 104 are reached, thereby separating the silicon substrate 101 while rendering the same thin. However, the present embodiment is characterized in that the silicon substrate 101 is separated without forming slice grooves and the thickness of the silicon substrate is left exactly as is. As in the case of the fourth embodiment, the glass substrate 201 is bonded to the silicon substrate 101 without forming the trench sections 204 in the glass substrate 201, and the edges are evaporated at the time of separation operation. In other respects, the fifth embodiment is formed in the same manner as in the first embodiment.

Figure 7A:
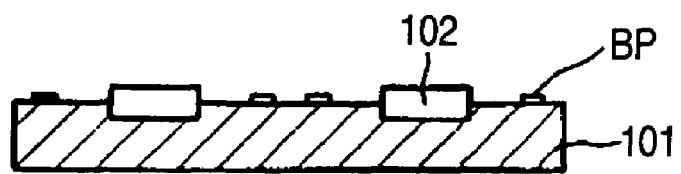
FIGS. 7A to 7D are views showing processes for manufacturing a solid-state imaging device according to a fifth embodiment of the present invention.

FIGS. 7A to 7D show bonding and separation processes of the second embodiment. As shown in FIG. 7A, the silicon substrate 101 is taken as a starting material. A channel stopper, a channel region, and the element region 102, such as a charge transfer electrode, are formed through use of ordinary silicon processes. Further, a wiring layer is also formed in the surface, and bonding pads BP to be used for establishing an external connection are formed from a gold layer.

Figure 7B:
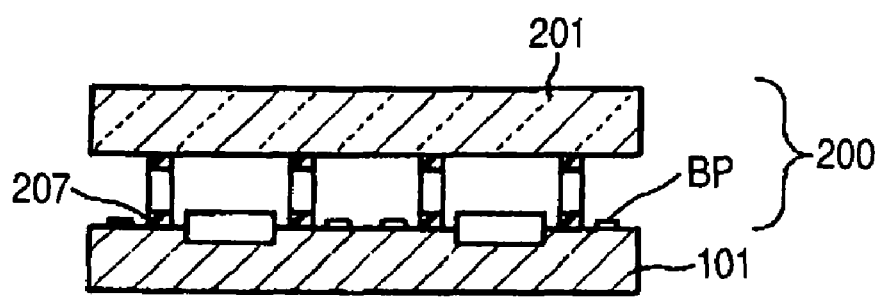

Subsequently, as shown in FIG. 7B, positioning is performed by means of alignment marks formed in the outer edge of each substrate, and the sealing cover glass 200 is placed on the solid-state imaging element substrate 100 having the element regions formed therein, in the manner mentioned previously. The solid-state imaging element substrate 100 and the sealing cover glass 200 are integrated together through pressurization by means of the adhesive layer 207 of room temperature curing type. At this time, no slice grooves and no indentation sections are formed in the silicon substrate 101 and the glass substrate 201, and hence high mechanical strength is achieved.

Figure 7C:
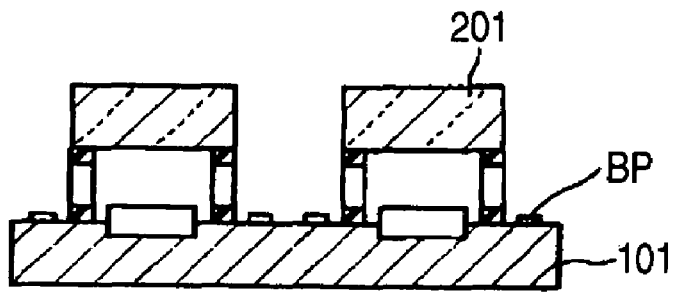

Subsequently, as shown in FIG. 7C, the neighborhood of the separation lines is evaporated from the back of the glass substrate by means of dicing or a laser, as in the case of the fourth embodiment. Separation is performed by means of adjusting the edges of the glass substrates 201 of the respective solid-state imaging elements so as to come to an inner position with reference to the edge of the silicon substrate 101 constituting the solid-state imaging element substrate 100.

Figure 7D:
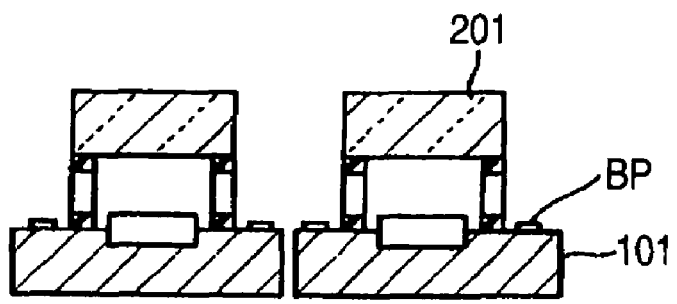

Finally, as shown in FIG. 7D, the solid-state imaging element substrate is cut from the part of the glass substrate 201, though use of diamond blade (grid stone) thereby separating the solid-state imaging devices from each other.

According to this method, the solid-state imaging device produced in the present embodiment is larger in thickness than the solid-state imaging device produced in the first embodiment. However, highly reliable solid-state imaging devices can be formed.

Sixth Embodiment

A sixth embodiment of the present invention will now be described.

In the fourth embodiment, the slice grooves 104 have been formed, in advance, in the silicon substrate 101 constituting the solid-state imaging element substrate 100, and the back of the silicon substrate 101 is subjected to CMP, thereby separating the silicon substrate 101. Moreover, in the fifth embodiment, the separation slices 104 are not formed beforehand in the silicon substrate 101 constituting the solid-state imaging element substrate 100. After bonding operation, the silicon substrate 101 is separated through use of the diamond blade (grindstone), thereby separating the silicon substrate 101. However, in the present embodiment, the dummy plate 301 made of a silicon substrate having a thickness of 50 to 700 μm is caused to adhere to the back of the silicon substrate 101 by way of the adhesive layer 302, to thereby obviate a necessity for separating the silicon substrate 101 after the sealing cover glass 200 has been bonded to the solid-state imaging element substrate 101. After adhesion of the dummy plate, the slice grooves 304 are formed in the dummy plate 301 to the depth reaching the dummy plate 301.

Accordingly, the adhesive layer 302 may be softened in the separation process to deprive the adhesive layer of tackiness, thereby removing the dummy plate 301.

In other respects, the sixth embodiment is formed in the same manner as in the fourth and fifth embodiments.

Figure 8A:
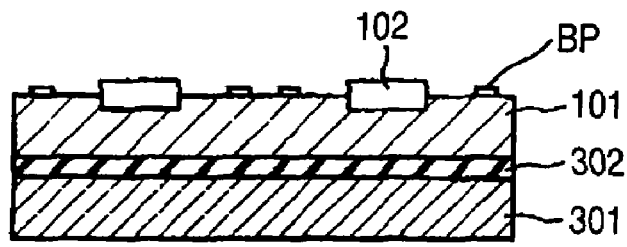
FIGS. 8A to 8E are views showing processes for manufacturing a solid-state imaging device according to a sixth embodiment of the present invention.

FIGS. 8A to 8E show bonding and separation processes of the sixth embodiment. The silicon substrate 101 is taken as a starting material. A channel stopper, a channel region, and the element region, such as a charge transfer electrode, are formed through use of ordinary silicon processes. Further, a wiring layer is also formed in the surface, and bonding pads BP to be used for establishing an external connection are formed from a gold layer. Subsequently, as shown in FIG. 8A, the dummy plate 301 made of a silicon substrate having a thickness of 50 to 700 μm is caused to adhere to the back of the silicon substrate 101 by way of the adhesive layer 302.

Figure 8B:
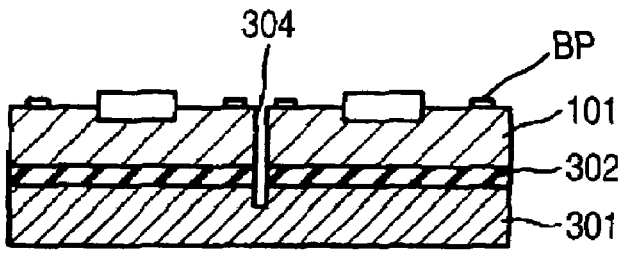

As shown in FIG. 8B, the slice grooves 304 are formed from the element-formed surface side of the silicon substrate 101 through use of a diamond blade (grindstone).

Figure 8C:
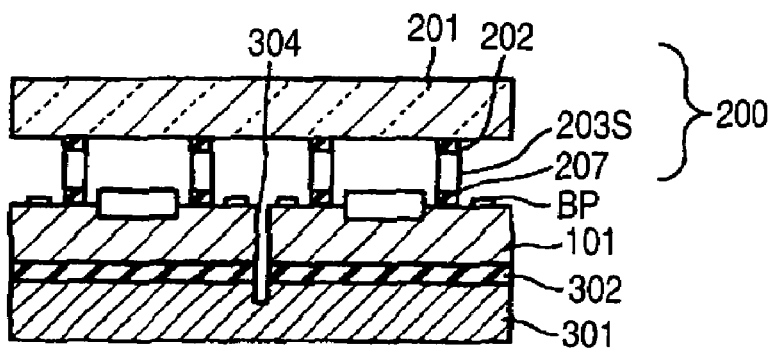

Subsequently, as shown in FIG. 8C, positioning is performed by means of alignment marks (not shown) formed in the outer edge of the solid-state imaging element substrate 100 and that of the sealing cover glass 200, and the sealing cover glass 200 made of low α-ray glass is placed on the solid-state imaging element substrate 100 that has been formed in the manner mentioned previously. The solid-state imaging element substrate 100 and the sealing cover glass 200 are integrated together through pressurization by means of the adhesive layer 207 of room temperature curing type. Here, a glass substrate, in which the spacer 203S having a thickness of 0.1 mm is formed by means of patterning the silicon substrate formed on the glass substrate 201 in the same manner as in the processes shown in FIGS. 2A to 2C, is used as the glass substrate 201 serving as the sealing cover glass 200. The adhesive layer 207 of room temperature curing type is formed on the end face of the spacer 203S. Although the slice grooves 304 are formed so as to penetrate through the silicon substrate 101 at this time, the silicon substrate is fixed by the dummy plate 301, and hence high mechanical strength is achieved.

Figure 8D:
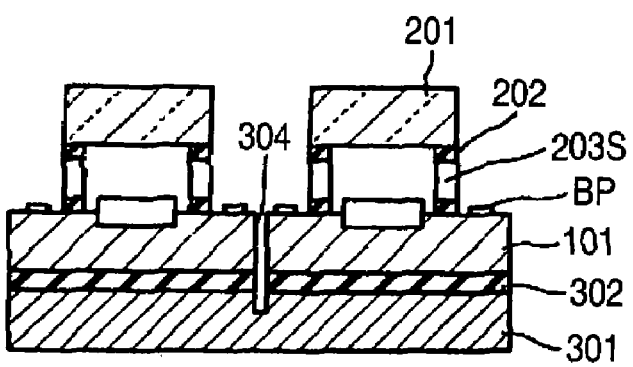

As shown in FIG. 8D, the neighborhood of the separation lines is evaporated from the back of the glass substrate by means of dicing or a laser in the same manner as in the case of the fourth embodiment, and separation is performed by means of adjusting the edges of the glass substrates 201 of the respective solid-state imaging elements so as to come to an inner position with reference to the edge of the silicon substrate 101 constituting the solid-state imaging element substrate 100.

Figure 8E:
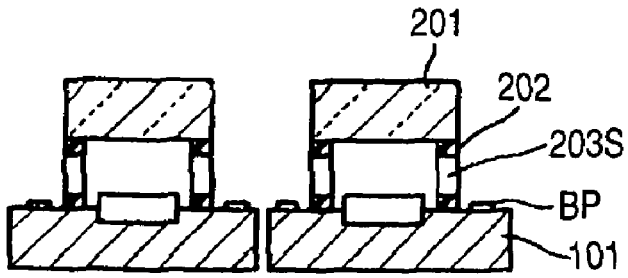

As shown in FIG. 8E, the adhesive layer 302 provided on the back of the silicon substrate 101 is softened to remove the dummy plate 301, whereby the solid-state imaging devices are separated from each other. Here, a material whose softening point is lower than that of the adhesive layer 202 to be used for bonding the spacer to the glass substrate 201 is preferably selected as the adhesive layer 302.

According to this method, the solid-state imaging element substrate 100 is subjected to dicing in advance on the dummy plate 301 before being bonded. Hence, the solid-state imaging device of the present embodiment undergoes less stress after bonding than does the solid-state imaging device obtained in the first embodiment, and hence a manufacturing yield is improved. Moreover, an attempt can be made to improve the reliability of the solid-state imaging element.

In the fourth through sixth embodiments, cutting of the glass substrate maybe performed by means of scribing or etching.

Seventh Embodiment

A seventh embodiment of the invention will now be described. In the sixth embodiment, the dummy plate 301 made of a silicon substrate having a thickness of 50 to 700 μm is caused to adhere to the back of the silicon substrate 101 by way of the adhesive layer 302. After adhesion of the dummy plate, the slice grooves 304 are formed in the dummy plate 301 to the depth reaching the dummy plate 301. After the silicon substrate 101 has been bonded to the glass substrate 201, the adhesive layer 302 is softened in the process of separating the solid-state imaging element substrate into individual solid-state imaging elements, and the solid-state imaging elements are separated by means of removing the dummy plate 301. In the present embodiment, a dummy plate 401 made of a silicon substrate having a thickness of 50 to 700 μm is caused to adhere to the back of the glass substrate 201 by way of an adhesive layer 402. After adhesion of the dummy plate, indentation sections 404 are formed to a depth reaching the dummy plate 401. After the silicon substrate 101 has been bonded to the glass substrate 201, the adhesive layer 402 is softened in the process of separating the solid-state imaging element substrate into individual solid-state imaging elements, and the solid-state imaging elements are separated by means of removing the dummy plate 401.

As in the case of the second and fourth embodiments, a silicon substrate for which neither separation grooves nor a dummy plate are formed is used as the silicon substrate 101 constituting the solid-state imaging element substrate 100. Finally, the silicon substrate is sliced and separated by means of the diamond blade (grindstone).

The bonding and separation processes are shown in FIGS. 9A to 9E.

Figure 9A:
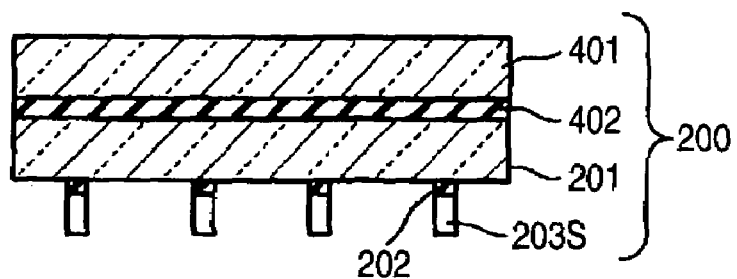
FIGS. 9A to 9E are views showing processes for manufacturing a solid-state imaging device according to a seventh embodiment of the present invention.

As shown in FIG. 9A, the dummy plate 401 made of a silicon substrate having a thickness of 50 to 700 μm is caused to adhere to the back of the glass substrate 201 by way of the adhesive layer 402. After adhesion of the dummy plate, the silicon substrate 203 is caused to adhere to the adhesive layer 402 by way of the adhesive layer 202. As in the case of the first embodiment described by reference to FIGS. 2A to 2C, the silicon substrate 203 is subjected to etching using photolithography, to thus form the spacer 203S having a thickness of 0.1 mm.

Figure 9B:
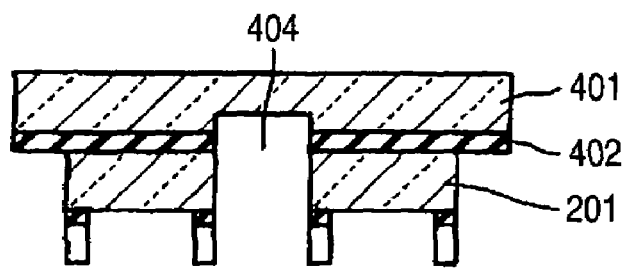

As shown in FIG. 9B, as in the case of the first embodiment, the areas corresponding to the regions between the solid-state imaging elements are again selectively etched, thereby forming the indentation sections 404 having a depth reaching the dummy plate 401. Moreover, the indentation sections may be formed by means of half-dicing.

Figure 9C:
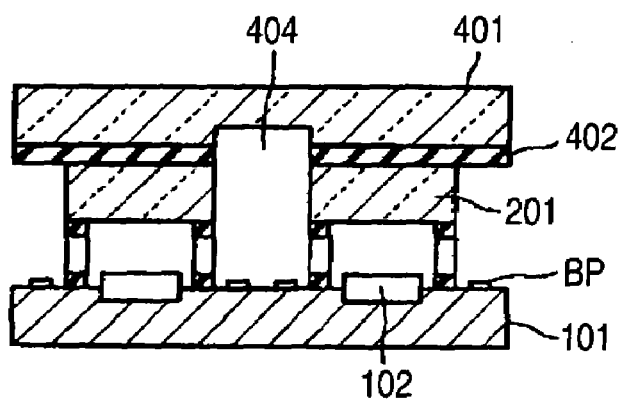

The silicon substrate 101 is taken as a starting material. A channel stopper, a channel region, and the element region, such as a charge transfer electrode, are formed through use of ordinary silicon processes. Further, a wiring layer is also formed in the surface, and bonding pads BP to be used for establishing an external connection are formed from a gold layer. Subsequently, as shown in FIG. 9C, positioning is performed by means of alignment marks (not shown) formed in the outer edge of the solid-state imaging element substrate 100 and that of the sealing cover glass 200 made of low α-ray glass. The sealing cover glass 200 having the dummy plate 401 is placed on the solid-state imaging element substrate 100 that has been formed in the manner mentioned previously. The solid-state imaging element substrate 100 and the sealing cover glass 200 are integrated together through pressurization by means of the adhesive layer 207 of room temperature curing type.

Figure 9D:
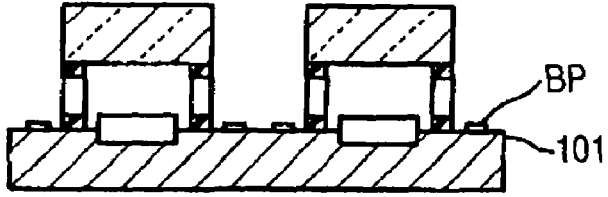

As shown in FIG. 9D, the adhesive layer 402 is softened by means of heating, thereby removing the dummy plate 401. As a result, the glass substrate 201 is separated.

Figure 9E:
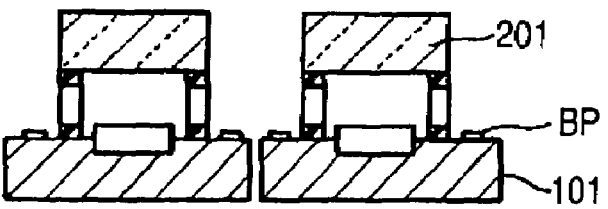

As shown in FIG. 9E, the solid-state imaging element substrate made of the silicon substrate 101 is sliced through use of the diamond blade (grindstone), thereby separating the solid-state imaging devices from each other.

According to this method, the glass substrate 201 constituting the sealing cover glass 200 is sliced in advance on the dummy plate 401 by means of dicing or etching before being bonded. Hence, the solid-state imaging device of the present embodiment undergoes less stress after bonding than does the solid-state imaging device obtained in the first embodiment, and hence a manufacturing yield is improved. Moreover, an attempt can be made to improve the reliability of the solid-state imaging element.

Eighth Embodiment

An eighth embodiment of the present invention will now be described.

In the seventh embodiment, the silicon substrate 101 constituting the solid-state imaging element substrate 100 is subjected to bonding in its present form without forming the slice grooves 104 in the silicon substrate beforehand. Finally, the solid-state imaging element substrate is sliced by means of the diamond blade (grindstone). However, the present embodiment is characterized in that the slice grooves 104 have been formed in advance in the silicon substrate 101 constituting the solid-state imaging element substrate 100 and in that the silicon substrate is polished from the back thereof, by means of CMP after bonding until the substrate is polished to the slice grooves 104, thereby separating the silicon substrate 101 while reducing the thickness of the same. In other respects, the eighth embodiment is formed in the same manner as in the seventh embodiment.

Figure 10A:
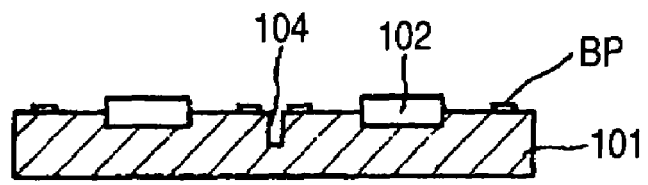
FIGS. 10A to 10D are views showing processes for manufacturing a solid-state imaging device according to an eighth embodiment of the present invention.

Specifically, FIGS. 10A to 10D show bonding and separation processes of the eighth embodiment. As shown in FIG. 10A, the silicon substrate 101 having the slice grooves 104 formed therein is taken as a starting material. A channel stopper, a channel region, and the element region 102, such as a charge transfer electrode, are formed through use of ordinary silicon processes. Further, a wiring layer is also formed in the surface, and bonding pads BP to be used for establishing an external connection are formed from a gold layer.

Figure 10B:
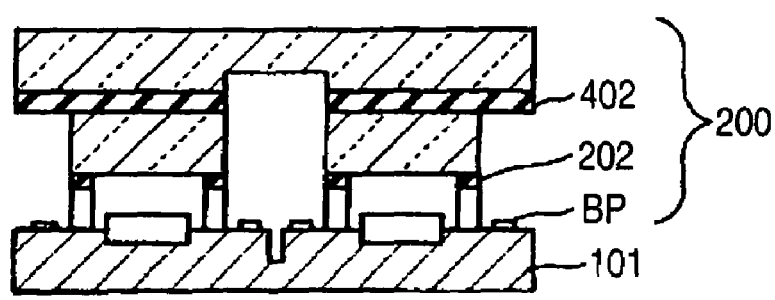

Subsequently, as shown in FIG. 10B, positioning is performed by means of alignment marks formed in the outer edges of the respective substrates, and the sealing cover glass 200 (with the dummy substrate 401) made of low α-ray glass in the manner as described in the seventh embodiment is placed on the solid-state imaging element substrate 100. The solid-state imaging element substrate 100 and the sealing cover glass 200 are integrated together through pressurization by means of the adhesive layer 207 of room temperature curing type.

Figure 10C:
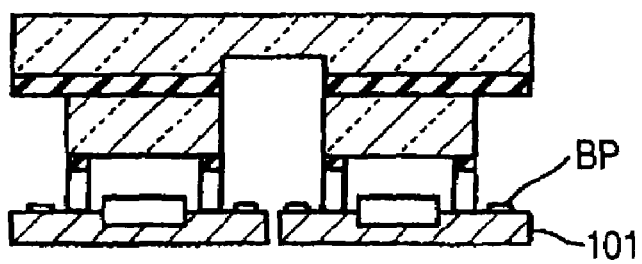

As shown in FIG. 10C, the back of the solid-state imaging element substrate 100 is subjected to CMP (chemical-mechanical polishing), whereby the back of the silicon substrate 101 is removed to the slice grooves 104.

Through these processes, a reduction in the thickness of the solid-state imaging element substrate and separation of the glass substrate into pieces can be achieved simultaneously. Even in this case, grinding, polishing, or etching may be employed in place of CMP.

Figure 10D:
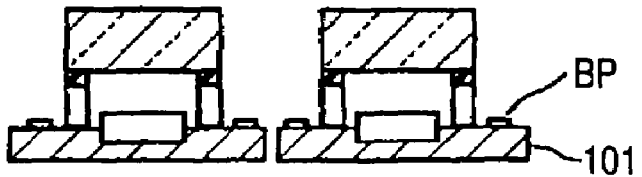

As shown in FIG. 10D, the adhesive layer 402 maybe heated and softened, thereby removing the dummy plate 401.

Ninth Embodiment

A ninth embodiment of the present invention will now be described.

In the seventh embodiment, the silicon substrate 101 constituting the solid-state imaging element substrate 100 is subjected to bonding in its present form without the slice grooves 104 being formed in the silicon substrate beforehand. Finally, the solid-state imaging element substrate is sliced by means of the diamond blade (grindstone). However, in the present embodiment, a dummy plate has been formed in advance in the silicon substrate 101 constituting the solid-state imaging element substrate 100 and in the glass substrate 201 constituting the sealing cover glass 200. Before bonding operation, the slice grooves 104 and the trench sections 204 have been formed. After bonding operation, the adhesive layers 402 and 302 are separated from each other by means of removing the dummy plates 301 and 401. In other respects, the ninth embodiment is formed in the same manner as in the seventh embodiment.

Specifically, FIGS. 11A to 11D show bonding and separation processes of the ninth embodiment. The silicon substrate 101 having the dummy plate 301 bonded thereon is taken as a starting material. A channel stopper, a channel region, and the element region 102, such as a charge transfer electrode, are formed through use of ordinary silicon processes. Further, a wiring layer is also formed in the surface, and bonding pads BP to be used for establishing an external connection are formed from a gold layer.

Figure 11A:
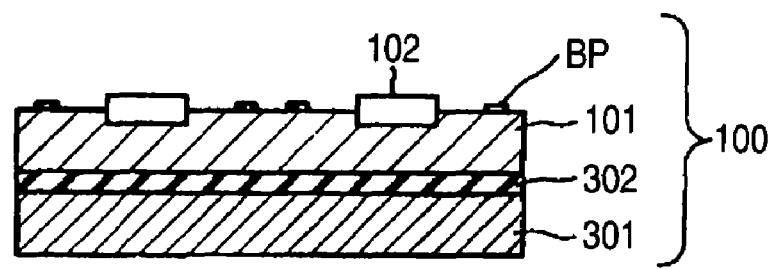
FIGS. 11A to 11D are views showing processes for manufacturing a solid-state imaging device according to a ninth embodiment of the present invention.
Figure 11B:
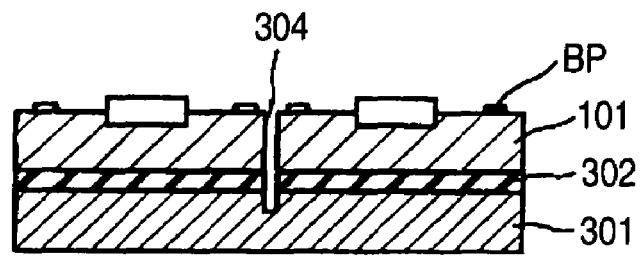

As shown in FIG. 11B, the slice grooves 304 are formed in the dummy plate 301 to reach the dummy plate 301.

As in the case of the seventh and eighth embodiments, the dummy plate 401 is caused to adhere to the sealing cover glass 200, and the indentation sections 404 are formed by means of etching or dicing.

Figure 11C:
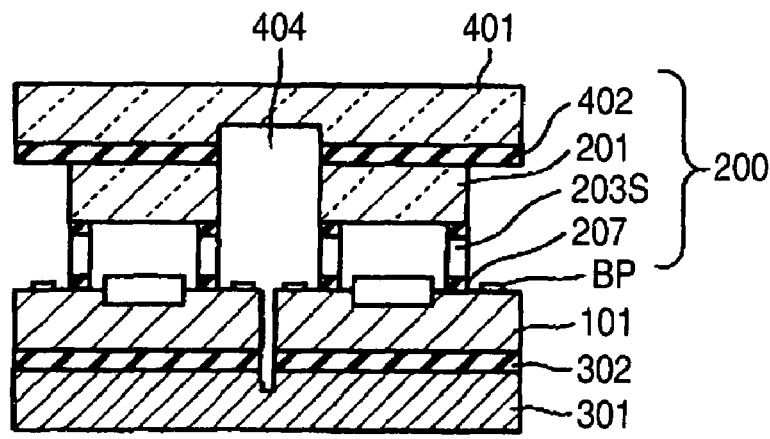

Subsequently, as shown in FIG. 11C, positioning is performed by means of alignment marks formed in the outer edges of the respective substrates, and the sealing cover glass 200 that has the dummy substrate 401 and is formed as in the seventh embodiment is placed on the solid-state imaging element substrate 100 with the dummy substrate 301. The solid-state imaging element substrate 100 and the sealing cover glass 200 are integrated together through pressurization by means of the adhesive layer 207 of room temperature curing type.

Figure 11D:
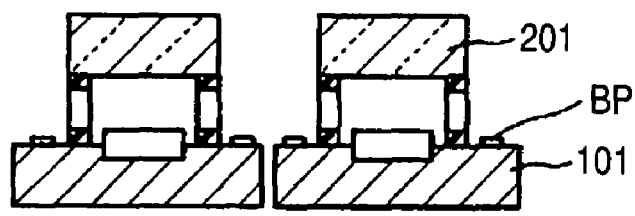

As shown in FIG. 11D, the adhesive layers 402 and 203 are softened to remove the dummy plates 301, 401, thereby separating the solid-state imaging elements into pieces.

Adhesives having substantially the same softening temperature are used for the adhesive layers 302, 402 and may be softened simultaneously.

After one of the two adhesive layers has been softened and removed, the substrate from which the adhesive layer has been removed may be fixed by means of taping, and the remaining adhesive layer may be removed by means of softening.

By means of this configuration, the solid-state imaging elements are not susceptible to excessive stress after bonding, thereby reducing damage inflicted on the solid-state imaging elements.

Tenth Embodiment

A tenth embodiment of the invention will now be described.

Figure 12A:
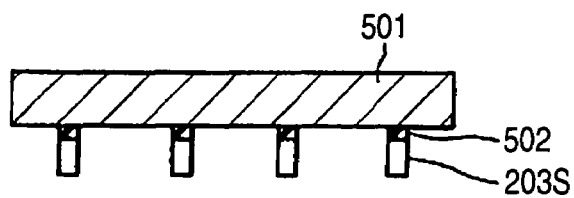
FIGS. 12A and 12B are views showing processes for manufacturing a solid-state imaging device according to a tenth embodiment of the present invention.
Figure 12B:
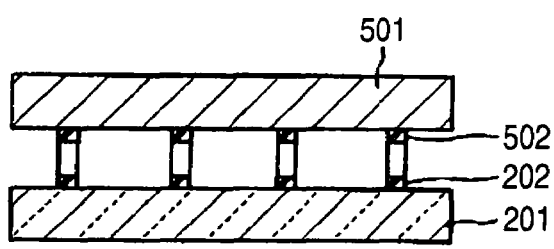

As shown in FIGS. 2A and 2B, in the first through ninth embodiments, at the time of formation of the sealing cover glass 200 in which the spacer 203S having a thickness of 0.1 mm is formed, the silicon substrate 203—which is to become a spacer—is caused to adhere to the glass substrate 201 by way of an adhesive. The silicon substrate 203 is patterned by means of the etching method using photolithography, and the slice grooves 104 are formed. However, in the present embodiment, as shown in FIGS. 12A and 12B, the spacers 203S are etched on a dummy plate 501. Subsequently, the spacers 203S are caused to adhere to the glass substrate 201 by way of the adhesive layer 202. In other respects, the tenth embodiment is formed in the same manner as in the previous embodiments.

As shown in FIG. 12A, the silicon substrate 203, which is to become spacers, is caused to adhere to the dummy plate 501 made of a silicon substrate by way of an adhesive layer 502 having a softening temperature of 50° C. to 150° C. or thereabouts. The silicon substrate 203 is patterned by means of the etching method using photolithography, thereby forming the spacers 203S.

As shown in FIG. 12B, the glass substrate 201 is caused to adhere to the spacer 203S by way of the adhesive layer 202 having a softening temperature of 100 to 200° C. or thereabouts.

After adhesion of the glass substrate 201, the substrates are heated to a temperature at which the adhesive layers 202 are not softened but the adhesive layer 502 becomes soft (i.e., about 50 to 150° C. or thereabouts), thereby softening the adhesive layer 502 to remove the dummy plate 501. Thereby, the sealing cover glass 200 with the spacer is formed.

This method does not need to process the spacers on the glass substrate, thereby preventing occurrence of flaws in the glass substrate 201, which would otherwise be responsible for fogging.

The adhesive layer 502 to be used for the dummy plate should withstand a baking temperature employed in the photolithography. Because of a necessity for removing the dummy plate 501, the adhesive layer 202 to be used for causing the spacer 203S to adhere to the glass substrate 201 must be sufficiently higher in softening temperature than the adhesive layer 502.

Figure 13:
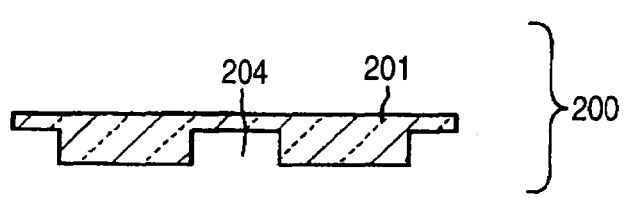
FIG. 13 is a view showing processes for manufacturing the solid-state imaging device according to the tenth embodiment of the present invention.

When indentation sections must be formed in the glass plate, the trench sections 204 should have been formed by means of dicing or etching before adhesion of the adhesive layer, as shown in FIG. 13. After removal of the dummy plate 501, projections and indentations should be formed by means of dicing or etching.

The slicing and cutting processes are the same as those shown in FIGS. 3 to 5, which have been described in connection with the first through third embodiments.

Eleventh Embodiment

An eleventh embodiment of the present invention will now be described.

In the first through tenth embodiments, the spacer 203S are formed separately and are caused to adhere by way of the adhesive layer. However, in the present embodiment, spacers 206 are formed by means of forming indentation sections 205 in the glass substrate 201 made of low a-ray glass, by means of the etching method using photolithography. In other respects, the eleventh embodiment is formed in the same manner as in the previous embodiments.

Figure 14A:
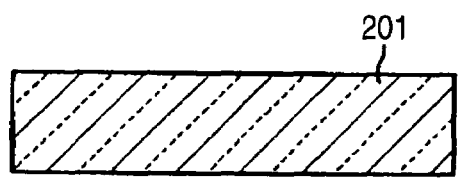
FIGS. 14A and 14B are views showing processes for manufacturing a solid-state imaging device according to an eleventh embodiment of the present invention.

Specifically, as shown in FIG. 14A, the glass substrate 201 is prepared.

Figure 14B:
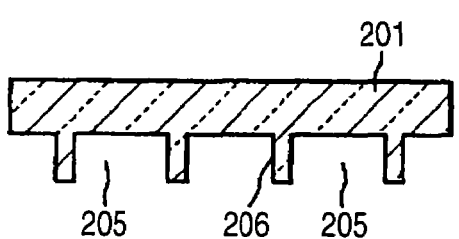

As shown in FIG. 14B, the indentation sections 205 are formed by means of the etching method using photolithography, thereby forming a glass substrate provided with spacers 206.

By means of the configuration, the spacers 206 are formed integrally, and hence manufacture is easy, and no positional displacement arises. Further, there is no chance of distortion arising in the bonded section.

Twelfth Embodiment

A twelfth embodiment of the invention will now be described.

The eleventh embodiment has described a method for forming the sealing cover glass 200 with which the spacers 206 having a thickness of 0.1 mm are formed integrally. However, as shown in FIGS. 15A to 15C, the trench sections 204 can also be formed beforehand by means of etching.

In the present embodiment, the indentation sections 205 are formed in the glass substrate 201 by means of the etching method using photolithography, thereby forming the spacers 206 integrally. As a result of formation of the trench sections 204, the trench sections 204 of the glass substrate for making the edges of the sealing cover glass 200 come to the inside with reference to the edges of the solid-state imaging element substrate 100 are formed by means of etching. Accordingly, occurrence of distortion is diminished, thereby facilitating the separation process.

Figure 15A:
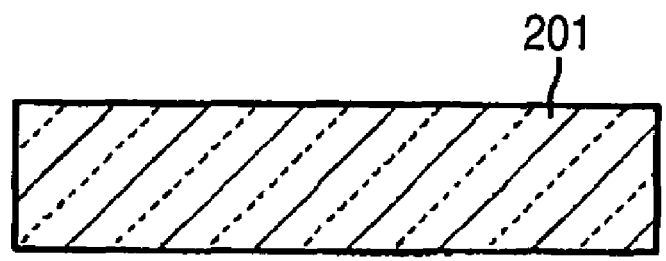
FIGS. 15A to 15C are views showing processes for manufacturing a solid-state imaging device according to a twelfth embodiment of the present invention.

Specifically, as shown in FIG. 15A, the glass substrate 201 is prepared.

Figure 15B:
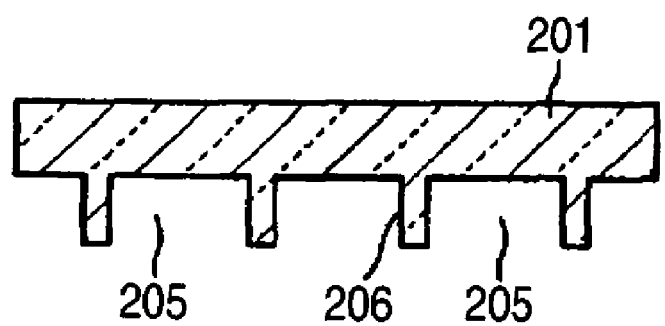
Figure 15C:
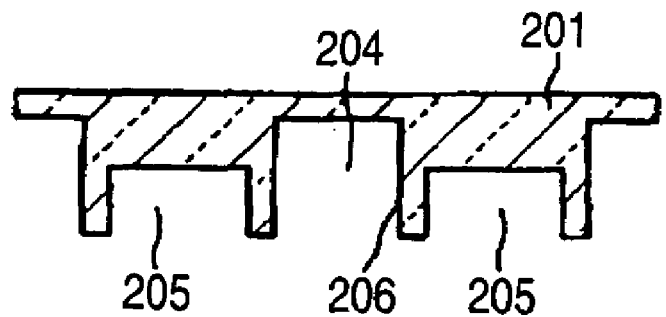

As shown in FIG. 15B, the indentation sections 205 are formed in the glass substrate 201 by means of the etching method using photolithography.

Subsequently, as shown in FIG. 15C, the glass substrate 201 is etched further deeper by means of the etching method using photolithography, to thus form the trench sections 204 and form the spacers 206 integrally.

These processing steps differ from each other in terms of an etch depth and, hence, require two etching operations. The resist pattern—which is to become a mask—may be formed in to a double-layer structure. According to one possible method, after etching of the trench sections 204 to be used for forming spacers, only the upper resist pattern is selectively removed, to thus perform etching while only the lower resist pattern is taken as a mask.

The bonding and separation processes are the same as those shown in FIGS. 3 through 5, which have been described in connection with the first through third embodiments.

Thirteenth Embodiment

A thirteenth embodiment of the present invention will now be described.

The eleventh and twelfth embodiments have described the method for forming the sealing cover glass 200 with which the spacer 206 having a thickness of 0.1 mm is formed integrally. However, as shown in FIGS. 16A to 16D, the silicon substrate 203 for a spacer is caused to adhere to the glass substrate 201 in which the trench sections 204 are formed. The substrates may then be selectively removed by means of the etching method using photolithography, to thus form the spacers 203S. In other respects, the thirteenth embodiment is formed in the same manner as are the eleventh and twelfth embodiments.

In the present embodiment, the trench sections 204 are formed in the glass substrate 201 by means of the etching method using photolithography, thereby forming the spacers 206 integrally. The trench sections 204 of the glass substrate for making the edges of the sealing cover glass 200 come to the inside with reference to the edges of the solid-state imaging element substrate 100 are formed by means of etching. Accordingly, occurrence of distortion is diminished, thereby facilitating the separation process.

Figure 16A:
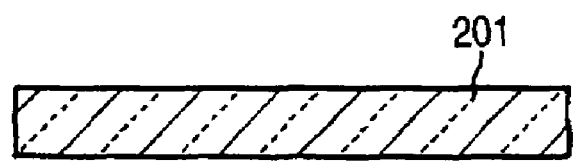
FIGS. 16A to 16D are views showing processes for manufacturing a solid-state imaging device according to a thirteenth embodiment of the present invention.

Specifically, as shown in FIG. 16A, the glass substrate 201 is prepared.

Figure 16B:
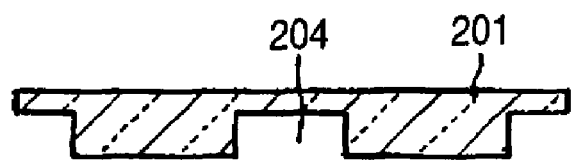

As shown in FIG. 16B, the trench sections 204 are formed in the glass substrate 201 by means of the etching method using photolithography, thereby forming the trench sections 204.

Figure 16C:
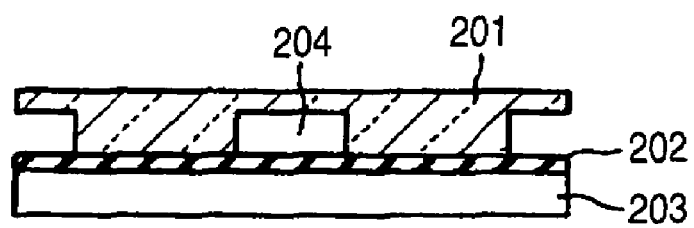

Subsequently, as shown in FIG. 16C, the silicon substrate 203, which is to serve as a substrate for spacers, is caused to adhere to the glass substrate 201 by way of the adhesive layer 202.

Figure 16D:
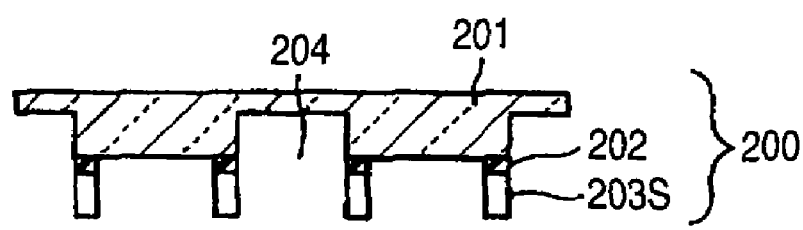

Further, as shown in FIG. 16D, the spacers 203S are integrally formed by means of the etching method using photolithography.

By means of the method, the sealing glass cover 200 with highly reliable spacers can be formed with high accuracy.

The slicing and cutting processes are the same as those shown in FIGS. 3 to 5, which have been described in connection with the first through third embodiments.

Fourteenth Embodiment

A fourteenth embodiment of the present invention will now be described.

Figure 17A:
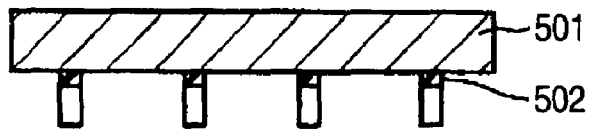
FIGS. 17A to 17C are views showing processes for manufacturing a solid-state imaging device according to a fourteenth embodiment of the present invention.
Figure 17B:
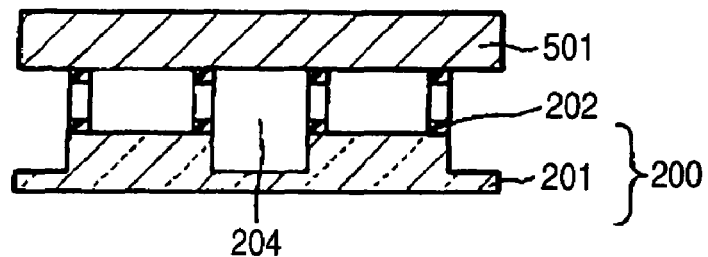

As shown in FIGS. 16A to 16D, in the thirteenth embodiment, the silicon substrate 203, which has a thickness of 0.1 mm and is to become a spacer, is caused to adhere to the glass substrate 201 by way of the adhesive. The silicon substrate 203 is patterned by means of the etching method using photolithography, thereby forming the sealing cover glass 200 made of low α-ray glass. However, in the present embodiment, as shown in FIGS. 17A and 17B, the spacers 203S are etched on the dummy plate 501. Subsequently, the spacers 203S are caused to adhere to the glass substrate 201 having the trench sections 204 formed therein, by way of the adhesive layer 202. In other respects, the tenth embodiment is formed in the same manner as in the thirteenth embodiment.

Specifically, the silicon substrate 203, which is to become spacers, is caused to adhere to the dummy plate 501 made of a silicon substrate by way of the adhesive layer 502 having a softening temperature from 50° C. to 150° C. or thereabouts. As shown in FIG. 17A, the silicon substrate 203 is patterned by means of the etching method using photolithography, thereby forming the spacers 203S.

As shown in FIG. 17B, the glass substrate 201 having the trench sections 204 is caused to adhere to the spacers 203S by way of the adhesive layer 202 having a softening temperature of 100 to 200° C. or thereabouts.

Figure 17C:
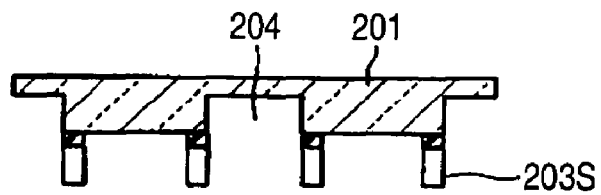

After adhesion of the glass substrate 201, the adhesive layer 502 is heated to 50 to 150° C. within a range in which the adhesive layer 202 is not softened, and thereby softened to remove the dummy plate 501, to thus form the sealing cover glass 200 with spacers, as shown in FIG. 17C.

This method does not require processing the spacers on the glass substrate, thereby preventing occurrence of flaws in the glass substrate 201, which would otherwise be responsible for fogging.

The bonding and separation processes are the same as those shown in FIGS. 3 to 5, which have been described in connection with the first through third embodiments.

Fifteenth Embodiment

A fifteenth embodiment of the present invention will now be described.

The twelfth through fourteenth embodiments have described the processes for manufacturing the sealing cover glass 200, which has the trench sections 204 for facilitating the separation process, which has spacers having a thickness of 0.1 mm, and which is made of low α-ray glass. Fifteenth through seventeenth embodiments are characterized in that the glass substrate is separated in advance by means of having caused the dummy plate 401 to adhere to the glass substrate and having formed the trench sections 204; and in that the solid-state imaging elements are separated into pieces by means of softening the adhesive layer 402 after bonding. In other respects, the tenth embodiment is formed in the same manner as in the fourteenth embodiment.

Figure 18:
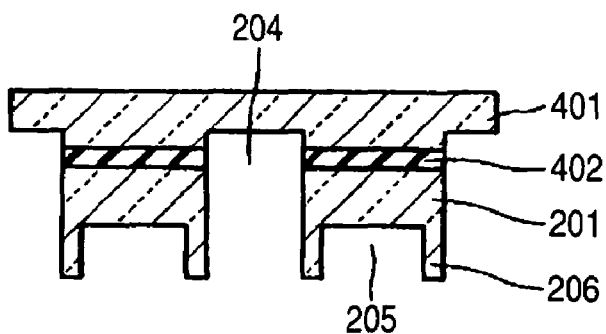
FIG. 18 is a view showing processes for manufacturing a solid-state imaging device according to a fifteenth embodiment of the present invention.

In the embodiment shown in FIGS. 15A to 15C, the trench sections 204 are formed in the glass substrate of the sealing cover glass with integrated spacers, thereby facilitating separation of the glass substrate. However, in the present embodiment, as shown in FIG. 18, separation can be readily effected by means of removing the dummy plate 401 made of the glass substrate, by way of the adhesive layer 402.

A glass plate is used as starting material. After adhesion of the dummy plate, formation of the trench sections 204 and formation of the spacers 206 are performed by means of the etching method using photolithography.

By means of this configuration, the only requirement is to soften the adhesive layer 402 at the time of separation, by means of heating. Hence, separation can be attained very easily.

The bonding and separation processes are the same as those described in connection with the seventh through ninth embodiments.

Sixteenth Embodiment

A sixteenth embodiment of the present invention will now be described.

The present embodiment is characterized in that the glass substrate 201 is caused to adhere to the dummy plate 401, wherein the glass substrate 201 is of a type which has been described in connection with the thirteenth embodiment and which is formed by causing the spacers 203S having a thickness of 0.1 mm to adhere to the glass plate having indentation sections; in that the trench sections 204 have been formed in the glass substrate 201 beforehand, whereby the glass substrate itself is separated before bonding; and in that, after bonding operation, the adhesive layer 402 is softened, thereby removing the dummy plate to separate the individual solid-state imaging elements.

Figure 19A:
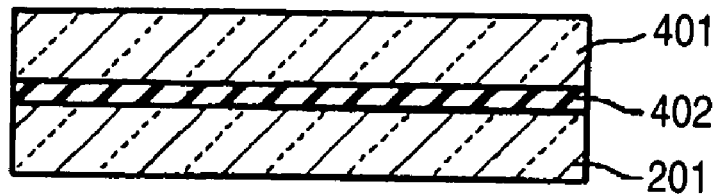
FIGS. 19A to 19D are views showing processes for manufacturing a solid-state imaging device according to a sixteenth embodiment of the present invention.
Figure 19B:
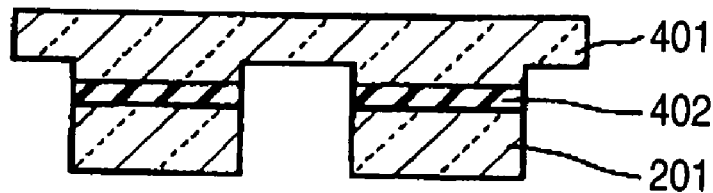

In the present embodiment, as shown in FIGS. 19A and 19B, the dummy plate 401 is caused to adhere to the glass substrate integrated with the spacers of the embodiment shown in FIGS. 16A and 16B by way of the adhesive layer 402, thereby forming the trench sections 204.

A glass plate is used as starting material. After adhesion of the dummy plate, formation of the trench sections 204 having a depth reaching the dummy plate and formation of the spacers 203S are performed in the same manner as in the thirteenth embodiment.

As shown in FIG. 19A, the dummy substrate 401 is caused to adhere to the glass substrate 201 by way of the adhesive layer 402.

As shown in FIG. 19B, the glass substrate 201 is etched through use of photolithography, thereby forming trench sections in the surface of the glass substrate 201 to reach the dummy substrate 401.

Figure 19C:
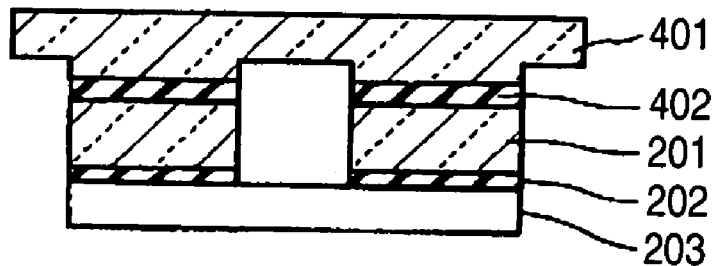

As shown in FIG. 19C, the silicon substrate 203 for spacers is caused to adhere to the glass substrate 201 by way of the adhesive layer 202.

Figure 19D:
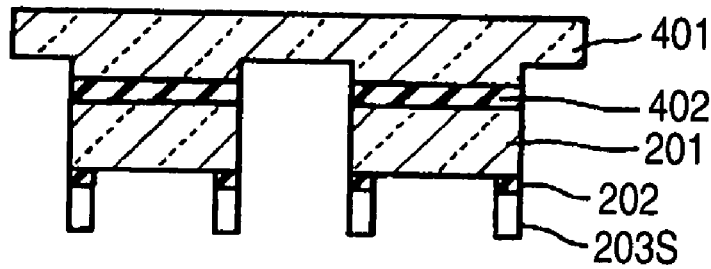

As shown in FIG. 19D, the silicon substrate 203 is selectively removed by means of the etching method using photolithography, thereby forming the spacers 203S.

By means of such a configuration, after the glass substrate 201 has been bonded to the solid-state imaging element substrate 100, only the adhesive layer 402 is softened by means of heating at the time of dicing operation, thereby readily separating the solid-state imaging elements.

The bonding and separation processes are the same as those described in connection with the seventh through ninth embodiments.

Seventeenth Embodiment

A seventeenth embodiment of the present invention will now be described.

The present embodiment is characterized in that the spacers 203S—which have been patterned on the dummy plate 501 and have a thickness of 0.1 mm—and the glass substrate 201 are caused to adhere to the dummy plate 401, wherein the glass substrate 201 is of a type which has been described in connection with the fourteenth embodiment (FIG. 17) and is formed by means of causing the spacers 203S to adhere to the glass plate—which is made of low α-ray glass and has the indentation sections—where by the glass substrate itself is separated before bonding; and in that, after bonding operation, the adhesive layer 402 is softened, thereby removing the dummy plate to separate the individual solid-state imaging elements. In other respects, the seventeenth embodiment is formed in the same manner as in the fourteenth embodiment.

Figure 20A:
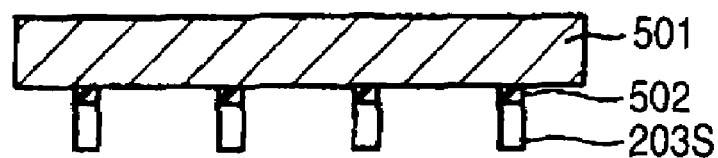
FIGS. 20A to 20C are views showing processes for manufacturing a solid-state imaging device according to a seventeenth embodiment of the present invention.
Figure 20B:
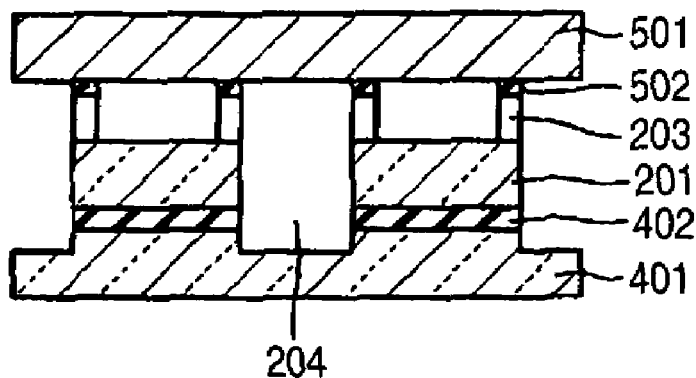
Figure 20C:
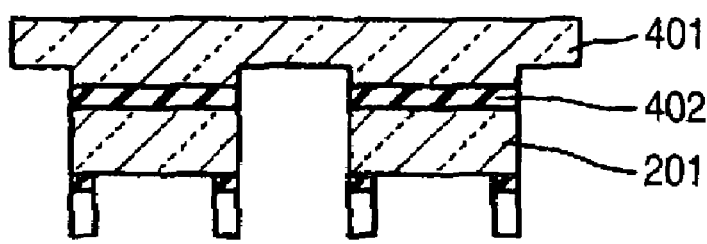

In the present embodiment, as shown in FIGS. 20A to 20C, the dummy plate 401 is caused to adhere to the glass substrate of spacer adhesion type according to the embodiment shown in FIGS. 17A and 17B, by way of the adhesive layer 402.

A glass plate is used as starting material. After adhesion of the dummy plate, formation of the trench sections 204 having a depth reaching the dummy plate and formation of the spacers 203S are performed in the same manner as in the fifteenth embodiment.

Specifically, the silicon substrate 203, which is to become spacers, is caused to adhere to the dummy plate 501, which is to become a silicon substrate, by way of the adhesive layer 502. As shown in FIG. 20A, the silicon substrate 203 is patterned by means of the etching method using photolithography, to thus form the spacers 203S.

As shown in FIG. 20B, the glass substrate 201 having the trench sections 204 formed so as to reach the dummy plate 401 is caused to adhere to the spacers 203S by way of the adhesive layer 202.

After adhesion of the glass substrate 201 in this manner, the adhesive layer 502 is softened to remove the dummy plate 501. As shown in FIG. 20C, the sealing cover glass 200 with spacers is formed.

By means of this configuration, the only requirement is to soften the adhesive layer 402 at the time of separation by means of heating. Hence, separation can be attained very easily.

The bonding and separation processes are the same as those described in connection with the seventh through ninth embodiments.

Eighteenth Embodiment

An eighteenth embodiment of the present invention will now be described.

The first through seventeenth embodiments have described examples in which the spacers having a thickness of 0.1 mm are formed on a light-transmission substrate. However, eighteenth to twenty-second embodiments will describe examples in which spacers are provided on the solid-state imaging element substrate.

In the present embodiment, spacers 106S are formed integrally on the silicon substrate 101 constituting the solid-state imaging element substrate. In other respects, the present embodiment is formed in the same manner as the other embodiments.

Figure 21A:
FIGS. 21A to 21F are views showing processes for manufacturing a solid-state imaging device according to an eighteenth embodiment of the present invention.
Figure 21B:
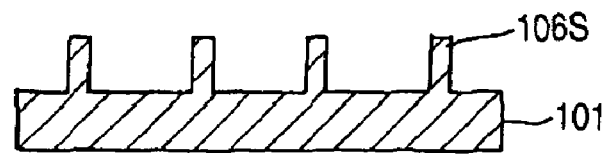

As shown in FIG. 21A, a resist pattern is formed on the surface of the silicon substrate 101 by means of photolithography. As shown in FIG. 21B, the indentation sections 105 are formed by means of selective etching while the resist pattern is taken as a mask, thereby forming the spacers 106S.

Figure 21C:
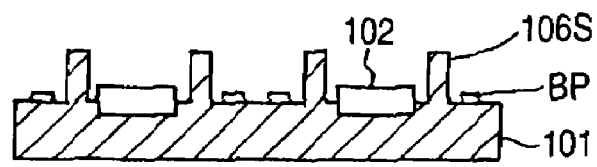

As shown in FIG. 21C, a channel stopper layer, a channel region, and the element region 102, such as a charge transfer electrode, are formed in the element formation region enclosed by the spacers 106S through use of ordinary silicon processes. Further, a wiring layer is also formed in the surface, and bonding pads BP to be used for establishing an external connection are formed from a gold layer.

Figure 21D:
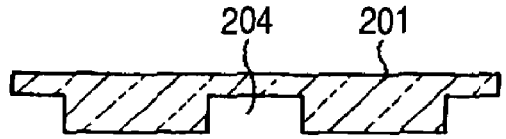
Figure 21E:
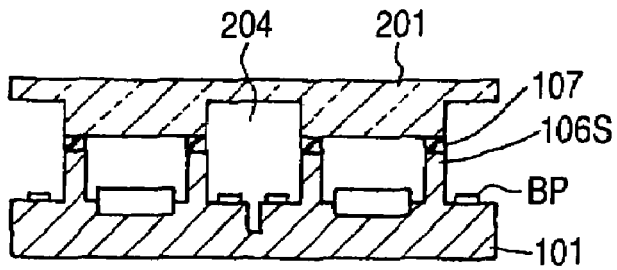

Subsequently, as shown in FIG. 21D, the glass substrate 201 in which the trench sections 204 is formed from low α-ray glass. As shown in FIG. 21E, the glass substrate 201 is positioned so as to oppose the surface of the solid-state imaging element substrate 100 where elements are formed, to thus integrate the glass substrate 201 and the solid-state imaging element substrate 100 together. At the time of integration, the glass substrate 201 and the solid-state imaging element substrate 100 are firmly integrated together by means of pressurization through use of the adhesive layer 107 of room temperature curing type applied over the surfaces of the spacers.

Figure 21F:
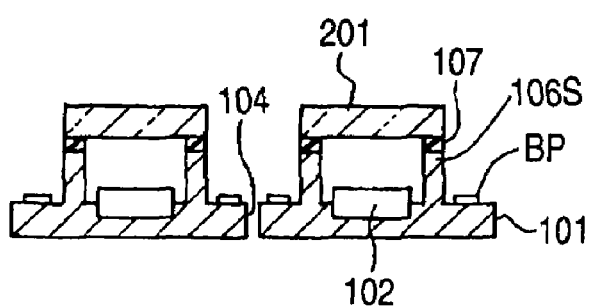

Finally, as shown in FIG. 21F, the glass substrate and the solid-state imaging element substrate are made thin by means of CMP, to thus enable separation of solid-state imaging elements. Here, the process for reducing a thickness is not limited to CMP but may be implemented by means of grinding, polishing, or etching.

When the trench sections 204 are not formed in the glass substrate, the solid-state imaging elements can be separated with superior operability by performing separation through dicing or laser. Moreover, when the slice grooves 104 are not formed in the silicon substrate, the solid-state imaging elements can be separated with superior operability by performing separation through use of a diamond blade.

According to this method, the spacers are formed integrally with the solid-state imaging element substrate, and hence highly-reliable solid-state imaging devices can be formed without involvement of occurrence of distortion in the bonded section.

Nineteenth Embodiment

A nineteenth embodiment of the present invention will now be described.

The eighteenth embodiment has described that the spacers having a thickness of 0.1 mm are formed integrally on the solid-state imaging element substrate. However, in the present embodiment, a silicon substrate 108 may be caused to adhere to the solid-state imaging element substrate by way of the adhesive layer 107, and the silicon substrate 108 may be formed as a pattern on the solid-state imaging element substrate. In other respects, the present embodiment is formed in the same manner as the eighteenth embodiment.

Figure 22A:
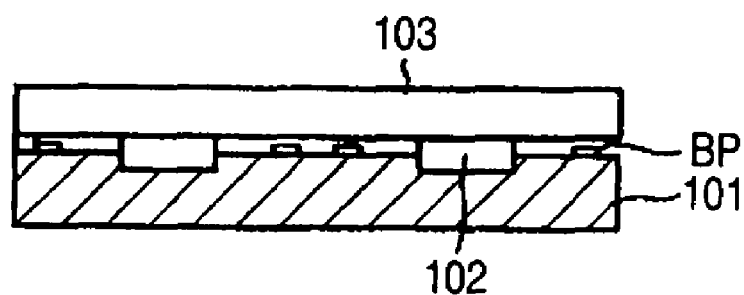
FIGS. 22A to 22C are views showing processes for manufacturing a solid-state imaging device according to a nineteenth embodiment of the present invention.
Figure 22B:
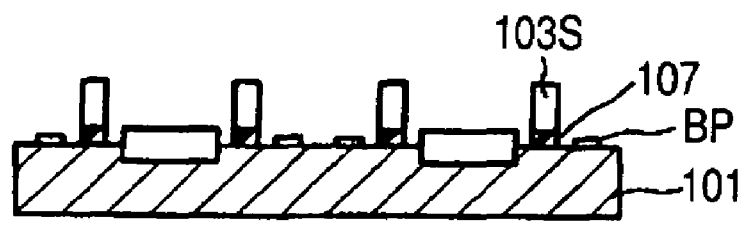
Figure 22C:
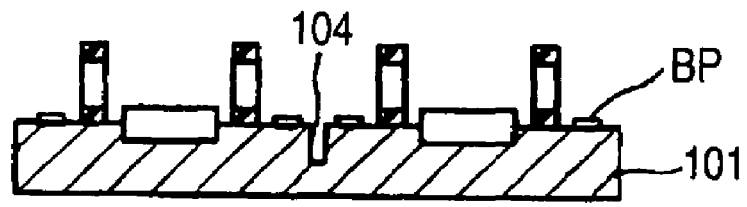

As shown in FIGS. 22A to 22C, in the present embodiment, a channel stopper layer, a channel region, and the element region, such as a charge transfer electrode, are formed through use of ordinary silicon processes. Further, a wiring layer is also formed in the surface, and bonding pads BP to be used for establishing an external connection are formed from a gold layer.

As shown in FIG. 22A, the silicon substrate 103 is caused to adhere to the solid-state imaging element substrate by way of an adhesive layer 107.

Subsequently, as shown in FIG. 22B, the silicon substrate 103 is selectively removed by means of the etching method using photolithography, thereby forming spacers 103S.

As shown in FIG. 22C, an adhesive layer 109 is applied over the spacers 103S, thereby forming the slice grooves 104.

According to the method, the spacers are formed after the element regions have been formed on the silicon substrate. Hence, the spacers will not interrupt formation of the element regions, thus facilitating manufacturing operation. Since the spacers are not formed integrally, a problem of occurrence of slight distortion is inevitably raised.

The bonding and separation processes are the same as those described in connection with the previous embodiments.

Twentieth Embodiment

A twentieth embodiment of the present invention will now be described.

The nineteenth embodiment has described that the spacers 103 having a thickness of 0.1 mm are formed by means of causing the silicon substrate 108 to adhere to the solid-state imaging element substrate by way of the adhesive layer 107 and etching the silicon substrate on the solid-state imaging element substrate. In the present embodiment, the spacers 103 may be formed on a dummy substrate through use of a dummy substrate 601, and the spacers may be caused to adhere to the silicon substrate 101 having the solid-state imaging elements formed therein; that is, a substrate to be used for forming solid-state imaging elements. In other respects, the present embodiment is formed in the same manner as the nineteenth embodiment.

Figure 23A:
FIGS. 23A to 23D are views showing processes for manufacturing a solid-state imaging device according to a twentieth embodiment of the present invention.

Specifically, as shown in FIG. 23A, the silicon substrate 103 which is to become spacers is caused to adhere to the dummy plate 601 made of a silicon substrate by way of an adhesive layer 602 having a softening temperature of 50° C. to 150° C. or thereabouts. The silicon substrate 103 is selectively removed by means of the etching method using photolithography, to thus form the spacers 103S.

Figure 23B:
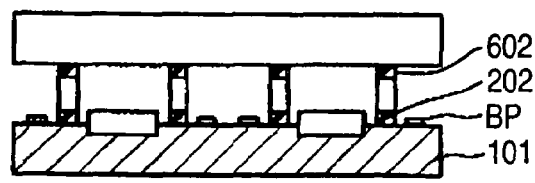
Figure 23C:
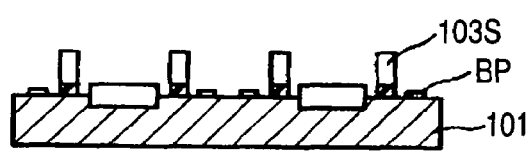

As shown in FIG. 23B, the silicon substrate 101 having the solid-state imaging elements formed therein is caused to adhere to the spacers 103S by way of the adhesive layer 202 having a softening temperature of 100 to 200° C. or thereabouts.

Figure 23D:
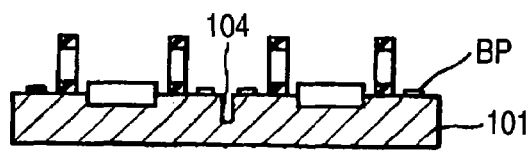

After adhesion of the silicon substrate 101 having the solid-state imaging elements formed therein, the adhesive layer 602 is heated to 50 to 150° C. or thereabouts and softened, to thus remove the dummy plate 601. As shown in FIG. 23D, the slice grooves 104 are then formed. The solid-state imaging element substrate 100 with spacers is formed in the same manner as shown in FIG. 22B.

The processes for bonding the glass substrate and the solid-state imaging element substrate together and separating the substrates are the same as those described in connection with the eighteenth embodiment.

The method obviates a necessity for processing spacers on the solid-state imaging element substrate. Hence, there can be prevented occurrence of a drop in yield, which would otherwise be caused by flaws in the solid-state imaging element substrate.

In the present embodiment, the slice grooves 104 are formed after formation of the spacers. However, needless to say, the slice grooves 104 may be formed before formation of the spacers.

In the embodiment, bonding of the glass substrate to the spacers and bonding of the silicon substrate constituting the solid-state imaging elements to the spacers are performed through use of adhesive layers. However, if they are bonded directly together at room temperature through surface activation, sturdy bonding can be attained.

In the first through twentieth embodiments (excluding the eleventh, twelfth, and fifteenth embodiments), the silicon substrate is used for spacers. However, the spacers are not limited to the silicon substrate, and a 42 alloy whose thermal expansion coefficient is close to that of the solid-state imaging element is also applicable. Alternatively, material whose thermal expansion coefficient is close to that of the light-transmission substrate may also be employed. Moreover, polyimide resin may also be used. In this case, the spacers become flexible, and there is yielded a distortion absorption effect for countering occurrence of distortion due to temperature changes.

Further, the spacers may be formed through use of an adhesive tape. In this case, after adhesion of the adhesive tape over the entire substrate, the tape is cut by means of laser machining or the like, whereby high-precision machining becomes possible.

In the first through twentieth embodiments, the silicon substrate or the glass substrate is used when the dummy plate is employed. However, the invention is not limited to these embodiments, and a metal plate is also usable. Further, a flexible film may also be employed.

Semi-curing resin, UV curing resin, UV/thermosetting combined-type resin, or thermosetting resin can also be applied to the adhesive layer.

In addition, a transfer method, screen printing, or a dispense method can be selected as the method for forming the adhesive layer, as required.

In the eighteenth to twentieth embodiments, the slice grooves are formed before formation of the spacers. However, needless to say, the slice grooves maybe formed after formation of the spacers.

Twenty-First Embodiment

A solid-state imaging device equipped with a reinforcing plate will now be described as a twenty-first embodiment of the present invention.

Figure 24:
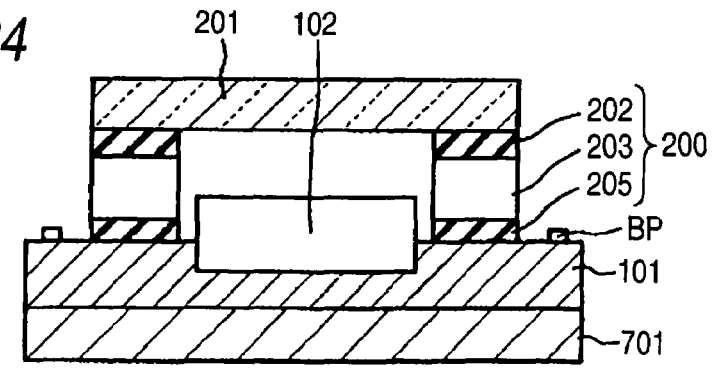
FIG. 24 is a view showing processes for manufacturing a solid-state imaging device according to a twenty-first embodiment of the present invention.

As shown in FIG. 24, the solid-state imaging device is characterized in that a reinforcing plate 701 made of a silicon substrate is caused to adhere to the back of the silicon substrate 101 constituting the solid-state imaging element substrate 100 of the solid-state imaging device of the first embodiment, by way of a silicon oxide film (not shown). Here, the reinforcing plate 701 hose surface is covered with a silicon oxide film and which is made of a silicon substrate is bonded directly to the solid-state imaging element substrate by means of surface activation room temperature bonding. Even in this case, a distance from the surface of the solid-state imaging element substrate to the surface of the sealing cover glass is 0.6 mm or thereabouts.

The solid-state imaging device of this embodiment is identical in element configuration with that described in connection with the first embodiment but is characterized in that the back of the silicon substrate is reduced to one-half by means of a CMP method or the like; and in that, in order to compensate for a decrease in the strength of the silicon substrate, the reinforcing plate 701 is bonded to the back of the silicon substrate.

This configuration enables a reduction in the thickness of the solid-state imaging element substrate 100, an increase in drive speed, and compensation of a decrease in strength attributable to a reduction in thickness, through use of the reinforcing plate. Further, a moisture-proof characteristic is also improved.

Processes for manufacturing the solid-state imaging device will now be described.

Figure 25A:
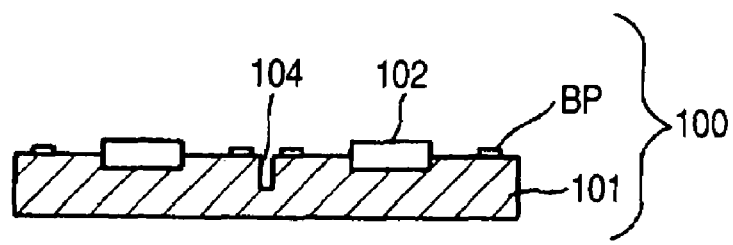
FIGS. 25A to 25E are views showing processes for manufacturing a solid-state imaging device according to a twenty-first embodiment of the present invention.

Processes up to the process for causing the glass substrate made of low α-ray glass to adhere to the solid-state imaging element substrate are basically the same as those described in connection with the first embodiment. Specifically, as shown in FIG. 25A, an element region—where solid-state imaging elements are to be formed through use of ordinary silicon processes—is formed in the silicon substrate 101 in which the slice grooves 104 have been formed beforehand. A wiring layer is also formed in the surface, and bonding pads BP to be used for establishing an external connection are formed from a gold layer.

Figure 25B:
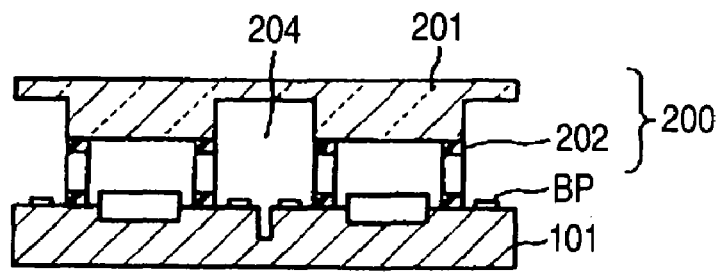

Subsequently, as shown in FIG. 25B, positioning is performed by means of alignment marks formed in the outer edges of the respective substrates, and the sealing cover glass 200 is placed on the solid-state imaging element substrate 100 in which the element region has been formed in the manner as mentioned previously. The solid-state imaging element substrate 100 and the sealing cover glass 200 are integrated together through pressurization by means of the adhesive layer 207 of room temperature curing type. Processing pertaining to this process may be performed through use of a surface activation room temperature bonding.

Figure 25C:
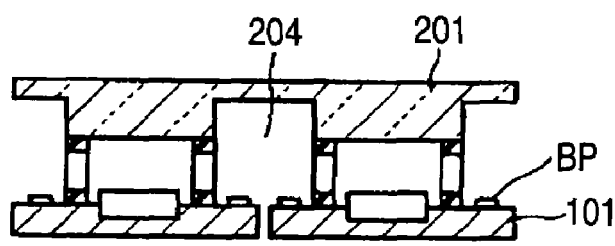

As shown in FIG. 25C, the silicon substrate 101 is polished from the back thereof, by means of the CMP method or the like in the same manner until the substrate is polished to the slice grooves 104 while the glass substrate is left exactly as is, thereby separating the solid-state imaging devices from each other.

Figure 25D:
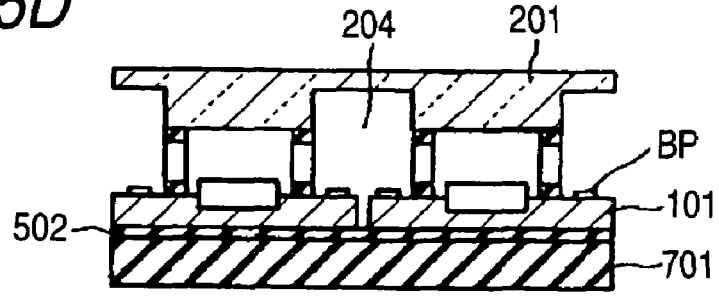
Figure 25E:
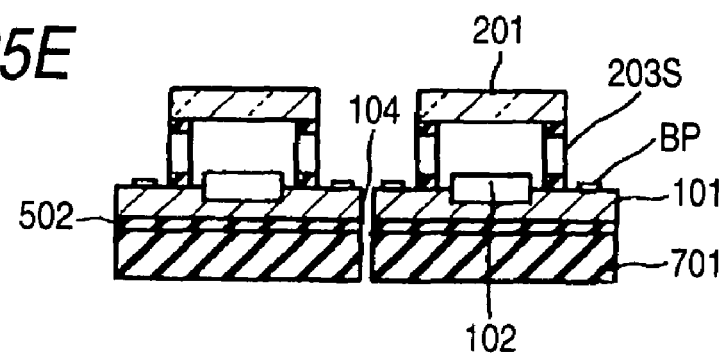

As shown in FIG. 25D, the reinforcing plate 701—whose surface is covered with a silicon oxide film (not shown) and which is made of a silicon substrate—is bonded directly to the back of the silicon substrate 101 whose thickness has been reduced, by means of surface activation room temperature bonding.

Finally, the back of the glass substrate 201 is removed to the trench sections 204, thereby reducing the thickness of the glass substrate 201 and separating the solid-state imaging elements apart from each other. Finally, the reinforcing plate is diced through use of a diamond plate (grindstone), thereby forming the solid-state imaging devices, each having the reinforcing plate.

As mentioned above, the solid-state imaging devices are formed very easily.

According to the method of the present invention, after the solid-state imaging elements have been mounted in a collective manner, the elements are separated from each other without involvement of electrical connections such as wire bonding. Therefore, manufacture of the solid-state imaging devices is easy, and the solid-state imaging devices are easy to handle. Moreover, the thickness of the silicon substrate is first reduced, to thus separate the solid-state imaging elements. After the reinforcing element has been caused to adhere to the silicon substrate, the reinforcing plate is diced. Therefore, high reliability is achieved.

Although the spacer formed on the glass substrate is used in the present embodiment, a spacer formed on the solid-state imaging element substrate or a separate spacer may also be applicable. In the present embodiment, the reinforcing plate is formed from a silicon substrate isolated from the solid-state imaging element substrate, thereby imparting heat insulation to the reinforcing plate. However, the reinforcing plate may be utilized as a heatsink through use of a substrate having superior thermal conductivity. In the present embodiment, a damp-proofing characteristic is enhanced. Moreover, the present invention is applicable even when no slice grooves 104 are provided.

Twenty-Second Embodiment

Figure 26:
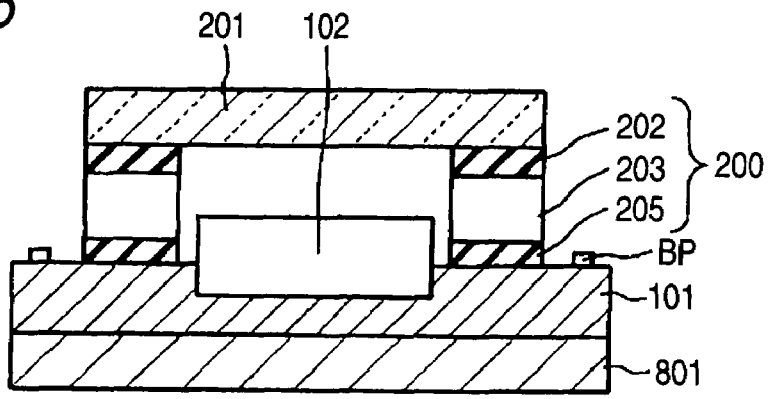
FIG. 26 is a view showing processes for manufacturing a solid-state imaging device according to a twenty-second embodiment of the present invention.

In a twenty-second embodiment of the present invention, as shown in FIG. 26, a metal substrate, such as tungsten or chromium, is caused to adhere in place of the reinforcing plate, thereby realizing a shield plate 801. In other respects, the present embodiment is formed in completely the same manner as are the other embodiments.

According to this configuration, an electromagnetic wave can be shielded, thereby enabling an attempt to reduce unwanted emission noise.

Twenty-Third Embodiment

A twenty-third embodiment of the present invention will now be described.

In the first through twenty-second embodiments, the bonding pads are formed on the surface of the solid-state imaging element substrate so as become exposed. The edge of the light-transmission substrate (i.e., the glass substrate made of low α-ray glass) 201 comes to the inside with reference to the edge of the solid-state imaging element substrate such that electrical connections become possible on the surface of the solid-state imaging element substrate. However, the present embodiment is characterized in that the solid-state imaging element substrate and the glass substrate are formed so as to have identical edges. As shown in FIG. 27C, the present embodiment is also characterized in extraction of signals from the back by way of through holes H formed so as to penetrate through the solid-state imaging element substrate 100 and the reinforcing plate 701 affixed to the back thereof. Reference numeral 108 designates a conductor layer; and 109 designates a silicon oxide layer serving as an insulation layer. The glass substrate 201 serving as a light-transmission member is bonded to the surface of the solid-state imaging element substrate 100 which has the solid-state imaging elements 102 formed thereon and is formed from the silicon substrate 101, the silicon substrate serving as a semiconductor substrate, by way of the spacer 203S having a thickness of 0.1 mm such that the gap C is provided so as to correspond to the light-receiving region of the silicon substrate 101. Signals are extracted from the back of the solid-state imaging element substrate 100 by means of the through holes H formed in the silicon substrate 101. The through hole constitutes a pad 113 and a bump 114, which act as external extraction terminals formed on the back of the solid-state imaging element substrate 100. The outer edge is separated into pieces by means of dicing, and an external connection is established by way of the bump 114. Here, as shown in FIG. 28D, the through hole is connected to a peripheral circuit substrate 901 by way of an anisotropic conductive film 115. In addition to this, diffusion bonding using ultrasonic waves, soldering, and eutectic bonding based on thermocompression bonding are also effective. Moreover, the clearances may be subjected to under-filling with resin. Here, the spacers 203S are set to a height of 30 to 150 μm, preferably a height of 80 to 120 μm. In other respects, the present embodiment is formed in the same manner as is the first embodiment.

FIGS. 27A to 27C and FIGS. 28A to 28D show processes for manufacturing the solid-state imaging device.

Figure 27A:
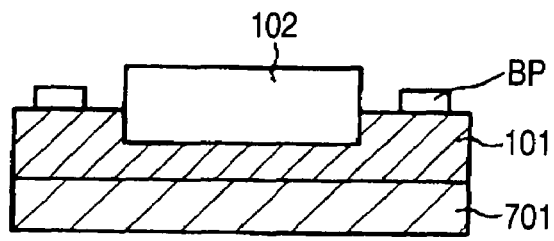
FIGS. 27A to 27C are views showing processes for manufacturing a solid-state imaging device according to a twenty-third embodiment of the present invention.

Specifically, according to the method, the reinforcing substrate 701, which is provided with a silicon oxide film (not shown) and formed from a silicon substrate, is bonded to the back of the solid-state imaging element substrate 100 by means of surface activation room temperature bonding, wherein the element region to be used for forming solid-state imaging elements and the bonding pads BP to be used for establishing external connections are formed through use of ordinary silicon processes in the same manner as in the processes shown in FIGS. 6A and 6B (FIG. 27A).

Figure 27B:
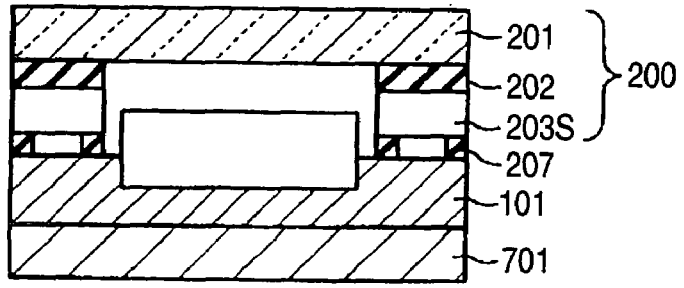
Figure 27C:
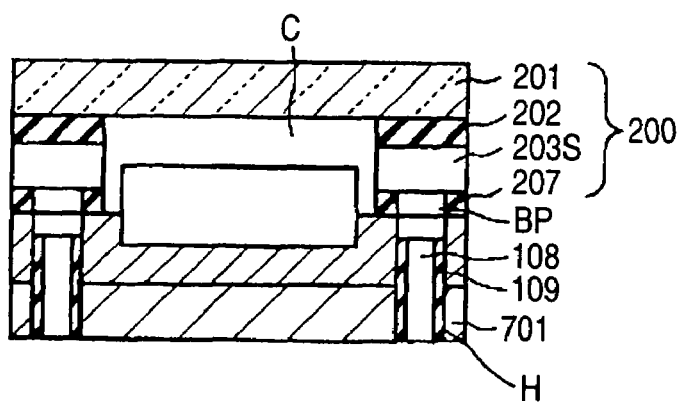

Subsequently, as shown in FIG. 27B, positioning is performed by means of the alignment marks formed in the outer edges of the respective substrates, and the sealing cover glass 200, in which the spacers 203S are bonded to the flat-plate-like glass substrate 201, is placed on the solid-state imaging element substrate 100 formed in the manner as mentioned previously. The solid-state imaging element substrate 100 and the sealing cover glass 200 are integrated together through pressurization by means of the adhesive layer 207 of room temperature curing type.

The through holes are formed from the back of the reinforcing plate 701 by the etching method using photolithography. The silicon oxide film 109 is formed within the through holes by means of the CVD method. Subsequently, the reinforcing plate is subjected to anisotropic etching such as RIE or ICP dry etching, to thus leave the silicon oxide film 109 on only the sidewalls of the through holes. As shown in FIG. 27C, the bonding pads BP are exposed.

Figure 28A:
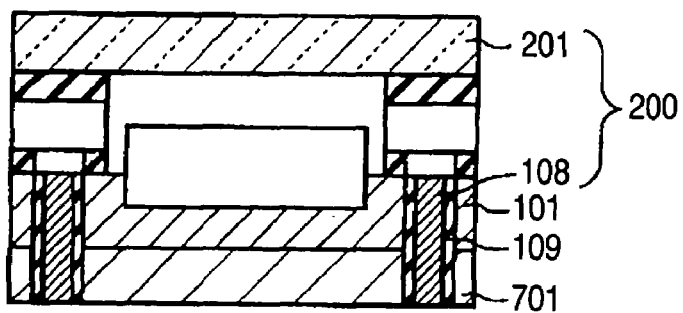
FIGS. 28A to 28D are views showing processes for manufacturing a solid-state imaging device according to a twenty-third embodiment of the present invention.

As shown in FIG. 28A, a tungsten film is formed within the through holes as the conductor layer 108, which comes into contact with the bonding pad, by means of the CVD method using $WF_6$.

Figure 28B:
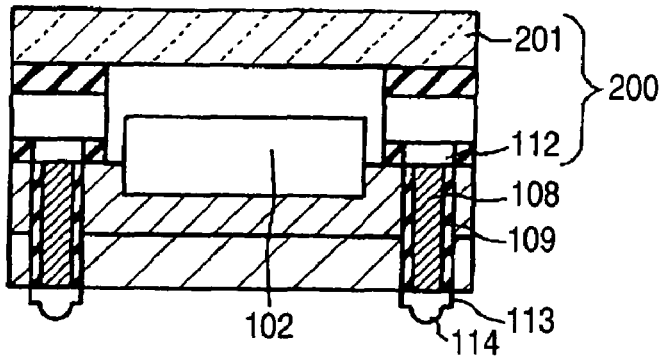

As shown in FIG. 28B, the bonding pads 113 as well as the bumps 114 are formed on the surface of the reinforcing plate 701.

In this way, signal extraction electrode terminals and energization electrode terminals are formed on the reinforcing plate 701.

Figure 28C:
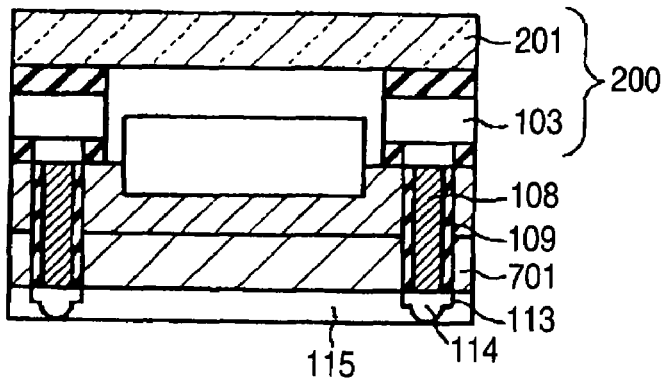
Figure 28D:
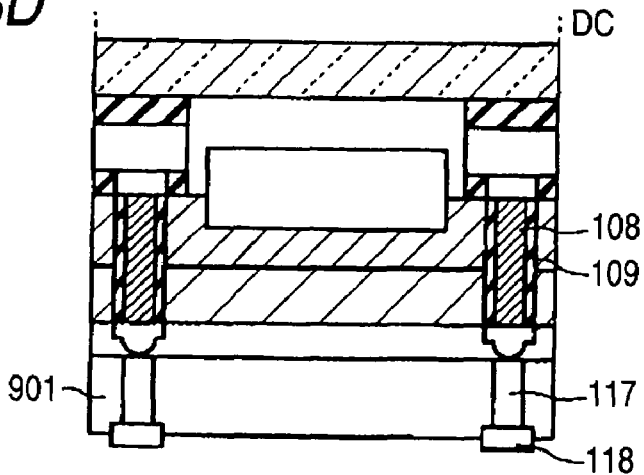

As shown in FIG. 28C, the anisotropic conductive film 115 (ACP) is applied over the surface of this reinforcing plate 701.

Finally, as shown in FIG. 28D, the circuit board 901 in which drive circuits are fabricated is connected to the reinforcing plate by way of the anisotropic conductive film 115. A contact layer 117 formed from a conductor layer charged in a through hole formed so as to penetrate through the circuit board and a bonding pad 118 are formed on the circuit board 901.

Accordingly, the circuit board 901 can be readily connected with a circuit board, such as a printed board, by way of the bonding pads 118. The contact layer 117 is formed while being aligned with the conductor layer 108 formed in the solid-state imaging element substrate.

Subsequently, the entirety of the wafer is diced along dicing lines DC, thereby separating the solid-state imaging devices from each other. (The drawings depict only one unit solid-state imaging device, but a plurality of solid-state imaging elements are continuously formed on one wafer.)

The solid-state imaging devices are formed very readily with superior workability.

The reinforcing plate 701 is formed from a silicon substrate on which a silicon oxide film is formed, and hence the solid-state imaging element substrate 100 can be thermally or electrically insulated.

In the embodiment, the conductor layer is formed within the through hole by means of the CVD method. However, a conductor layer can be readily charged into a contact hole having a high aspect ratio with superior workability even when a plating method, a vacuum screen printing method, or a vacuum suction method is employed.

Further, in the present embodiment, electrical connections are established on both the front and back of the circuit board having the solid-state imaging element substrate and the peripheral circuit, through use of the through holes. However, there can also be employed a method for forming contacts such that the front and back of the circuit board are electrically connected together by means of subjecting both the front and back surfaces of the circuit board to impurity diffusion.

The signal extraction electrode terminal and the energization electrode terminal can be formed on the reinforcing plate 701.

Twenty-Fourth Embodiment

A twenty-fourth embodiment of the present invention will now be described.

In the twenty-third embodiment, the through-hole is formed so as to penetrate through the reinforcing plate 701, and the conductor layer 111 is formed. However, in the present embodiment, the solid-state imaging element substrate is formed through use of a silicon substrate in which holes (vertical holes) have been formed beforehand. As a result, the only requirement is to form the vertical holes to a shallow depth, and hence productivity is enhanced. Further, an attempt can be made to improve a production yield. In other respects, the present embodiment is formed in the same manner as the twenty-third embodiment.

Figure 29A:
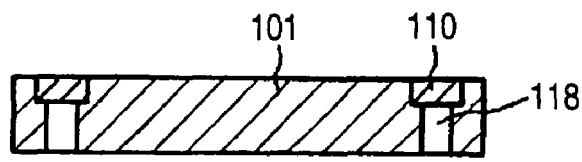
FIGS. 29A to 29E are views showing processes for manufacturing a solid-state imaging device according to a twenty-fourth embodiment of the present invention.

Specifically, as shown in FIG. 29A, prior to formation of solid-state imaging elements, a resist pattern is formed on the back of the silicon substrate by means of photolithography. The silicon substrate is also subjected to RIE (reactive ion etching) while the resist pattern is taken as a mask, to thus form vertical holes 118. Pads 110 made of aluminum or the like have been formed beforehand on the surface of the silicon substrate in this process, and the vertical holes 118 are then formed so as to reach the pads.

Figure 29B:
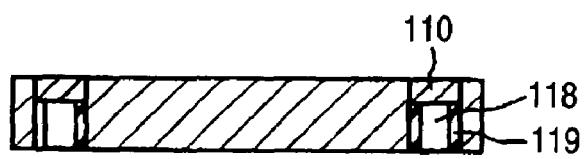

As shown in FIG. 29B, a silicon oxide film 119 is formed on the interior wall of the vertical hole by means of the CVD method.

Figure 29C:
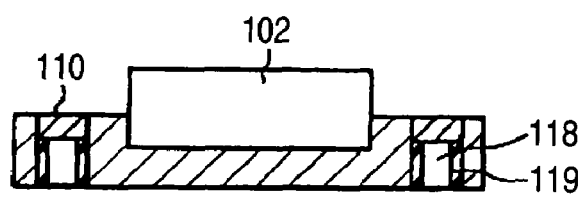

As shown in FIG. 29C, the element region to be used for fabricating the solid-state imaging elements is formed through use of an ordinary silicon process in the same manner as in the respective embodiments.

Figure 29D:
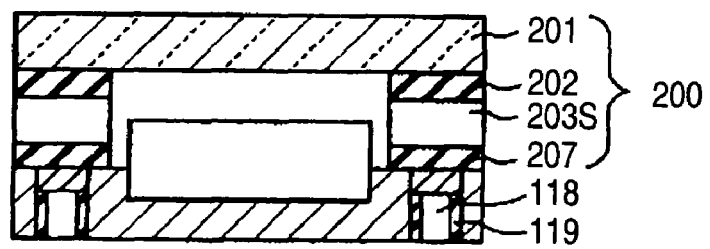

As shown in FIG. 29D, positioning is performed by means of alignment marks formed in the outer edge of each substrate, and the sealing cover glass 200, in which the spacers 203S having a thickness of 0.1 mm are bonded to the plate-like glass substrate 201, is placed on the solid-state imaging element substrate 100 formed in the manner mentioned previously. The solid-state imaging element substrate 100 and the sealing cover glass 200 are integrated together through pressurization by means of the adhesive layer 207 of room temperature curing type. Even in this case, processing pertaining to this process may be performed through use of surface activation room temperature bonding.

Figure 29E:
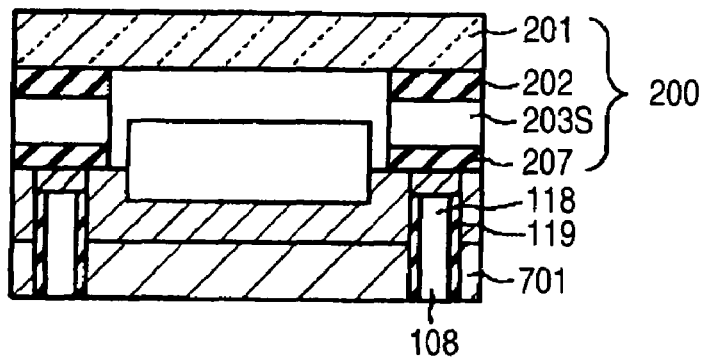

As shown in FIG. 29E, the reinforcing plate 701 is bonded to the back of this solid-state imaging element substrate 100 by means of surface activation room temperature bonding. The through holes 108 are formed in the back of the solid-state imaging element substrate so as to reach the vertical holes 119, by means of the etching method using photolithography. Even in this case, the interior walls of the through holes are desirably insulated beforehand. Further, the reinforcing plate in which the through holes have been formed beforehand may also be used.

Subsequently, processing pertaining to the processes shown in FIGS. 28A to 28D, which has been described in connection with the twenty-third embodiment, is performed, whereby a solid-state imaging device, in which substrates are laminated on the circuit board having peripheral circuits formed therein, is readily formed.

As mentioned previously, in the present embodiment, the only requirement is to form the vertical holes to a shallow depth, and hence productivity is enhanced. Further, an attempt can be made to improve a manufacturing yield.

Twenty-Fifth Embodiment

A twenty-fifth embodiment of the present invention will now be described.

Figure 30A:
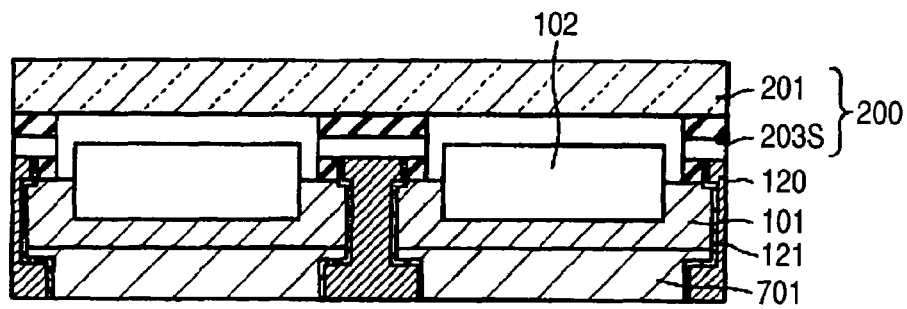
FIGS. 30A and 30B are views showing processes for manufacturing a solid-state imaging device according to a twenty-fifth embodiment of the present invention.
Figure 30B:
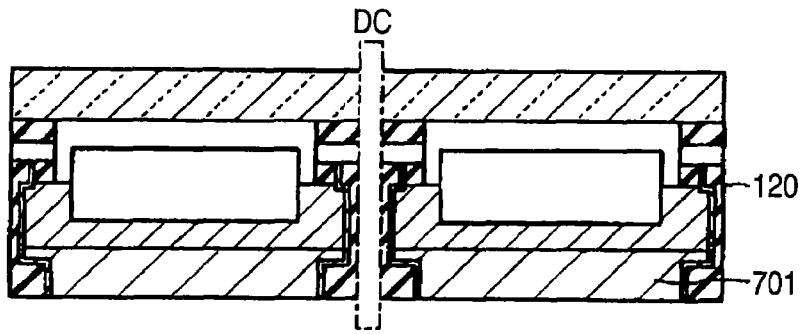

In the twenty-fourth embodiment, the contacts are formed so as to penetrate through the reinforcing plate 701, the solid-state imaging element substrate, and the circuit board, and signals are extracted from the electrodes provided on the circuit board. However, as shown in FIGS. 30A and 30B, the present embodiment is characterized in that a conductor layer 120 serving as a wiring layer is formed on the sidewall and in that a signal is extracted from the electrode on the sidewall of the solid-state imaging device. In other respects, the present embodiment is formed in the same manner as the twenty-fourth embodiment.

The manufacturing processes are also performed in the same manner as in the twenty-fourth embodiment. However, the through holes are formed such that positions of the through holes correspond to the ends of the respective solid-state imaging devices. The wafer is diced along the dicing lines DC including the through holes, thereby easily forming the solid-state imaging devices in which the wiring layer is formed on the sidewall.

The conductor layer 120 to be charged into the through hole is formed from a light-shielding material such as tungsten. As a result, the solid-state imaging device is shielded from light, although not perfectly, and hence an attempt can be made to reduce the chance of a faulty operation.

If the reinforcing plate is constituted of polyimide resin, ceramic, crystallized glass, and a silicon substrate whose front and back surfaces are oxidized, as required, the reinforcing plate can perform the role of a heat-insulating substrate. Alternatively, the reinforcing plate may be formed from sealing or light-shielding material having a damp-proofing characteristic.

Twenty-Sixth Embodiment

A twenty-sixth embodiment of the present invention will now be described.

Figure 31:
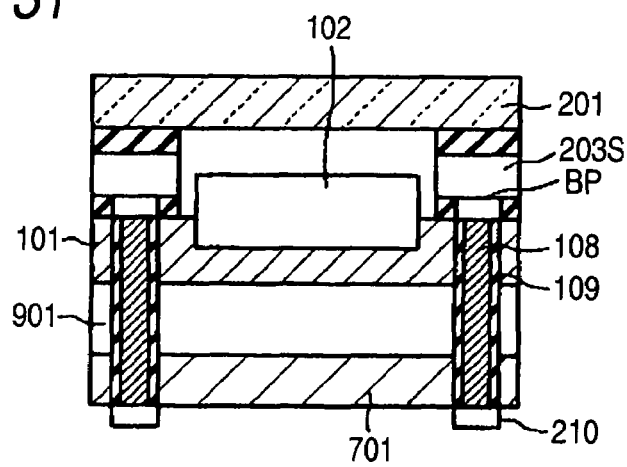
FIG. 31 is a view showing processes for manufacturing a solid-state imaging device according to a twenty-sixth embodiment of the present invention.

As shown in FIG. 28, in the twenty-third and twenty-fourth embodiments the back of the solid-state imaging element substrate 100 is stacked on a peripheral circuit board by way of the reinforcing plate. However, in the present embodiment, as shown in FIG. 31, the solid-state imaging element substrate 100 is stacked on the peripheral circuit board 901, and the reinforcing plate 701 is sequentially stacked on the back of the peripheral circuit board. In other respects, the present embodiment is formed in the same manner as the twenty-fourth or twenty-fifth embodiment.

This reinforcing plate doubles as a heatsink.

The manufacturing processes are also performed in the same manner as in the twenty-third and twenty-fourth embodiments. However, the solid-state imaging element substrate 100 and the peripheral circuit board 901 are located close to each other, and hence connection resistance is reduced correspondingly, thereby enabling high-speed operation.

Twenty-Seventh Embodiment

A twenty-seventh embodiment of the present invention will now be described.

Figure 32:
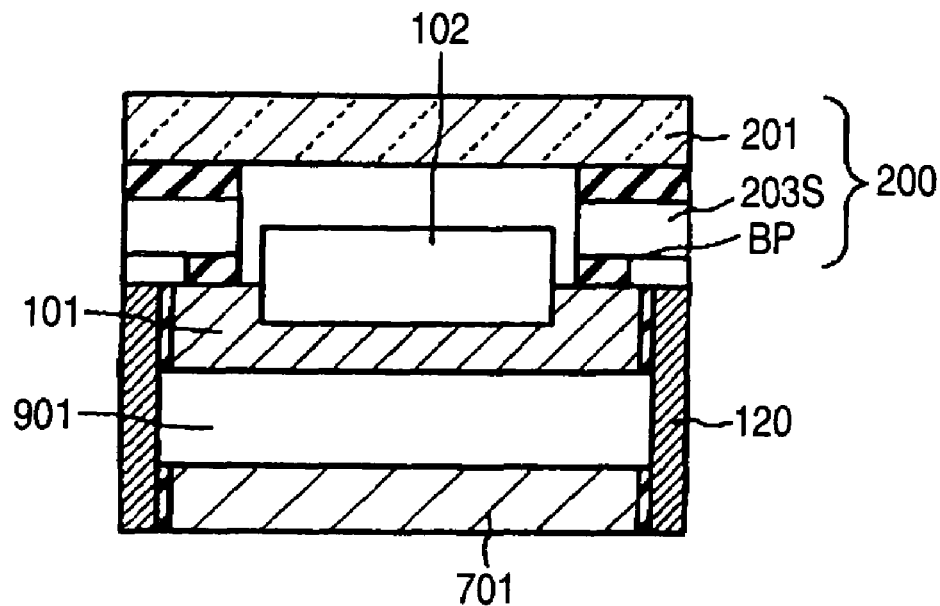
FIG. 32 is a view showing processes for manufacturing a solid-state imaging device according to a twenty-seventh embodiment of the present invention.

In the twenty-sixth embodiment, the through holes are formed in the substrate, and signals are extracted from the electrodes provided on the back of the peripheral circuit board. However, as shown in FIG. 32, the present embodiment is characterized in that the conductor layer 120 serving as a wiring layer is formed on the sidewall by way of an insulation film 121. In other respects, the present embodiment is formed in the same manner as the twenty-sixth embodiment.

Manufacturing operation is performed in substantially the same manner as in the twenty-fifth embodiment. However, a solid-state imaging device, in which a wiring pattern is formed on a sidewall, can be readily formed by means of merely setting a dicing line at a position including a contact formed in the through hole.

In this solid-state imaging device, the wiring pattern is formed on the sidewall, and hence a signal extraction terminal and a current supply terminal can also be formed on the sidewall. Needless to say, connection may be established by means of forming pads and bumps on the back of the peripheral circuit board 901. Reference numeral 701 designates a reinforcing plate.

In the twenty-first through twenty-seventh embodiments, the sealing cover glass 200 made of low α-ray glass can be formed in the same manner as in the manufacturing methods described in connection with the first through twentieth embodiments.

Twenty-Eighth Embodiment

A twenty-eighth embodiment of the present embodiment will now be described.

Figure 33:
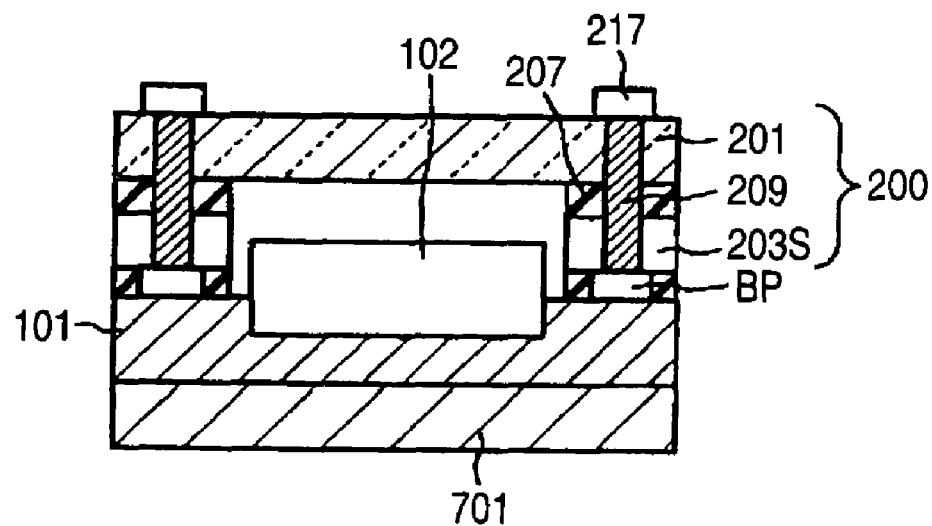
FIG. 33 is a view showing processes for manufacturing a solid-state imaging device according to a twenty-eighth embodiment of the present invention.

In the twenty-third embodiment, the through holes are formed within the substrate, and signals are extracted from the electrodes provided on the back of the peripheral circuit board. As shown in FIG. 33, the present embodiment is characterized in that the conductor layer 209 is formed in the through-hole 208, which is formed in the glass substrate 201 made of low α-ray glass and in the spacer 203S having a thickness of 0.1 mm; in that a pad 217 is formed on the upper surface of the glass substrate; and in that the signal extraction terminal and the current supply terminal are formed on the surface of the glass substrate. In other respects, the present embodiment is formed in the same manner as the twenty-third embodiment shown in FIGS. 27 and 28.

Processes for manufacturing the solid-state imaging device will now be shown in FIGS. 34A to 34E and FIGS. 35A to 35E.

In the twenty-third embodiment, the through holes are formed in the solid-state imaging element substrate 100 during the process shown in FIG. 27C, and the signal extraction terminals and the current supply terminals are formed on the back of the solid-state imaging element substrate. This method is characterized in that the spacer 203S is caused to adhere to the glass substrate 201 constituting the sealing cover glass 200; in that, in this state, the through holes 208 are formed so as to penetrate through the spacer and the glass substrate; in that conductor layers are formed in the through holes 208; and in that the signal extraction terminals and the current supply terminals are formed on the surface of the sealing cover glass.

Figure 34A:
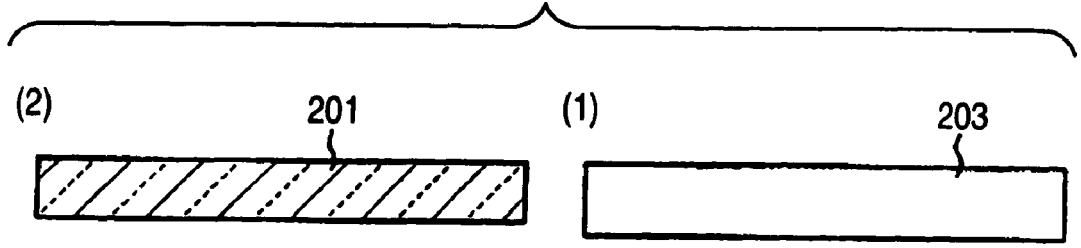
FIGS. 34A to 34E are views showing processes for manufacturing the solid-state imaging device according to the twenty-eighth embodiment of the present invention.

As shown in (1) of FIG. 34A, the silicon substrate 203 from which a spacer is to be formed and which has a thickness of 30 to 120 μm is first prepared.

Next, as shown in (2) of FIG. 34A, the glass substrate 201 to be used for constituting the sealing cover glass 200 is prepared.

Figure 34B:
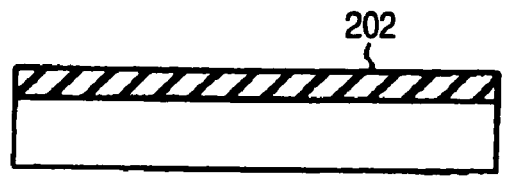

As shown in FIG. 34B, the adhesive layer 202 is applied over the surface of the substrate 203.

Figure 34C:
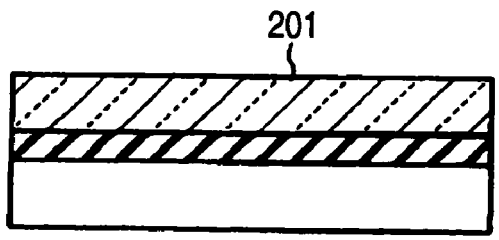

Subsequently, as shown in FIG. 34C, the silicon substrate 203 covered with the adhesive layer 202 is caused to adhere to the surface of the glass substrate 201.

Figure 34D:
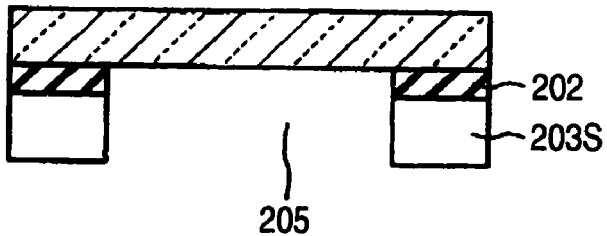

As shown in FIG. 34D, a resist pattern is formed by means of photolithography. The silicon substrate is also subjected to RIE (reactive ion etching) while the resist pattern is taken as a mask. An adhesive has been applied beforehand over the region corresponding to photodiodes; that is, an area corresponding to the light-receiving regions (designated by 40 in FIG. 1B), so as to exclude the indentation sections 205. Alternatively, the silicon substrate is subjected to removal processing through use of oxygen plasma after having undergone RIE.

Figure 34E:
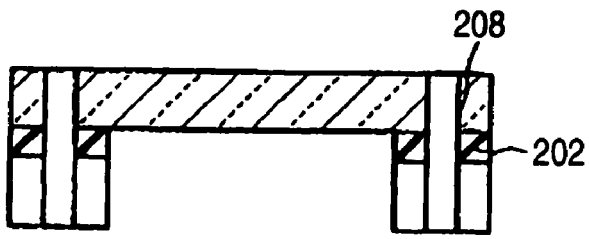

As shown in FIG. 34E, a resist pattern is formed by means of photolithography. The silicon substrate is also subjected to RIE (reactive ion etching) while the resist pattern is taken as a mask, to thus form the through holes 208 so as to penetrate through the spacer 203S and the glass substrate 201.

A silicon oxide film (not shown) is formed on the interior wall of the spacer formed from silicon by means of at least CVD, as required.

When the spacer is formed from an insulator, such as glass or resin, this process becomes unnecessary. A light-shielding film may be formed on the interior wall or exterior wall of the spacer.

Figure 35A:
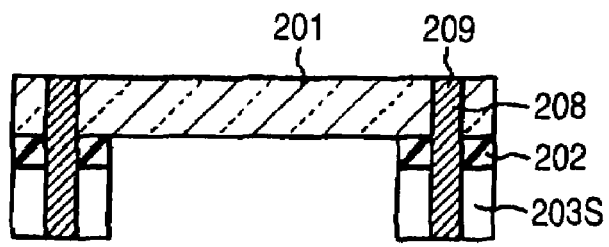
FIGS. 35A to 35E are views showing processes for manufacturing the solid-state imaging device according to the twenty-eighth embodiment of the present invention.

As shown in FIG. 35A, the conductor layer 209 is formed on the insulated interior wall of the through hole by means of vacuum screen printing or metal plating using conductive paste, such as silver paste or copper paste, to thus form a through contact region which penetrates through the spacer 203S and the glass substrate 201.

Figure 35B:
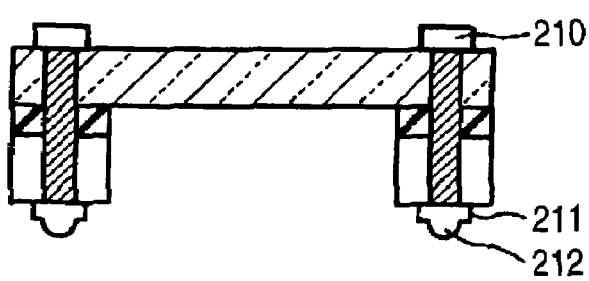

As shown in FIG. 35B, gold bonding pads 210, 211 or the bumps 212 are formed on the front and back of the glass substrate with the spacer so as to connect with the through contact region. A thin gold film is formed on the front and back of the glass substrate at the time of formation of a film, and the substrate is patterned by means of the etching method using photolithography. Screen printing or selective plating can also be applied to the patterning.

Figure 35C:
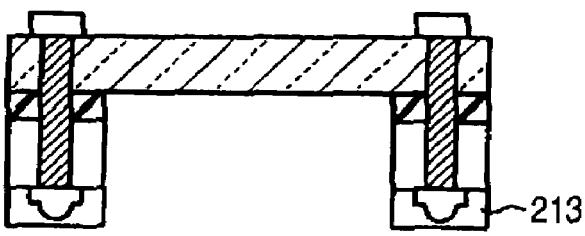

As shown in FIG. 35C, an anisotropic conductive resin film 213 is applied over the bump and the pad.

Figure 35D:
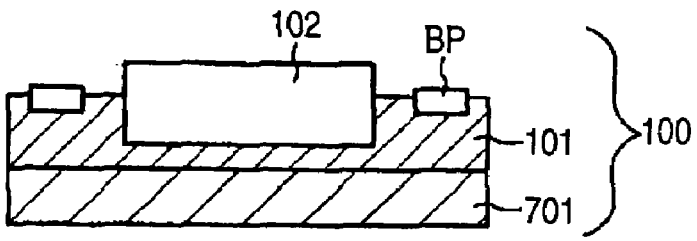

As shown in FIG. 35D, the solid-state imaging element substrate 100 in which the reinforcing plate 701 is formed is prepared in the same manner as in the twenty-third embodiment (see FIG. 27A).

Figure 35E:
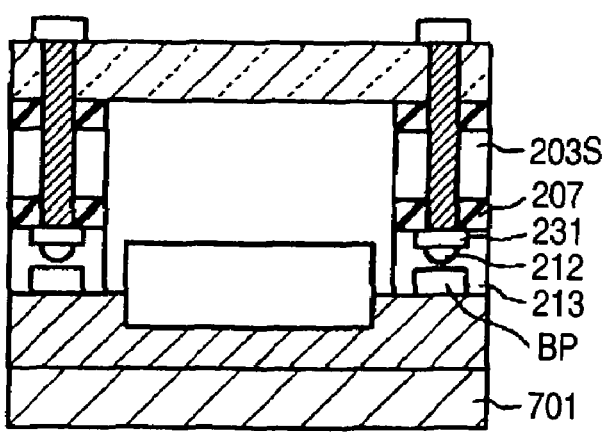

As shown in FIG. 35E, positioning is performed by means of the alignment marks formed in the outer edges of the respective substrates, and the sealing cover glass 200, in which the spacers 203S are bonded to the flat-plate-like glass substrate 201, is placed on the solid-state imaging element substrate 100 formed in the manner mentioned previously. The solid-state imaging element substrate 100 and the sealing cover glass 200 are integrated together by means of the anisotropic conductive film 213.

Subsequently, the entirety of the wafer is diced along the dicing lines DC, to thereby separate the solid-state imaging devices apart from each other.

In this way, the solid-state imaging device can be formed very easily with superior operability, wherein the contact region, such as bonding pads, is formed on the sealing cover glass.

Twenty-Ninth Embodiment

A twenty-ninth embodiment of the present invention will now be described.

The twenty-eighth embodiment has described the solid-state imaging device, wherein the through holes that penetrate through the glass substrate made of low α-ray glass and the spacer having a thickness of 0.1 mm are formed, and wherein the contact region, such as bonding pads, is formed on the sealing cover glass. However, thirtieth to thirty-third embodiments will describe modifications of this embodiment.

Figure 36A:
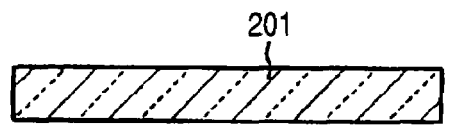
FIGS. 36A to 36C are views showing processes for manufacturing a solid-state imaging device according to a twenty-ninth embodiment of the present invention.

The present embodiment is characterized by forming the through holes in the spacer. As shown in FIG. 36A, the glass substrate 201 is prepared.

Figure 36B:
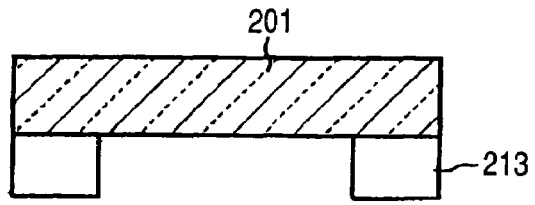

As shown in FIG. 36B, photocuring resin is formed on the surface of the glass substrate 201 by means of an optical molding method, to thus form a spacer 213.

Figure 36C:
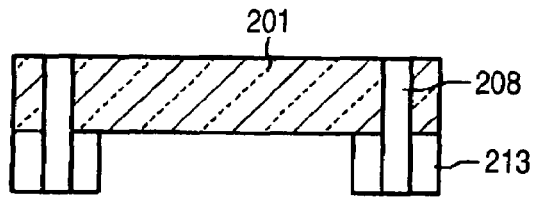

Subsequently, as shown in FIG. 36C, the through holes 208 are formed by means of the etching method using photolithography.

As mentioned above, the sealing cover glass which has the spacer and in which the through holes are formed can be readily obtained.

Processing pertaining to the mounting processes shown in FIGS. 35A to 35E is performed in the same manner as described in connection with the twenty-eighth embodiment. The sealing cover glass is caused to adhere to the solid-state imaging element substrate, and the wafer is diced. As a result, solid-state imaging devices shown in FIG. 35E can be formed.

By means of this method, the spacer is formed readily. Although the photocuring resin has been employed in the embodiment, an adhesive itself may be employed. The glass substrate and the spacer are formed integrally, thereby diminishing warpage or distortion and facilitating manufacturing operation.

Thirtieth Embodiment

A thirtieth embodiment of the present invention will now be described.

In the twenty-eighth embodiment, the silicon substrate for use in forming a spacer is caused to adhere to the glass substrate made of low α-ray glass, and the wafer is patterned. However, in the present embodiment, the glass substrate is etched during a single etching process, and indentation sections and through holes may be formed simultaneously. In other respects, the present embodiment is formed in the same manner as in the twenty-eighth embodiment.

Figure 37A:
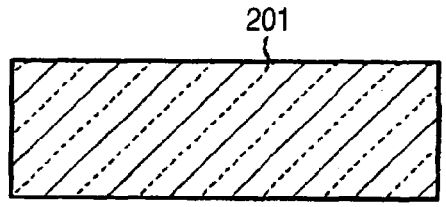
FIGS. 37A to 37C are views showing processes for manufacturing a solid-state imaging device according to a thirtieth embodiment of the present invention.

As shown in FIG. 37A, the glass substrate 201 is prepared in the present embodiment.

Figure 37B:
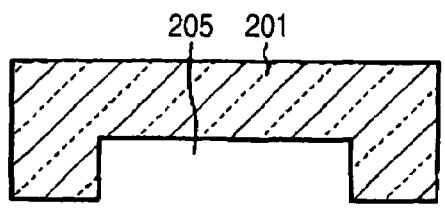

As shown in FIG. 37B, the resist pattern is formed on the front and back of the glass substrate 201. Openings are provided in the areas on both front and back surfaces of the glass substrate, where the through holes are to be formed, and openings are provided only in the back of the indentation sections 205 and the back of the area where the slice grooves 204 are to be formed, as required.

Figure 37C:
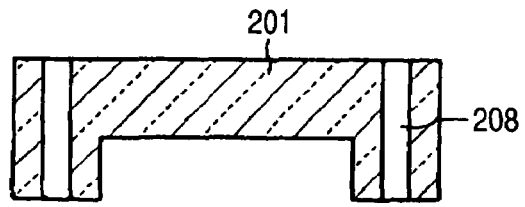

As shown in FIG. 37C, both surfaces of the glass substrate are etched while the resist patterns provided on both sides are taken as masks, to thus simultaneously form the indentation sections 205, the slice grooves (not shown), and the through holes 208.

As mentioned above, the spacer having a thickness of 0.1 mm is formed integrally, and the sealing cover glass having the through holes formed therein can be obtained.

Subsequently, processing pertaining to the mounting processes shown in FIGS. 35A to 35E in the same manner as described in connection with the twenty-eighth embodiment. The sealing cover glass is caused to adhere to the solid-state imaging element substrate, and the wafer is diced. As a result, the solid-state imaging device shown in FIG. 35E can be obtained.

The glass substrate and the spacer are formed integrally, whereby warpage and distortion can be diminished, and manufacturing operation is also facilitated.

Thirty-First Embodiment

A thirty-first embodiment of the present invention will now be described.

In the twenty-eighth embodiment, the silicon substrate for use in forming a spacer is caused to adhere to the glass substrate made of low α-ray glass, and the wafer is patterned. However, in the present embodiment, the spacer 203S in which the pattern has already been formed and which has a thickness of 0.1 mm is caused to adhere to the glass substrate 201, and the through holes are finally formed during the etching process. In other respects, the present embodiment is formed in the same manner as the twenty-eighth embodiment.

In the present embodiment, as shown in (1) of FIG. 38A, the glass substrate 201 is prepared. As shown in (2) of FIG. 38A, the silicon substrate 203 for use in forming a spacer is prepared.

As shown in FIG. 38B, the silicon substrate 203 is processed by means of the etching method using photolithography, thereby producing the spacer 203S.

As shown in FIG. 38C, the adhesive 202 is applied over the surface of the thus-patterned spacer.

As shown in FIG. 38D, the spacer 203S is caused to adhere to the glass substrate 201.

As shown in FIG. 38E, the through holes 208 are formed by means of the etching method using photolithography.

As mentioned above, the spacer is caused to adhere to the glass substrate readily, and the sealing cover glass having the through holes formed therein can be readily obtained.

A silicon oxide film (not shown) is formed on the interior wall of the spacer formed from silicon by means of at least CVD, as required.

When the spacer is formed from an insulator, such as glass or resin, this process becomes unnecessary. A light-shielding film may be formed on the interior wall or exterior wall of the spacer. Subsequently, processing pertaining to the mounting processes shown in FIGS. 35A to 35E is performed in the same manner as described in connection with the twenty-eighth embodiment. The sealing cover glass is caused to adhere to the solid-state imaging element substrate, and the wafer is diced. As a result, the solid-state imaging device shown in FIG. 35E can be obtained.

When the spacer is caused to adhere to the glass substrate, adhesion may be performed through use of UV-radiation curing resin, thermosetting resin, a combination thereof, or application of a semi-curing-type adhesive, within a range in which there does not arise warpage in the wafer due to a difference in thermal expansion coefficient, a reduction in reliability stemming from application of thermal stress on the solid-state imaging elements, or a failure in fastening of a wafer in a subsequent process. At the time of formation of the adhesive, supply of the adhesive through use of a dispenser, screen printing, or stamping transfer can be selected, as required.

As shown in FIG. 38c, a light-shielding film 215 may have been formed beforehand on the interior walls of indentation sections of the spacer by means of a method for sputtering a tungsten film.

As a result, a superior image capturing characteristic can be obtained without involvement of provision of an additional light-shielding film Thirty-Second Embodiment A thirty-second embodiment of the present invention will now be described.

Figure 39A:
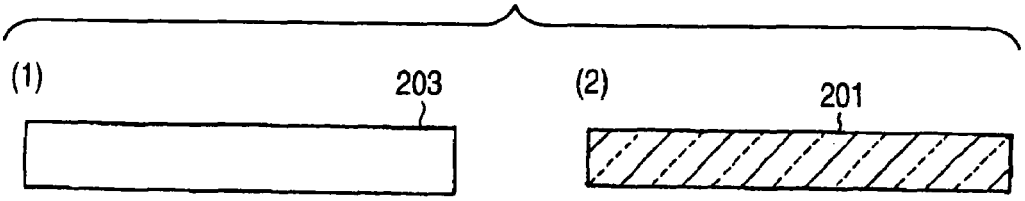
FIGS. 39A to 39F are views showing processes for manufacturing a solid-state imaging device according to a thirty-second embodiment of the present invention.
Figure 39B:
Figure 39C:
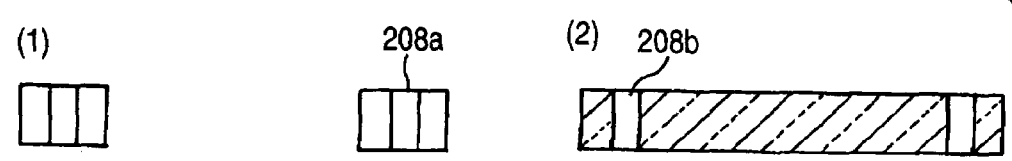
Figure 39D:
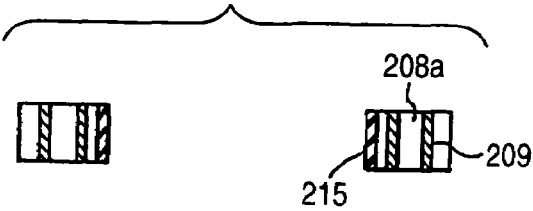
Figure 39E:
Figure 39F:
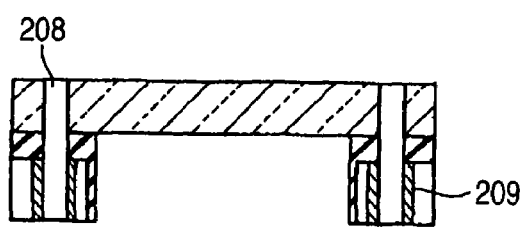
Figure 40A:
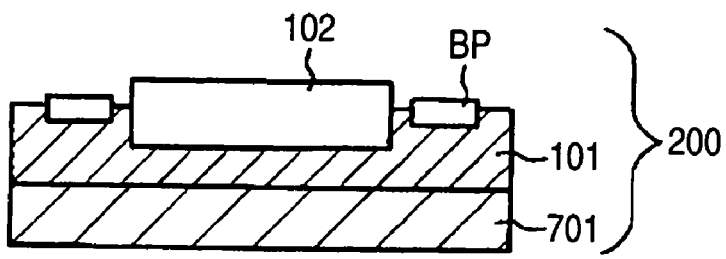
FIGS. 40A to 40D are views showing processes for manufacturing a solid-state imaging device according to a thirty-third embodiment of the present invention.
Figure 40B:
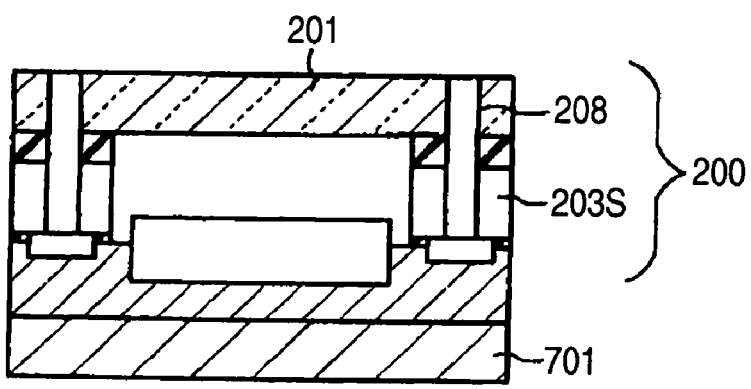
Figure 40C:
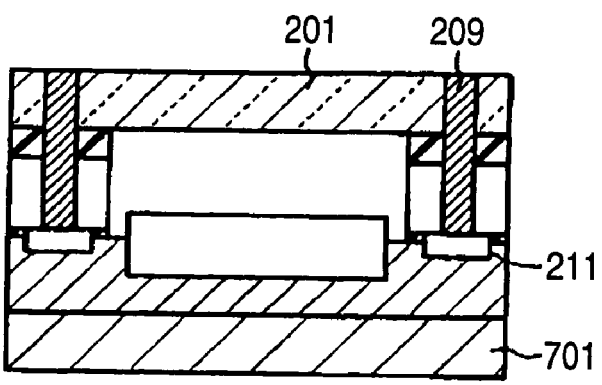
Figure 40D:
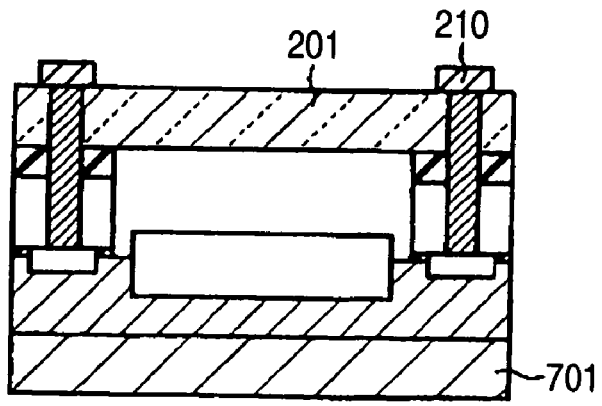

The twenty-eighth embodiment has described a case where the silicon substrate for use in forming a spacer is caused to adhere to the glass substrate made of low α-ray glass; where the glass substrate is patterned; and where the through holes penetrating through the glass substrate and the spacer are finally formed by means of etching. In the present embodiment, as shown in FIGS. 39A to 39F, the geometry of the silicon substrate is processed by means of etching. The spacer 203S—which is shown in FIG. 39E and which has the through hole 208a formed therein and a thickness of 0.1 mm—is aligned with the glass substrate 201—which is shown in (2) of FIG. 39C and which has through holes 208b formed therein—through use of alignment marks on the wafer scale. The spacer 203S and the glass substrate 201 are bonded together through use of the adhesive layer 202. In other respects, the present embodiment is formed in the same manner as the twenty-eighth embodiment.

Even in this case, the light-shielding film (215) can be formed on an interior wall of the glass substrate facing the indentation section of the spacer.

By means of this method, the through-holes are formed individually, and the spacer and the glass substrate are bonded together. Therefore, alignment is required, but an aspect ratio of about one-half is required, and hence formation of the through holes becomes easy. Subsequently, processing pertaining to the mounting processes shown in FIGS. 35A to 35E is performed in the same manner as described in connection with the twenty-eighth embodiment. The sealing cover glass is caused to adhere to the solid-state imaging element substrate, and the wafer is diced. As a result, the solid-state imaging device shown in FIG. 35E can be obtained.

Thirty-Third Embodiment

A thirty-third embodiment of the present invention will now be described. In the twenty-eighth embodiment, the silicon substrate for use in forming a spacer is caused to adhere to the glass substrate made of low α-ray glass, the conductor layer 209 has been formed in the through holes that penetrate through the glass substrate remaining in the etching process, and the spacer has a thickness of 0.1 mm. Subsequently, the solid-state imaging element substrate 100 is caused to adhere to the silicon substrate. However, as shown in FIGS. 40A to 40D, the present embodiment is characterized in that the glass substrate 200 with the spacer in which the through hole 208 formed in the twenty-eighth through thirty-second embodiments is formed is aligned on the wafer scale and bonded with and to the solid-state imaging element substrate 100 having the reinforcing plate 701 affixed to the back thereof; and that, subsequently, the conductor layer 209 is formed within the through hole 208. Further, the bonding pads 210 are formed so as to connect with the conductor layer 209. In other respects, the present embodiment is formed in the same manner as the twenty-eighth embodiment.

Here, at the time of embedment of the conductor layer 209, the embedment can be readily realized through use of vacuum screen printing using conductive paste such as copper paste or metal plating.

Thirty-Fourth Embodiment

A thirty-fourth embodiment of the present invention will now be described.

In the first through thirty-third embodiments, the sealing cover glass made of a plate-like member, which is formed from low α-ray glass, is used as the light-transmission member. However, an attempt can be made to further miniaturize the solid-state imaging device by means of imparting an imaging function to the sealing cover glass to constitute an optical member.

Figure 41:
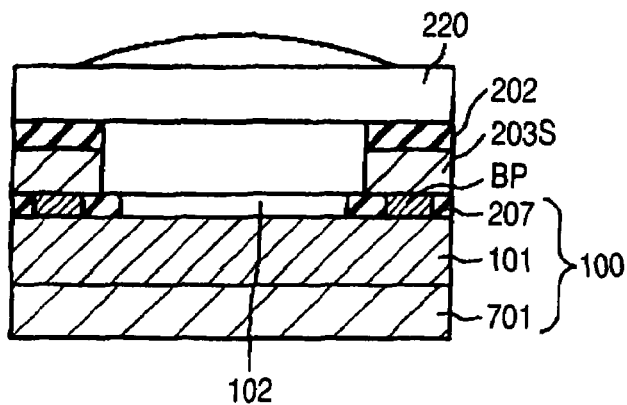
FIG. 41 is a view showing processes for manufacturing a solid-state imaging device according to a thirty-fourth embodiment of the present invention.
Figure 42A:
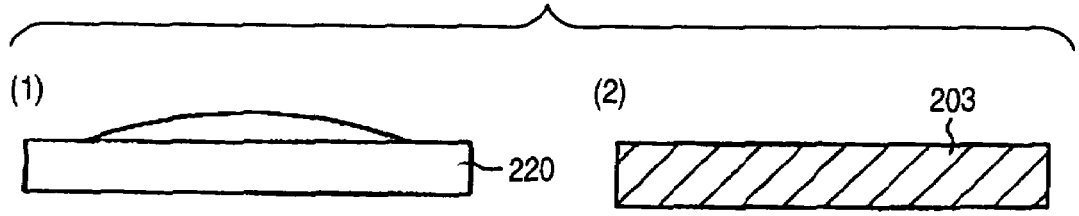
FIGS. 42A to 42D are views showing processes for manufacturing the solid-state imaging device according to the thirty-fourth embodiment of the present invention.
Figure 42B:
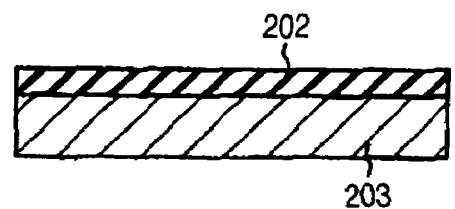
Figure 42C:
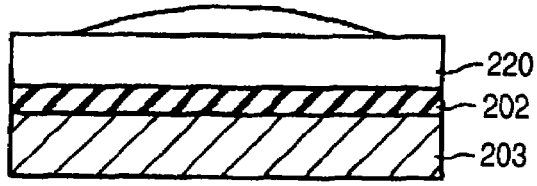
Figure 42D:
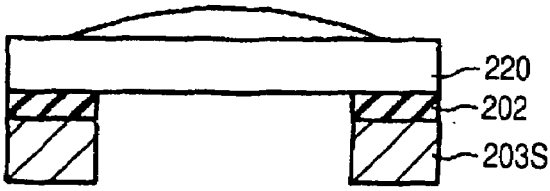

As shown in FIG. 41, the solid-state imaging device is characterized in that a sealing cover glass 220 with a lens array is used in place of the sealing cover glass 200 described in connection with the twenty-eighth embodiment through the thirty-third embodiment.

The sealing cover glass 220 is formed by means of the molding method or the etching method.

In other respects, the present embodiment is formed in the same manner as the twenty-eighth embodiment.

As shown in FIG. 33, in the twenty-eighth embodiment, the conductor layer is formed in the through holes 208, which are formed in the glass substrate 201 and the spacer 203S, and the pads 210 are formed on the upper surface of the glass substrate. The signal extraction terminals and the current supply terminals are formed on the surface of the sealing cover glass. However, in the present embodiment, the bonding pads BP are connected to external connection terminals in some unillustrated regions. In other respects, the present embodiment is formed in the same manner as the twenty-eighth embodiment shown in FIGS. 33 and 34.

Processes for manufacturing the solid-state imaging device are shown in FIGS. 42A to 42D and FIGS. 43A to 43C.

Specifically, the manufacturing processes differ from those described in connection with the twenty-eighth embodiment in that the sealing cover glass 220 with a lens array is used in place of the sealing cover glass 200 described in connection with the twenty-eighth through thirty-third embodiments.

In the thirty-third embodiment, the spacer 203S having a thickness of 0.1 mm is affixed to the glass substrate 201 constituting the sealing cover glass 200. In this state, the through holes 208 are formed so as to penetrate through the spacer and the glass substrate. The conductor layer is formed in the through holes 208, and the signal extraction terminals and the current supply terminals are formed on the surface of the surface of the sealing cover glass. In this embodiment, the same configuration may be adopted.

Figure 43A:
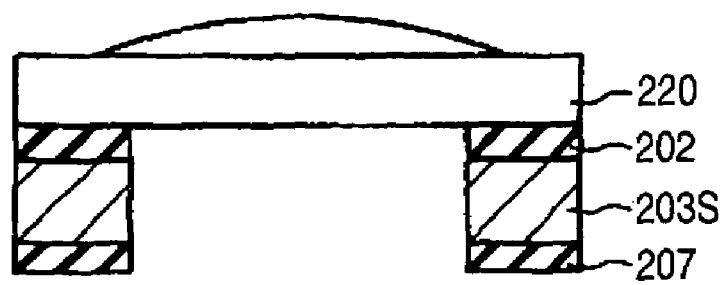
FIGS. 43A to 43C are views showing processes for manufacturing a solid-state imaging device according to a thirty-fourth embodiment of the present invention.

The adhesive layer 207 of room temperature curing type is formed on the surface of the spacer 203S of the sealing cover glass 220 with the lens array which is formed during the processes shown in FIGS. 42A to 42D (shown in FIG. 43A).

Figure 43B:
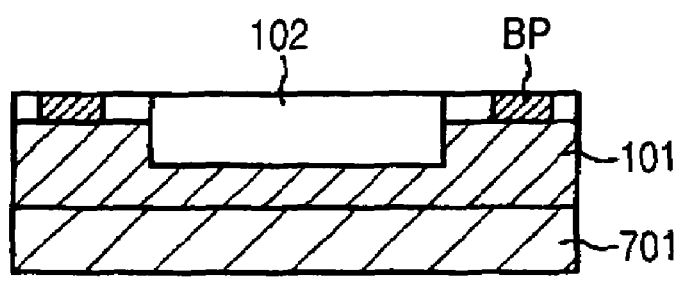

As shown in FIG. 43B, the solid-state imaging element substrate 100—in which the reinforcing plate 701 is formed—is prepared in the same manner as in the twenty-eighth embodiment.

Figure 43C:
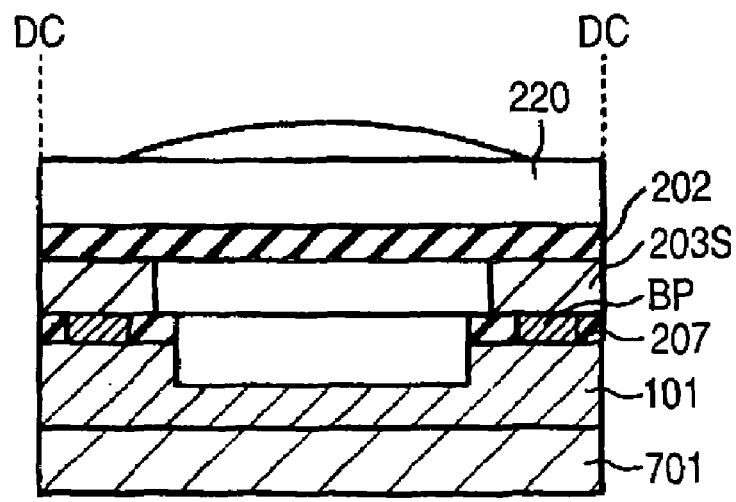

Positioning is performed by means of the alignment marks formed in the outer edges of the respective substrates as shown in FIG. 43C. The cover glass 220 with the lens array, to which a spacer 223S is bonded, is placed on the solid-state imaging element substrate 100 formed in the manner as mentioned previously. The solid-state imaging element substrate 100 and the sealing cover glass 220 are integrated together by means of the adhesive layer 207 of room temperature curing type.

Modifications of the processes for manufacturing the sealing cover glass 220 with the lens array will be described in connection with thirty-fifth through thirty-eighth embodiments.

Thirty-Fifth Embodiment

Figure 44A:
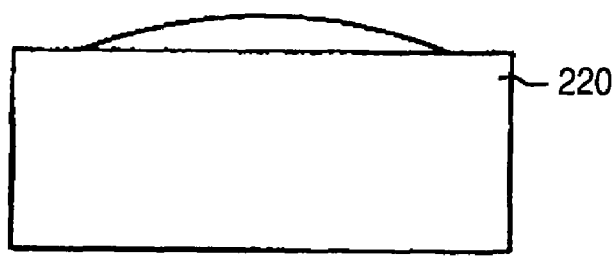
FIGS. 44A and 44B are views showing processes for manufacturing a solid-state imaging device according to a thirty-fifth embodiment of the present invention.
Figure 44B:
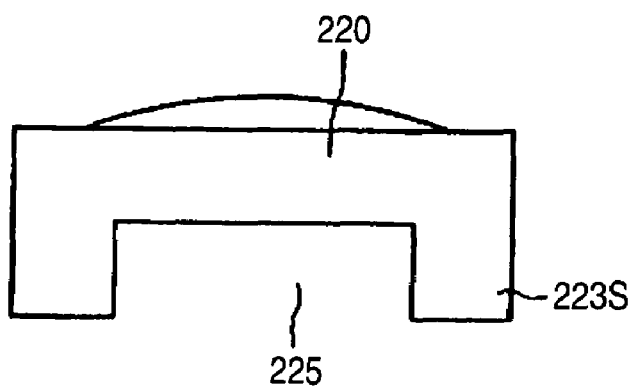

A thirty-fifth embodiment of the present invention will now be described. As shown in FIGS. 44A and 44B, the present embodiment is characterized in that the sealing cover glass 220 with a lens array made of low α-ray glass is prepared and that an indentation section 225 is formed in the back of the cover glass by means of etching, to thus integrally form the spacer 223S having a thickness of 0.1 mm. In other respects, the present embodiment is formed in the same manner as in the previous embodiments.

The sealing cover glass can be readily formed with superior workability by means of this configuration. Since the spacer is formed integrally, the highly reliable sealing cover glass 220 with the lens array can be obtained without occurrence of distortion.

Thirty-Sixth Embodiment

A thirty-sixth embodiment of the present invention will now be described.

Figure 45A:
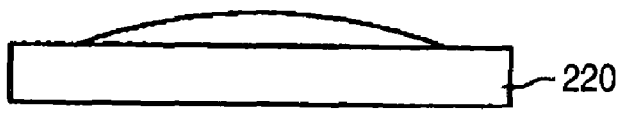
FIGS. 45A and 45B are views showing processes for manufacturing a solid-state imaging device according to a thirty-sixth embodiment of the present invention.

As shown in FIG. 45A, the glass substrate 220 with the lens array is prepared.

Figure 45B:
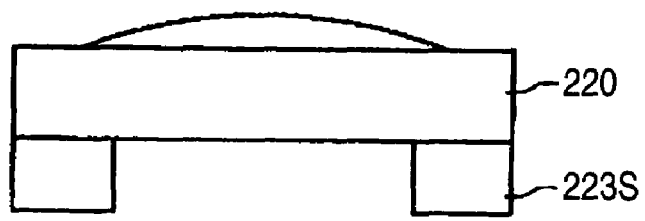
Figure 46A:
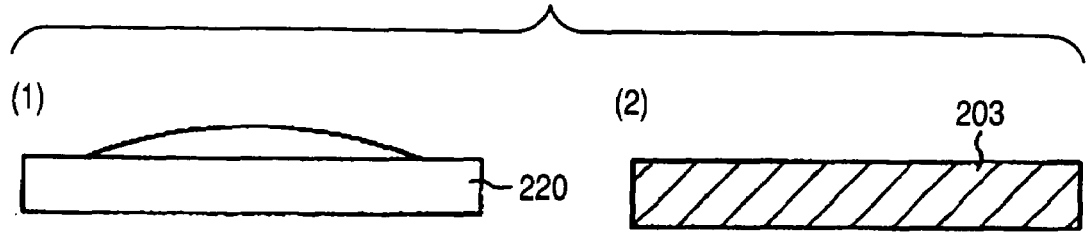
FIGS. 46A to 46D are views showing processes for manufacturing the solid-state imaging device according to the thirty-seventh embodiment of the present invention.
Figure 46B:
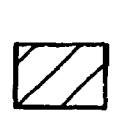
Figure 46B:
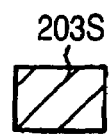
Figure 46C:
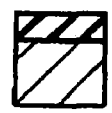
Figure 46C:
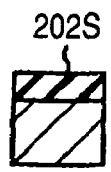
Figure 46D:
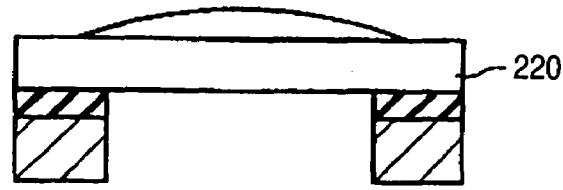
Figure 47A:
FIGS. 47A to 47D are views showing processes for manufacturing a solid-state imaging device according to a thirty-eighth embodiment of the present invention.
Figure 47B:
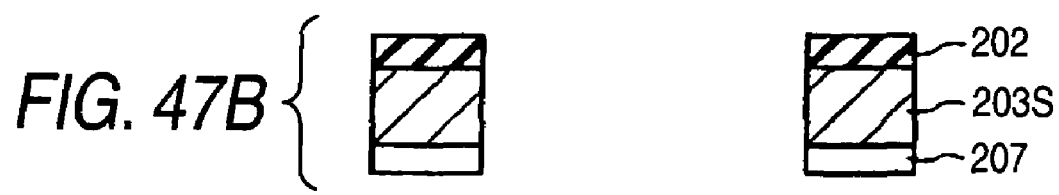
Figure 47C:
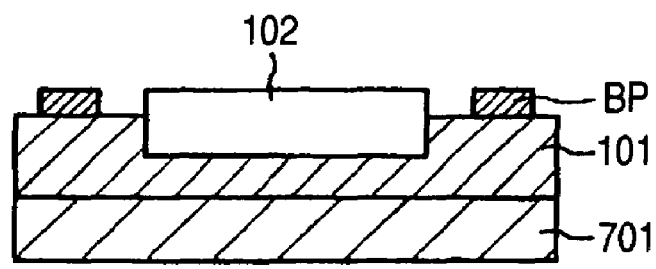
Figure 47D:
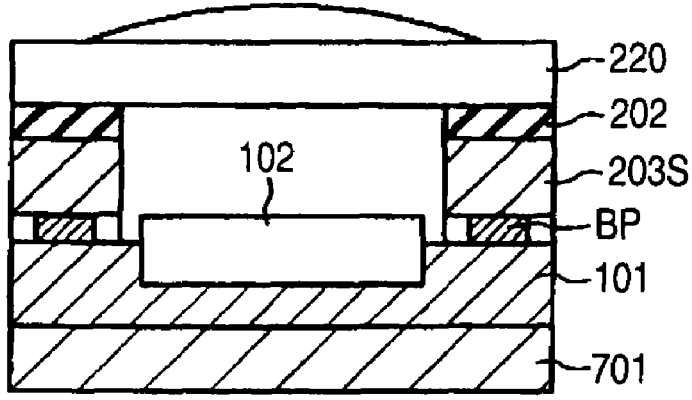
Figure 48A:
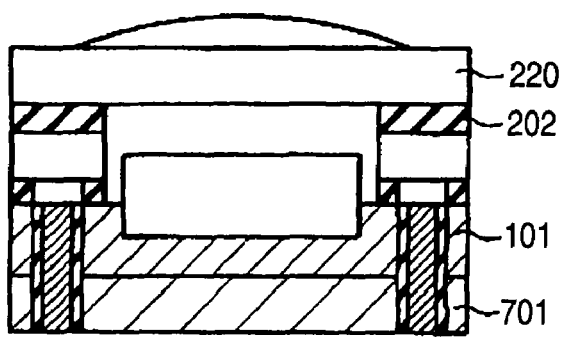
FIGS. 48A to 48D are views showing processes for manufacturing a solid-state imaging device according to a thirty-ninth embodiment of the present invention.
Figure 48B:
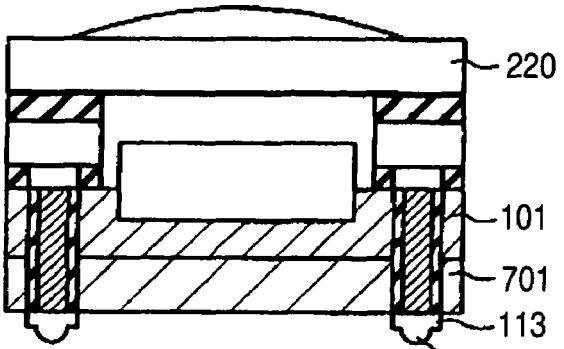
Figure 48C:
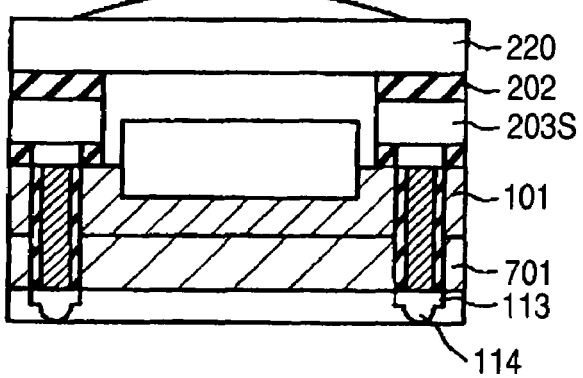
Figure 48D:
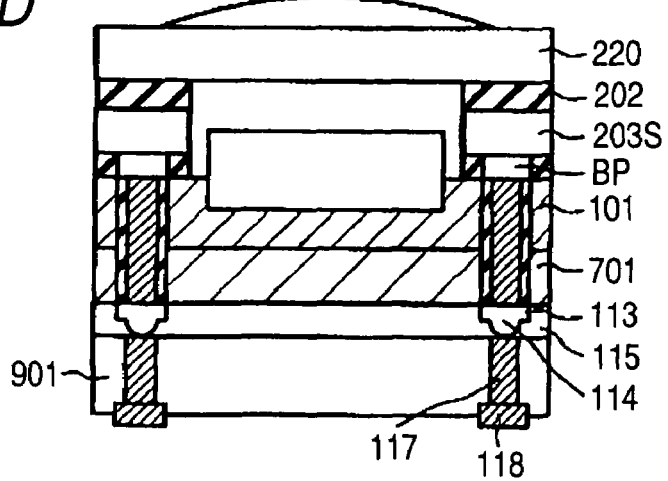

As shown in FIG. 45B, photocuring resin is formed on the surface of the glass substrate 220 with the lens array by means of an optical molding method, to thus form the spacer 223 having a thickness of 0.1 mm. Thus, the sealing cover having the through holes formed therein and the spacer can be readily obtained.

Subsequently, processing pertaining to the mounting processes shown in FIGS. 35A to 35E are performed in the same manner as described in connection with the twenty-eighth embodiment. The sealing cover glass is caused to adhere to the solid-state imaging element substrate, and the wafer is diced. As a result, the solid-state imaging device shown in FIG. 35E can be obtained.

Thirty-Seventh Embodiment

A thirty-seventh embodiment of the present invention will now be described.

In the thirty-fourth embodiment, the silicon substrate is caused to adhere to the glass substrate which is made of low α-ray glass and has a lens array, and the silicon substrate is patterned. As shown in FIGS. 46A to 46D, the spacer 203S which has been formed by means of the etching method and has a thickness of 0.1 mm may be caused to adhere to the sealing cover glass 220 with a lens array. Even in this case, the cover glass is caused to adhere to the solid-state imaging element during the mounting process in the same manner as in the thirty-sixth embodiment, and the wafer is subjected to dicing, whereby the solid-state imaging device can be obtained.

Thirty-Eighth Embodiment

A thirty-eighth embodiment of the present invention will now be described.

As shown in FIG. 47, the sealing cover glass 220 with a lens array, the spacer 203S having a thickness of 0.1 mm, and the solid-state imaging element substrate 100 having the reinforcing plate 701 may be fixed together simultaneously.

Thirty-Ninth Embodiment

A thirty-ninth embodiment of the present invention will now be described.

As shown in FIGS. 48A to 48D, the sealing cover glass 220 with the lens array made of low α-ray glass can also be applied to the solid-state imaging device in which the peripheral circuit board 901 shown in FIGS. 28A to 28D in the twenty-third embodiment is stacked on the substrate by way of the anisotropic conductive film 115. In other respects, the present embodiment is formed in the same manner as in the previously-described embodiments.

Even at the time of connection of the peripheral circuit board 901, diffusion bonding using ultrasonic waves, solder bonding, and eutectic bonding based on thermocompression can also be effectively employed in place of the anisotropic conductive film. Moreover, the peripheral circuit board may be under-filled with resin.

The sealing cover glass 220 with the lens array may also be used in place of the sealing cover glass 200 made of a plate-like material.

Fortieth Embodiment

A fortieth embodiment of the present invention will now be described.

Figure 49:
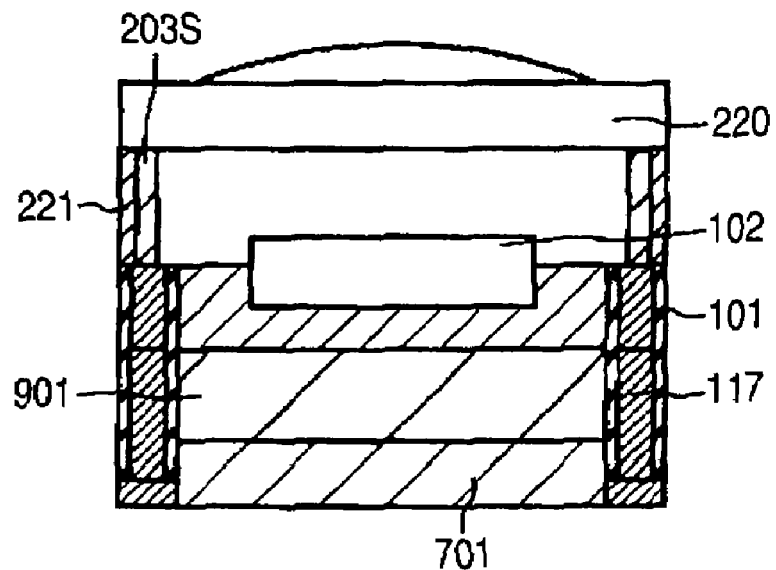
FIG. 49 is a view showing processes for manufacturing a solid-state imaging device according to a fortieth embodiment of the present invention.

As shown in FIG. 49, the solid-state imaging element substrate 100, the peripheral circuit board 901, and the reinforcing plate 701 may be stacked in this sequence in the same manner as shown in FIG. 31 in connection with the twenty-sixth embodiment. In other respects, the present embodiment is formed in the same manner as in the previously-described embodiments.

Forty-First Embodiment

A forty-first embodiment of the present invention will now be described.

Figure 50:
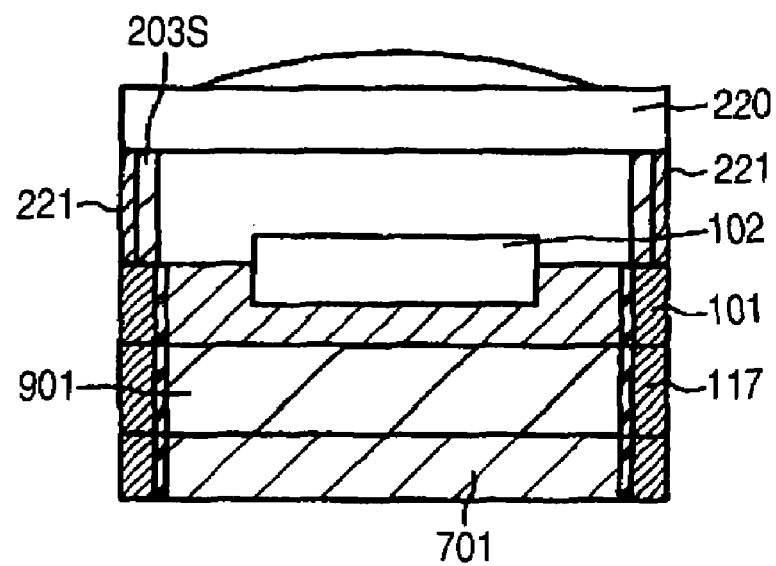
FIG. 50 is a view showing processes for manufacturing a solid-state imaging device according to a forty-first embodiment of the present invention.
Figure 51A:
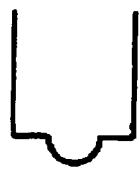
FIG. 51 is a view showing the geometry of a sump employed in the embodiments of the present invention.
Figure 51B:
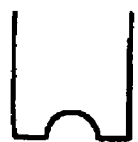
Figure 51C:
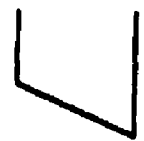
Figure 51D:
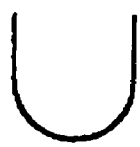
Figure 51E:
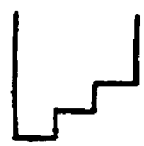
Figure 51F:

As shown in FIG. 50, a spacer having a wiring pattern 221 provided on a sidewall thereof and a thickness of 0.1 mm is also effective.

Manufacture of the spacer is the same as in the twenty-seventh embodiment. Through holes are formed in the spacer, and the conductor layer is formed in the through holes. After the solid-state imaging substrate and the cover glass 220 with a lens have been affixed together, the wafer is sliced along the dicing lines including the through holes, thereby readily enabling wiring on the sidewall. In other respects, the present embodiment is formed in the same manner as in the previously-described embodiments.

The embodiments have described the method for bonding the glass substrate constituting the sealing cover glass to the spacer and bonding the solid-state imaging element substrate to the sealing cover glass through use of the adhesive layer. When the spacer and the surface of the solid-state imaging element substrate, both pertaining to all the embodiments, are made of Si, metal, or an inorganic compound, the spacer and the solid-state imaging element substrate may also be bonded together without use of an adhesive, by means of surface activation room temperature bonding, as required. When the cover glass is made of Pyrex glass and the spacer is made of Si, anode bonding is also possible. When the adhesive layer is used, a thermosetting adhesive or a thermosetting/UV curing combined adhesive can be employed as the adhesive layer in place of the UV adhesive, within the range in which there does not arise warpage in the wafer due to a difference in thermal expansion coefficient, a reduction in reliability stemming from application of thermal stress on the solid-state imaging elements, or a failure in fastening of a wafer in a subsequent process.

When the adhesive of semi-curing type is used, the adhesive is applied in a liquid status. The adhesive is semi-cured, and positioning is performed. As a result, a modification can be made during positioning operation, and hence a solid-state imaging device which has been aligned with high accuracy can be formed.

Although having been described in connection with the first embodiment, a material of the spacer described in connection with all the embodiments can be selected from any of a 42 alloy, metal, glass, photosensitive polyimide, and polycarbonate resin, as well as a silicon substrate, as required.

When the solid-state imaging element substrate and the sealing cover glass are bonded together through use of an adhesive layer, a sump is formed, thereby preventing outflow of a melted adhesive layer. The same also applies to a junction between the spacer and the solid-state imaging element substrate or a junction between the spacer and the sealing cover glass. As can be seen in FIGS. 51A to 51F, which show example shapes of the junction end of the spacer, indentation sections or protrusion sections may be formed in the junction, thereby preventing outflow of the melted adhesive layer.

Figure 52:
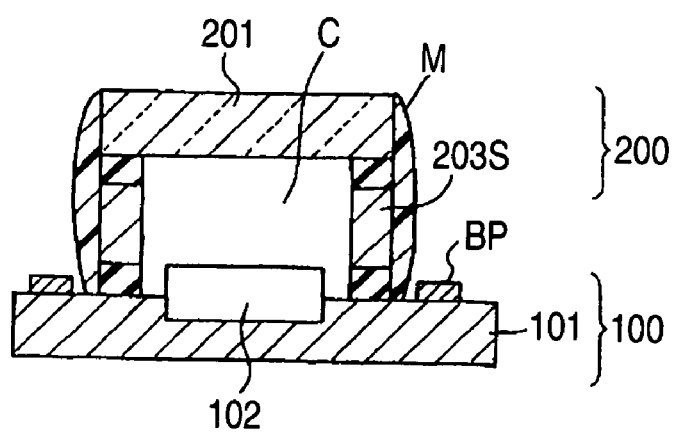
FIG. 52 is a view showing a modification of the solid-state imaging element according to the embodiments of the present invention.

Moreover, with a view toward rendering sturdy the bonding between the solid-state imaging element substrate and the sealing cover glass and preventing deterioration of the solid-state imaging elements, the junction between the glass substrate 200 including the sealing cover glass 201 and the spacer 203S and the junction between the spacer and the solid-state imaging element substrate 100 may be sealed with sealing resin M, as shown in FIG. 52, thereby preventing intrusion of moisture and achieving high reliability.

Epoxy-based sealing resin, oxetane-based sealing resin, silicon-based sealing resin, and acrylic sealing resin are suitable as sealing resin. Any resin may be adopted, so long as it enables formation of a desired sealing region, prevention of intrusion of moisture, and acquisition of high reliability.

At the time of formation, sealing resin is supplied to the region exclusive of the bonding pads BP (electrode pads) through use of a jig, such as a dispenser. After the sealing resin has been cured, the jig is removed, thereby realizing resin sealing without overturning the bonding pads. As in the case of the previously-described adhesive, sealing resin which can be cured at 80° C. or less is desirable. Use of photocuring resin or room temperature-curing type resin as resin is desirable. When photocuring resin is used, a jig is desirably constituted of a light-transmission member.

In the previous embodiments, separation of the substrate having the slice grooves formed therein into pieces is performed by means of carrying out CMP to the positions of the slice grooves. However, grinding, polishing, or overall etching can also be used.

In the embodiments, when the reinforcing plate (701) is used, the reinforcing plate is constituted of polyimide resin, ceramic, crystallized glass, or a silicon substrate whose front and back surfaces are oxidized, as required. As a result, the role of a heat insulating substrate can be imparted to the reinforcing plate. Alternatively, the reinforcing plate may be made of light-shielding material.

In the embodiments, when the glass substrate and the spacer must be affixed together, affixing operation may be performed through use of UV-radiation curing resin, thermosetting resin, a combination thereof, or application of a semi-curing-type adhesive, within a range in which there does not arise warpage in the wafer due to a difference in thermal expansion coefficient or a failure in bonding the spacer and the solid-state imaging element substrate.

At the time of formation of the adhesive, supply of the adhesive through use of a dispenser, screen printing, or stamping transfer can be selected, as required.

In addition, the examples described in connection with the embodiments can be mutually modified within a range in which the modifications are applicable to all the embodiments.

As has been described, according to the solid-state imaging device of the present invention, occurrence of image noise attributable to dust is reduced by means of setting the distance from the surface of the light-receiving region to the surface of the light-transmission member to 0.5 to 1.5 mm, and hence a highly reliable solid-state imaging device can be provided.

According to the method for manufacturing a solid-state imaging device of the present invention, positioning is performed on the wafer scale such that a gap assumes a size of 0.08 mm or more (i.e., the distance from the surface of the light-receiving region to the surface of the light-transmission member is set to 0.5 to 1.5 mm). They are integrated together by means of mounting the elements in a collective manner, including formation of external extraction electrode terminals. Accordingly, a highly reliable solid-state imaging device which is easy to manufacture can be formed.

The solid-state imaging device of the present invention is applicable to a digital camera.

The entire disclosure of each and every foreign patent application from which the benefit of foreign priority has been claimed in the present application is incorporated herein by reference, as if fully set forth.

What is claimed is:

1. A method for manufacturing a solid-state imaging device, comprising the steps of:
    forming a plurality of solid-state imaging elements in a first surface of a semiconductor substrate, each of the solid-state imaging elements comprising a light-receiving region;
    forming a sealing cover member in which a plurality of light-transmission members and a plurality of indentation sections are integrally formed, each of the light-transmission members having a second surface and a third surface opposite to the second surface, wherein the forming the sealing cover member comprising: (i) adhering a first silicon substrate to a light-transmission member; (ii) etching regions of the first silicon substrate so as to form a plurality of spacers and indentation sections between the spacers; (iii) adhering a second silicon substrate to the light-transmission member on the side opposite to the first silicon substrate; and (iv) etching a region of the light-transmission member and the second silicon substrate so as to form an indentation between every pair of spacers;
    connecting the sealing cover member to the first surface of the semiconductor substrate so as to define gaps, each of which is located between the second surface of the light-transmission member and an outer surface of the light-receiving region, to form an integrated member;
    forming external connection terminals corresponding to the solid-state imaging elements, to form an integrated member with the external connection terminals; and
    separating the integrated member with the external connection terminals, for each of the solid-state imaging elements, wherein the gaps are adjusted so that a distance between the outer surface of the light-receiving region and the third surface of the light-transmission member is 0.5 to 1.5 mm.

2. The method for manufacturing a solid-state imaging device according to claim 1, wherein, in the connecting step, the light-transmission member is connected to the first surface of the semiconductor substrate via the spacers so that a distance between the outer surface of the light-receiving region and the second surface of the light-transmission member is 0.08 mm or more.

3. The method for manufacturing a solid-state imaging device according to claim 2, wherein the connecting step is a step using a room temperature-curing type adhesive.

4. The method for manufacturing a solid-state imaging device according to claim 2, wherein the connecting step is a step using a photo-curing type adhesive.

5. The method for manufacturing a solid-state imaging device according to claim 2, wherein the connecting step is using an adhesive which cures at a temperature lower than 80° C.

6. The method according to claim 1, wherein a distance between the outer surface of the light-receiving region and the second surface is 0.08 mm or more.

7. The method according to claim 1, wherein the spacers are connected to at least one of the first surface and the second surface via a room-temperature curing type adhesive.

8. The method according to claim 1, wherein the spacers are connected to at least one of the first surface and the second surface via a photo-curing type adhesive.

9. The method according to claim 1, wherein the width of each of the spacer is 100 to 500 μm.

10. The method according to claim 1, wherein the light-transmission member is bonded to the semiconductor substrate through the spacer with an adhesive at the bonding temperature within a range of 20° C to 80° C.

* * * * *